(12) United States Patent
Tanaka et al.

(10) Patent No.: US 9,666,697 B2
(45) Date of Patent: May 30, 2017

(54) SEMICONDUCTOR DEVICE AND METHOD FOR MANUFACTURING SEMICONDUCTOR DEVICE INCLUDING AN ELECTRON TRAP LAYER

(71) Applicant: Semiconductor Energy Laboratory Co., Ltd., Atsugi-shi, Kanagawa-ken (JP)

(72) Inventors: Tetsuhiro Tanaka, Isehara (JP); Toshihiko Takeuchi, Atsugi (JP); Yasumasa Yamane, Atsugi (JP); Takayuki Inoue, Sagamihara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/313,145

(22) Filed: Jun. 24, 2014

(65) Prior Publication Data
US 2015/0011046 A1    Jan. 8, 2015

(30) Foreign Application Priority Data

Jul. 8, 2013    (JP) ................................ 2013-142281
Jul. 8, 2013    (JP) ................................ 2013-142296
Jul. 8, 2013    (JP) ................................ 2013-142309

(51) Int. Cl.
*H01L 29/49*    (2006.01)
*H01L 29/786*   (2006.01)
*H01L 29/66*    (2006.01)

(52) U.S. Cl.
CPC .... *H01L 29/66969* (2013.01); *H01L 29/4908* (2013.01); *H01L 29/7869* (2013.01); *H01L 29/78696* (2013.01)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Michael Jung
*Assistant Examiner* — Jay C Chang
(74) *Attorney, Agent, or Firm* — Robinson Intellectual Property Law Office; Eric J. Robinson

(57) ABSTRACT

A manufacturing method of a semiconductor device in which the threshold voltage is adjusted is provided. The semiconductor device includes a first semiconductor, an electrode electrically connected to the first semiconductor, a gate electrode, and an electron trap layer between the gate electrode and the first semiconductor. By performing heat treatment at higher than or equal to 125° C. and lower than or equal to 450° C. and, at the same time, keeping a potential of the gate electrode higher than a potential of the electrode for 1 second or more, the threshold voltage is increased.

20 Claims, 34 Drawing Sheets

(56) References Cited

U.S. PATENT DOCUMENTS

| | | | |
|---|---|---|---|
| 5,902,650 A * | 5/1999 | Feng et al. | 427/578 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,692,223 B2 | 4/2010 | Isobe et al. | |
| 7,732,819 B2 | 6/2010 | Akimoto et al. | |
| 7,791,072 B2 | 9/2010 | Kumomi et al. | |
| 8,237,166 B2 | 8/2012 | Kumomi et al. | |
| 8,384,080 B2 | 2/2013 | Taniguchi et al. | |
| 8,547,771 B2 | 10/2013 | Koyama | |
| 8,692,252 B2 | 4/2014 | Takata et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2003/0235076 A1 * | 12/2003 | Forbes | 365/185.03 |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0249780 A1 * | 11/2006 | Mori | 257/321 |
| 2006/0255399 A1 * | 11/2006 | Kim | H01L 29/4232 257/324 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0096396 A1 * | 4/2008 | Shih et al. | 438/763 |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0230831 A1 * | 9/2008 | Noda et al. | 257/325 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0296650 A1 * | 12/2008 | Ahn et al. | 257/310 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0248439 A1 * | 9/2010 | Chung | H01L 27/11582 438/287 |
| 2010/0304529 A1 * | 12/2010 | Sasaki et al. | 438/104 |
| 2011/0101438 A1 * | 5/2011 | Yoo | G11C 16/0416 257/316 |
| 2011/0240987 A1 * | 10/2011 | Lee et al. | 257/43 |
| 2011/0309876 A1 | 12/2011 | Terai et al. | |
| 2012/0001173 A1 * | 1/2012 | Suzuki et al. | 257/43 |
| 2012/0056175 A1 | 3/2012 | Takemura | |
| 2012/0235118 A1 * | 9/2012 | Avouris et al. | 257/27 |
| 2013/0307052 A1 * | 11/2013 | Jenne | H01L 21/28282 257/325 |
| 2014/0054725 A1 * | 2/2014 | Chang | H01L 29/78 257/411 |
| 2014/0097867 A1 | 4/2014 | Koyama | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2011-124360 | 6/2011 |
| JP | 2011-138934 | 7/2011 |
| JP | 2012-074692 | 4/2012 |

(56) References Cited

FOREIGN PATENT DOCUMENTS

| | | |
|---|---|---|
| JP | 2012-257187 | 12/2012 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B(Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

108: Id-Vg characterictics before electron trap

109: Id-Vg characterictics after electron trap initial characteristics are measured electrons are injected measurement is performed resin sealing and packaging Fleming's left hand rule Heated Substrate InGaZnO₄

FIG. 32A
FIG. 32B
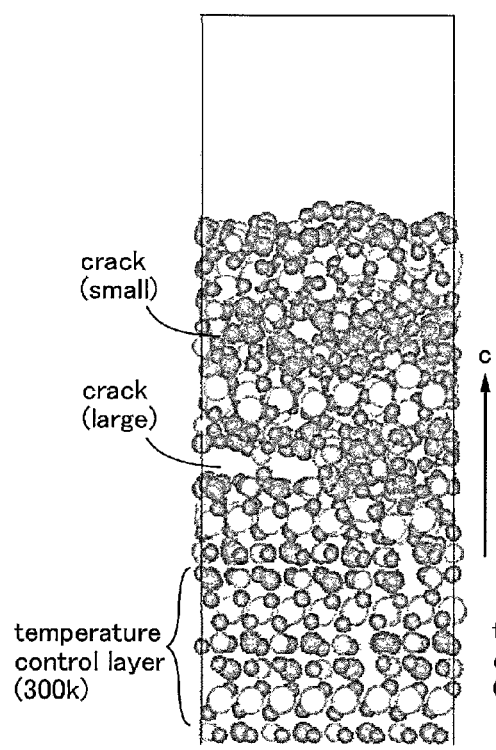
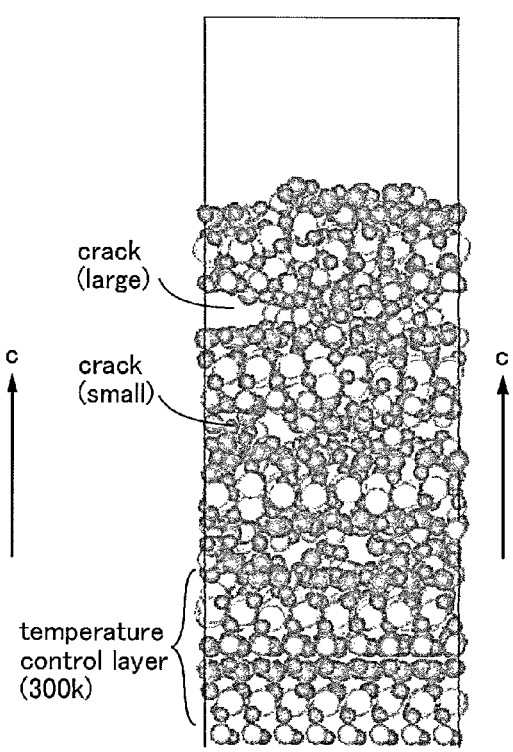
100psec after Ar enters into the cell   100psec after O enters into the cell
In : ○   Ga : ○   Zn : ◉   O : ●

Zn of the third layer (Ga-Zn-O layer) reaches the neighborhood of the sixth layer (Ga-Zn-O layer)

trajectories of atoms from 0 to 0.3psec after Ar enters the cell

Zn of the third layer (Ga-Zn-O layer) does not reach the fifth layer (In-O layer)

trajectiories of atoms from 0 to 0.3psec after O enters the cell

CAAC-OS layer    1 nm target    1 nm

SEMICONDUCTOR DEVICE AND METHOD FOR MANUFACTURING SEMICONDUCTOR DEVICE INCLUDING AN ELECTRON TRAP LAYER

BACKGROUND OF THE INVENTION

1. Field of the Invention

One embodiment of the present invention relates to a semiconductor device and a device including the semiconductor device.

Note that in this specification, a semiconductor device means a general device that can function by utilizing semiconductor characteristics. An electrooptical device, a semiconductor circuit, and an electronic device can all include a semiconductor device.

2. Description of the Related Art

A technique in which a transistor is formed using a semiconductor has attracted attention. The transistor is used in a wide range of electronic devices such as an integrated circuit (IC) or an image display device (display device). As materials of the semiconductor that can be used in the transistor, silicon-based semiconductor materials have been widely known, but oxide semiconductors have been attracting attention as alternative materials.

For example, a transistor including an amorphous oxide semiconductor layer containing indium (In), gallium (Ga), and zinc (Zn) is disclosed in Patent Document 1.

Techniques for improving carrier mobility by employing a stacked structure of an oxide semiconductor layer are disclosed in Patent Documents 2 and 3.

It is known that a transistor including an oxide semiconductor layer has an extremely small leakage current when the transistor is off. For example, a low-power-consumption CPU utilizing such a small leakage current characteristic of a transistor including an oxide semiconductor layer is disclosed (see Patent Document 4).

REFERENCE

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187
[Patent Document 5] Japanese Published Patent Application No. 2012-074692

SUMMARY OF THE INVENTION

The transistor size decreases in accordance with an increase in the degree of circuit integration. The miniaturization of a transistor may cause deterioration of electrical characteristics, such as on-state current, off-state current, threshold voltage, and an S value (subthreshold swing), of the transistor (see Patent Document 5). In general, shortening the channel length increases the on-state current, but at the same time increases the off-state current, a variation in threshold voltage, and the S value. When only the channel width is decreased, the on-state current is decreased.

An object of one embodiment of the present invention is to provide a semiconductor device in which the threshold voltage is adjusted. Another object of one embodiment of the present invention is to provide a semiconductor device having a structure that can prevent deterioration of electrical characteristics, which becomes more significant with the increasing miniaturization. In addition, another object is to provide a highly integrated semiconductor device. Another object is to provide a semiconductor device in which deterioration of on-state current characteristics is reduced. Another object is to provide a semiconductor device with low power consumption. Another object is to provide a semiconductor device with high reliability. Another object is to provide a semiconductor device which can retain data even when power supply is stopped. Another object is to provide a semiconductor device with favorable characteristics.

Note that the descriptions of these objects do not disturb the existence of other objects. In one embodiment of the present invention, there is no need to achieve all the above objects. Other objects will be apparent from and can be derived from the description of the specification, the drawings, the claims, and the like.

One embodiment of the present invention is a semiconductor device including a first semiconductor, an electrode electrically connected to the first semiconductor, a gate electrode, and an electron trap layer between the gate electrode and the first semiconductor.

In the semiconductor device of one embodiment of the present invention, the electron trap layer may include a conductive minute region generated at the time of forming the electron trap layer.

Another embodiment of the present invention is a method for manufacturing the above-described semiconductor device, including the step of trapping an electron in the electron trap layer by performing heat treatment at higher than or equal to 125° C. and lower than or equal to 450° C. and, at the same time, keeping a potential of the gate electrode higher than a potential of the electrode for 1 second or more.

The above-described structure may include a second semiconductor and a third semiconductor between which the first semiconductor is sandwiched. The second semiconductor may be positioned between the first semiconductor and the electron trap layer.

In the above-described structure, the gate electrode faces a top surface and a side surface of the first semiconductor (the gate electrode is formed along a top surface and a side surface of the first semiconductor).

In the above-described structure, the electron trap layer includes any one of hafnium oxide, aluminum oxide, tantalum oxide, and aluminum silicate.

With one embodiment of the present invention, a semiconductor device in which the threshold voltage is adjusted can be provided. In addition, a semiconductor device having a structure that can prevent deterioration of electrical characteristics, which becomes more significant with the increasing miniaturization, can be provided. In addition, a highly integrated semiconductor device can be provided. Moreover, a semiconductor device with low power consumption can be provided. In addition, a semiconductor device with high reliability can be provided. Moreover, a semiconductor device which can retain data even when power supply is stopped can be provided.

BRIEF DESCRIPTION OF THE DRAWINGS

In the accompanying drawings:

FIGS. 32A and 32B show a structure and the like of $InGaZnO_4$ after collision of an atom;

DETAILED DESCRIPTION OF THE INVENTION

Figure 1A:
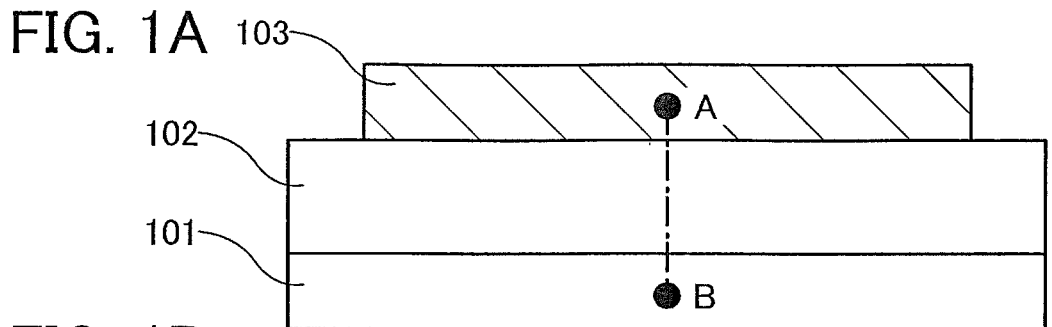
FIGS. 1A to 1D illustrate examples of a semiconductor device of an embodiment.

Embodiments will be described in detail with reference to drawings. The present invention is not limited to the following description and it will be readily appreciated by those skilled in the art that modes and details can be modified in various ways without departing from the spirit and the scope of the present invention. Therefore, the present invention should not be interpreted as being limited to the description of the embodiments below.

Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

(Embodiment 1)

In this embodiment, a structure of a semiconductor device including a semiconductor layer, an electron trap layer, and a gate electrode, the principle of operation of the semiconductor device, and a circuit that uses the semiconductor device will be described. FIG. 1A illustrates a semiconductor device including a semiconductor layer 101, an electron trap layer 102, and a gate electrode 103.

The electron trap layer 102 includes a state that traps an electron (electron trap state). Depending on the formation method and formation conditions, such a state is not formed even when the electron trap layer 102 is formed of the same constituent elements.

Figure 1B:
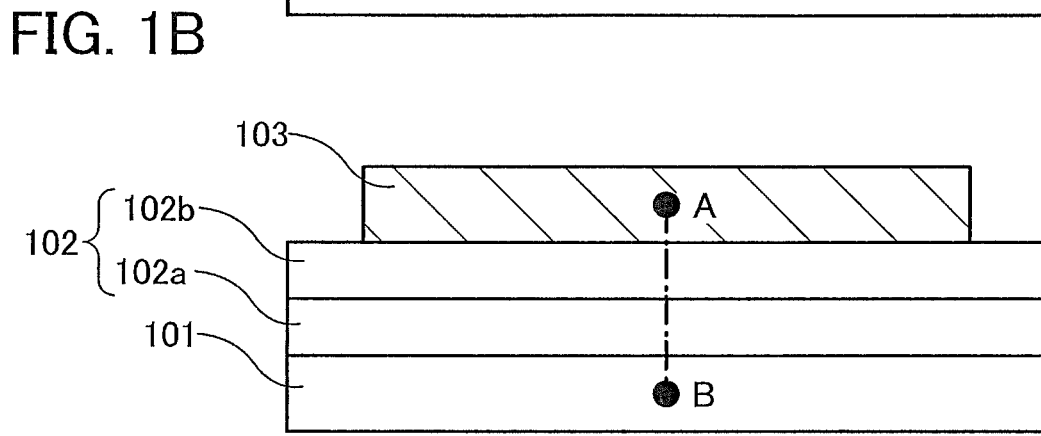
Figure 1C:
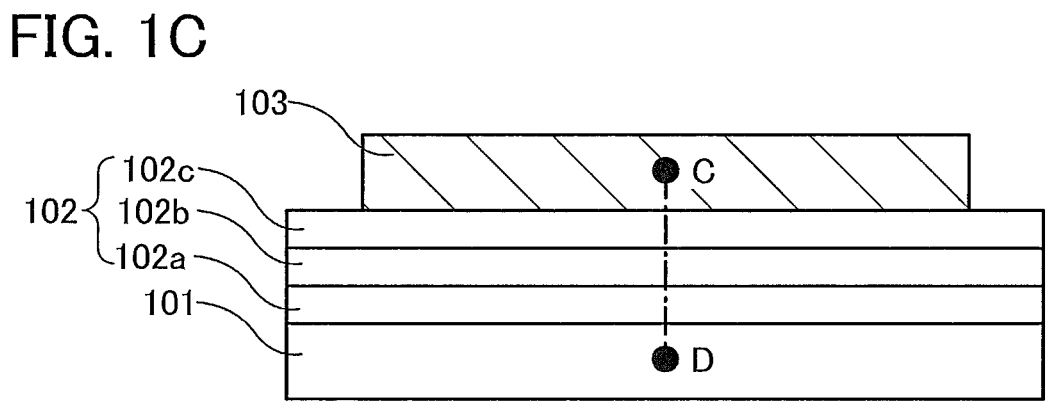
Figure 1D:
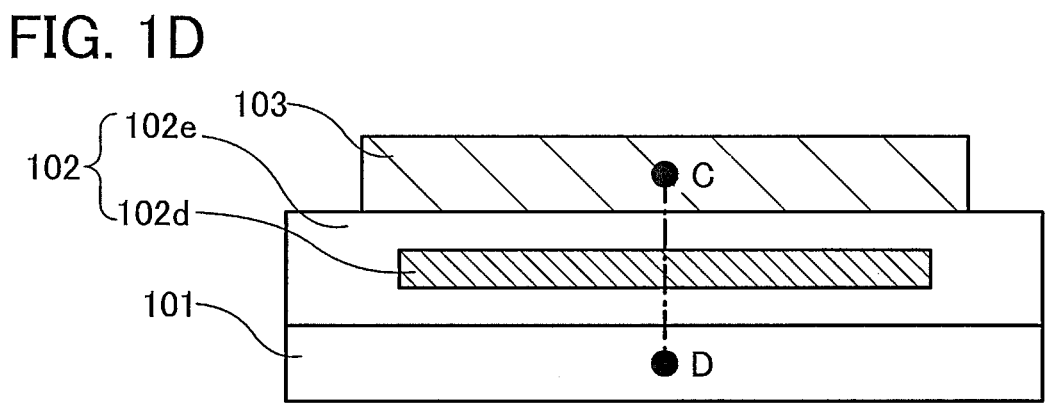

For example, the electron trap layer 102 may be a stacked body that includes a first insulating layer 102a formed by a first formation method (or under first formation conditions) and a second insulating layer 102b formed by a second formation method (or under second formation conditions) as illustrated in FIG. 1B. Alternatively, the electron trap layer 102 may be a stacked body that includes the first insulating layer 102a formed by the first formation method (or under the first formation conditions), the second insulating layer 102b formed by the second formation method (or under the second formation conditions), and a third insulating layer 102c formed by a third formation method (or under third formation conditions) as illustrated in FIG. 1C, or a stacked body including four or more insulating layers. Alternatively, the electron trap layer 102 may include an electrically insulated conductive layer 102d in an insulator 102e as illustrated in FIG. 1D. A plurality of insulating films may constitute the insulator 102e.

Here, the first to third insulating layers have the same constituent elements. Note that the first formation method (or the first formation conditions) may be the same as the third formation method (or the third formation conditions). In this case, it is preferable that the density of electron trap states (the number of electron trap states) in the insulating layer that is not in contact with the semiconductor layer 101 (e.g., the second insulating layer) be high (large). For example, an insulating layer formed by a sputtering method has a higher density of electron trap states than an insulating layer formed by a CVD method or an Atomic Layer Deposition (ALD) method and having the same composition.

Accordingly, an insulating layer formed by a sputtering method may be used as the second insulating layer 102b, and an insulating layer formed by a CVD method or an ALD method may be used as the first insulating layer 102a. In the case of FIG. 1C, the third insulating layer 102c may be formed in the same way as the first insulating layer 102a. However, the insulating layers are not limited thereto in one embodiment of the present invention; an insulating layer formed by a CVD method or an ALD method may be used as the second insulating layer 102b, and an insulating layer formed by a sputtering method may be used as the first insulating layer 102a. In the case of FIG. 1C, the third insulating layer 102c may be formed in the same way as the first insulating layer 102a.

The insulating layer formed by a CVD method can function as a normal gate insulating layer and thereby can reduce leakage current between a gate and a drain or between the gate and a source. In contrast, the insulating layer formed by a sputtering method has a high density of electron trap states and thereby can make the threshold voltage of the transistor high. Accordingly, this structure enables small leakage current and appropriate threshold voltage adjustment. For this reason, it is preferable to form a stacked structure using different formation methods (or different formation conditions). Note that one embodiment of the present invention is not limited to the examples described above.

Furthermore, the formation method of the semiconductor layer 101 and the formation method of the first insulating layer 102a that is in contact with the semiconductor layer 101 may be the same for easy successive formation. For example, in the case of forming the semiconductor layer 101 by a sputtering method, the first insulating layer 102a may also be formed by a sputtering method and then the second insulating layer 102b may be formed by a CVD method or an ALD method. In the case of FIG. 1C, the third insulating layer 102c may also be formed by a sputtering method. Similarly, in the case of forming the semiconductor layer 101 by a CVD method, the first insulating layer 102a may also be formed by a CVD method and then the second insulating layer 102b may be formed by a sputtering method. In the case of FIG. 1C, the third insulating layer 102c may also be formed by a CVD method. These structures enable small leakage current, appropriate threshold voltage adjustment, and easy manufacturing.

Next, a case in which the electron trap layer 102 includes a plurality of conductive minute regions 104 will be described with reference to FIGS. 2A to 2C.

Figure 2A:
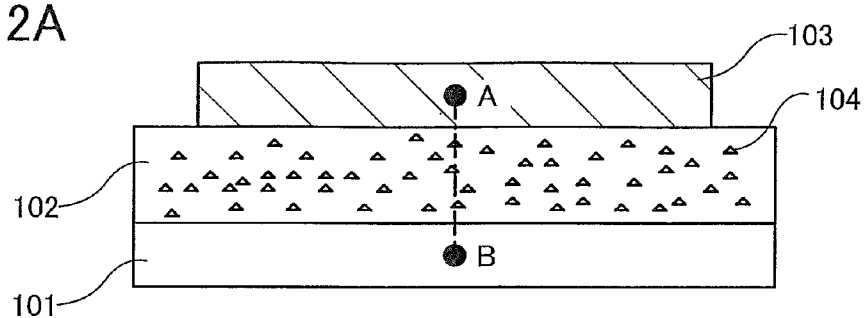
FIGS. 2A to 2C illustrate examples of a semiconductor device of an embodiment.

FIG. 2A illustrates a semiconductor device including a semiconductor layer 101, an electron trap layer 102, and a gate electrode 103. The electron trap layer 102 includes a plurality of conductive minute regions 104. Depending on the formation method and formation conditions, such regions are not formed even when the electron trap layer 102 is formed of the same constituent elements. Particularly in deposition of particles having high energy like the deposition of an oxide by a sputtering method, a variation in oxygen concentration may occur in the deposited film, in which case conductive minute regions are likely to be formed. In the deposition of particles having relatively low energy like the deposition by a CVD method, the deposited film tends to be uniform, in which case conductive minute regions are unlikely to be formed.

Figure 2B:
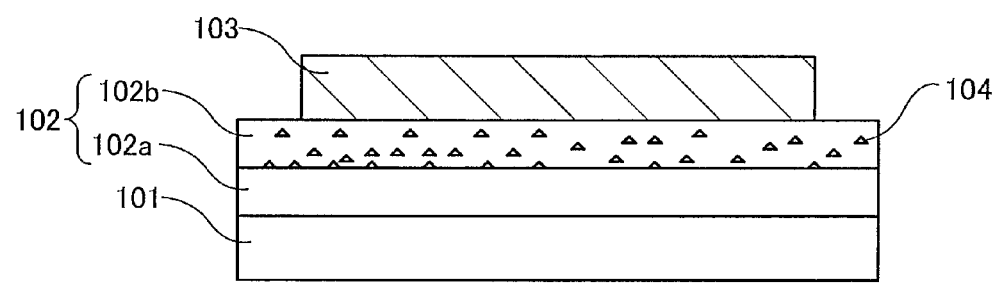

For example, the electron trap layer 102 may be a stacked body that includes a first insulating layer 102a and a second insulating layer 102b as illustrated in FIG. 2B. Alternatively, the electron trap layer 102 may be a stacked body that includes the first insulating layer 102a, the second insulating layer 102b, and a third insulating layer 102c as illustrated in FIG. 2C, or a stacked body including four or more insulating layers. For example, the second insulating layer 102b includes conductive minute regions 104. In addition, conductive minute regions 104 are likely to be formed at the interface between the second insulating layer 102b and another insulating layer.

Here, an insulating layer that does not include conductive minute regions 104 or includes a sufficiently small number of conductive minute regions 104 can function as a normal gate insulating layer and thereby can reduce leakage current between a gate and a drain or between the gate and a source. In contrast, the insulating layer including conductive minute regions 104 has a high density of electron trap states and thereby can make the threshold voltage of the transistor high. Accordingly, this structure enables small leakage current and appropriate threshold voltage adjustment. For this reason, it is preferable to form a stacked structure using different formation methods (or different formation conditions). Note that one embodiment of the present invention is not limited to the examples described above.

Note that the first to third insulating layers may include the same or different constituent elements. In this case, the first to third insulating layers may be formed by the same or different formation method(s) (under the same or different formation conditions). In this way, each layer can have a different function, so that a layer that is optimized as a whole can be formed. For example, the first insulating layer 102a may be formed using a material that allows electrons to easily enter the second insulating layer 102b from the semiconductor layer 101, the second insulating layer 102b may be formed using a material in which electrons are easily trapped, and the third insulating layer 102c may be formed using a material with small leakage current. For example, the constituent elements of the first to third insulating layers may be silicon oxide (oxygen and silicon), silicon nitride (nitrogen and silicon), silicon oxynitride (or silicon nitride oxide) (oxygen, nitrogen, and silicon), or the like. For example, the second insulating layer may be sandwiched between the first insulating layer and the third insulating layer that are formed using silicon oxide (oxygen and silicon), silicon nitride (nitrogen and silicon), silicon oxynitride (or silicon nitride oxide) (oxygen, nitrogen, and silicon), or the like. In this case, if the insulating layer including conductive minute regions 104 is used as the second insulating layer 102b, the insulating layer including conductive minute regions 104 having a high density of electron trap states can make the threshold voltage of the transistor high.

Note that an insulating layer formed by a CVD method or an ALD method is preferably formed thicker than an insulating layer formed by a sputtering method. This can reduce a dielectric breakdown, increases withstand voltage, and reduces leakage current. Note that one embodiment of the present invention is not limited to the examples described above.

Note that the CVD method may be any of a variety of methods: a thermal CVD method, a photo CVD method, a plasma CVD method, a Metal Organic Chemical Vapor Deposition (MOCVD) method, an LPCVD method, and the like. The insulating layers may be formed by different CVD methods.

When the proportion of conductive minute regions 104 in an insulating layer is too large, the electron trap layer 102 does not serve the function of an insulating layer. For this reason, it is preferable in one example that the proportion of conductive minute regions 104 is smaller than the proportion of nonconductive regions in the insulating layer.

Figure 3A:
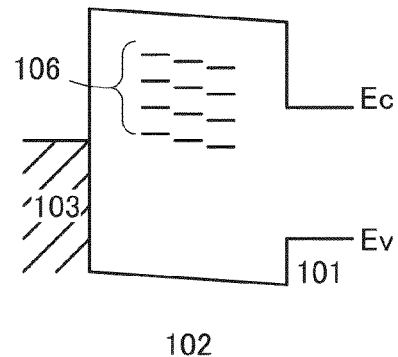
FIGS. 3A to 3D illustrate band diagram examples of a semiconductor device of an embodiment.
Figure 4A:
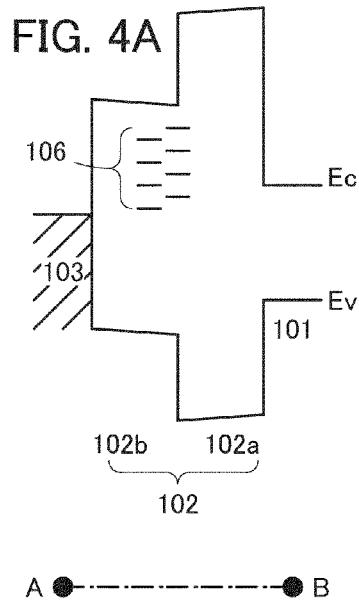
FIGS. 4A to 4D illustrate band diagram examples of a semiconductor device of an embodiment.
Figure 5A:
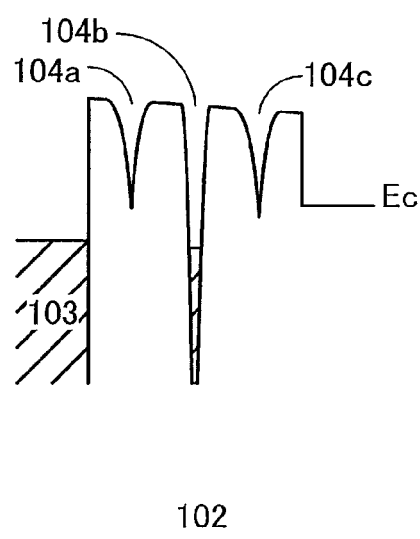
FIGS. 5A and SB illustrate band diagram examples of a semiconductor device of an embodiment.

FIG. 3A illustrates a band diagram example of the semiconductor device illustrated in FIG. 1A, from point A to point B. FIG. 4A illustrates a band diagram example of the semiconductor device illustrated in FIG. 1B, from point A to point B. FIG. 5A illustrates a band diagram example of the semiconductor device illustrated in FIG. 2A, from point A to point B. In the drawings, Ec represents a conduction band minimum and Ev represents a valence band maximum. In FIG. 3A, FIG. 4A, and FIG. 5A, the potential of the gate electrode 103 is the same as the potential of a source electrode or a drain electrode (not illustrated).

Figure 3B:
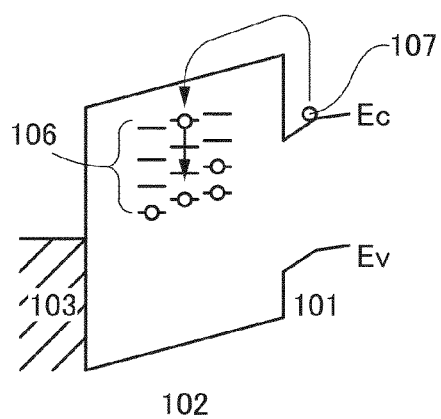

In FIG. 3A, electron trap states 106 exist inside the electron trap layer 102. FIG. 3B shows the state where the potential of the gate electrode 103 is higher than the potential of the source or drain electrode. The potential of the gate electrode 103 may be higher than the potential of the source or drain electrode by 1 V or more. The potential of the gate electrode 103 may be lower than the highest potential applied to the gate electrode 103 after this process, which is typically less than 4 V.

In FIG. 4A, the band gap of the first insulating layer 102a is wider than that of the second insulating layer 102b, and the electron affinity of the first insulating layer 102a is smaller than that of the second insulating layer 102b; however, the present invention is not limited to this example.

Figure 4B:
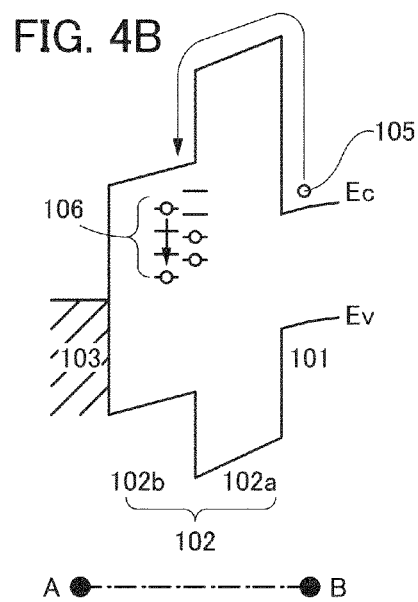

Electron trap states 106 exist at the interface between the first insulating layer 102a and the second insulating layer 102b or inside the second insulating layer 102b. FIG. 4B shows the state where the potential of the gate electrode 103 is higher than the potential of the source or drain electrode. Here, the potential of the gate electrode 103 may be higher than the potential of the source or drain electrode by 1 V or more. The potential of the gate electrode 103 may be lower than the highest potential applied to the gate electrode 103 after this process, which is typically less than 4V.

In FIG. 5A, a plurality of conductive minute regions 104 exist inside the electron trap layer 102. Note that the conductive minute regions 104 each have different conductivities. The conductivity can be defined by the carrier concentration or the Fermi level, for example.

For example, in FIG. 5A, a conductive minute region 104a and a conductive minute region 104c include more electrons than other region in the electron trap layer 102, and thus potential recessions exist at the conductive minute region 104a and the conductive minute region 104c. However, Ec is not below the Fermi level, and semiconductor characteristics are exhibited. For example, in the case where the electron trap layer 102 is formed of hafnium oxide, because oxygen vacancies exist partly or locally, semiconductor characteristics are exhibited. In contrast, at a conductive minute region 104b, Ev is below the Fermi level, so that metal characteristics are exhibited. For example, in the case where the electron trap layer 102 is formed of hafnium oxide, the conductive minute region 104b is a region with very little oxygen, where metallic hafnium is precipitated.

Note that when the conductive minute region 104 has a size that causes a significant quantum effect (1 nm or less), a discrete energy level might be formed.

Figure 5B:
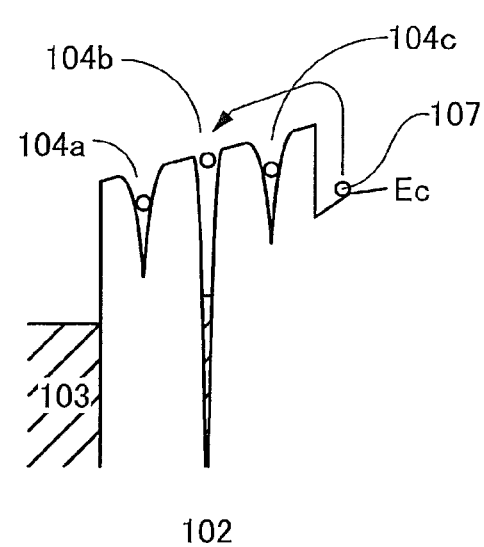

FIG. 5B shows the state where the potential of the gate electrode 103 is higher than the potential of the source or drain electrode. Here, the potential of the gate electrode 103 may be higher than the potential of the source or drain electrode by 1 V or more. The potential of the gate electrode 103 may be lower than the highest potential applied to the gate electrode 103 after this process, which is typically less than 4V.

Electrons 107 that exist in the semiconductor layer 101 move toward the gate electrode 103 having a higher potential. Some of the electrons 107 moving from the semiconductor layer 101 toward the gate electrode 103 are trapped in the electron trap states 106 or the conductive minute regions 104.

There are some processes to enable the electrons 107 to go over the barrier between the semiconductor layer 101 and the electron trap layer 102 and to be trapped in the electron trap states 106 or the conductive minute regions 104. The first is a process by the tunnel effect. The thinner the first insulating layer is, the more prominent the tunnel effect is. Note that electrons trapped by the electron trap states 106 or the conductive minute regions 104 may return to the semiconductor layer 101 by the tunnel effect.

Even when the electron trap layer 102 is relatively thick, the tunnel effect (Fowler-Nordheim tunnel effect) can be obtained by applying an appropriate voltage to the gate electrode 103. In the case of the Fowler-Nordheim tunnel effect, a tunnel current increases with the square of the electric field between the gate electrode 103 and the semiconductor layer 101.

The second is the process that the electrons 107 hop from trap states to trap states in the band gap such as defect states in the electron trap layer 102 to reach the second insulating layer 102b. This is a conduction mechanism called Poole-Frenkel conduction, in which as the absolute temperature is higher and trap states are shallower, the electric conductivity is higher.

The third is the process that the electrons 107 go over the barrier of the electron trap layer 102 by thermal excitation. The distribution of electrons existing in the semiconductor layer 101 follows the Fermi-Dirac distribution; in general, the proportion of electrons having high energy is larger as the temperature is higher. Assuming that the density of electrons having energy 3 eV higher than the Fermi level at 300 K (27° C.) is 1, for example, the density is $6 \times 10^{16}$ at 450 K (177° C.), $1.5 \times 10^{25}$ at 600 K (327° C.), and $1.6 \times 10^{30}$ at 750 K (477° C.).

The movement of the electrons 107 toward the gate electrode 103 by going over the barrier of the electron trap layer 102 occurs by the above three processes or the combination of these processes. In particular, the second and the third processes indicate that current increases exponentially as the temperature is higher.

Also, the Fowler-Nordheim tunnel effect is more likely to occur as the density of electrons in a thin part (a high-energy portion) of the barrier layer of the electron trap layer 102 is higher; thus, a higher temperature is better.

Note that in most cases, current generated by the conduction mechanism is weak in particular when the potential of the gate electrode 103 is low (5 V or lower). However, by taking a long time for the process, a necessary number of electrons can be trapped by the electron trap states 106 or the conductive minute regions 104. As a result, the electron trap layer 102 is negatively charged.

In other words, the potential of the gate electrode 103 is kept higher than that of the source or drain electrode at a high temperature (a temperature higher than the operating temperature or the storage temperature of the semiconductor device, or higher than or equal to 125° C. and lower than or equal to 450° C., typically higher than or equal to 150° C. and lower than or equal to 300° C.) for one second or longer, typically 1 minute or longer. As a result, a necessary number of electrons moves from the semiconductor layer 101 toward the gate electrode 103 and some of them are trapped by the electron trap states 106 or the conductive minute regions 104. The temperature of the process for trapping electrons is referred to as process temperature below.

Here, the number of electrons trapped by the electron trap states 106 or the conductive minute regions 104 can be adjusted by the potential of the gate electrode 103. When a certain number of electrons are trapped by the electron trap states 106 or the conductive minute regions 104, due to the electric charge, the electric field of the gate electrode 103 is blocked and a channel formed in the semiconductor layer 101 disappears.

The total number of electrons trapped by the electron trap states 106 or the conductive minute regions 104 increases linearly at first, and then, the rate of increase gradually decreases and the total number of electrons converges at a certain value. The convergence value depends on the potential of the gate electrode 103. As the potential is higher, the number of trapped electrons tends to be larger; however, it never exceeds the total number of electron trap states 106 or the conductive minute regions 104.

The electrons trapped by the electron trap states 106 or the conductive minute regions 104 are required not to transfer from the electron trap layer 102 to the other regions. For this, the thickness of the electron trap layer 102 is preferably set at a thickness at which the tunnel effect is not a problem. For example, the physical thickness is preferably more than 1 nm.

However, electron transfer is hindered if the thickness of the first insulating layer 102a is too large; thus, 30 nm or less is preferable. Furthermore, if the thickness of the electron trap layer 102 is too large as compared with the channel length of the semiconductor device, the subthreshold value is increased to degrade the off-state characteristics. For this reason, the channel length is more than or equal to four times, typically more than or equal to ten times as large as the equivalent oxide thickness of the electron trap layer 102. Note that when a so-called High-K material is used, the equivalent oxide thickness is less than the physical thickness.

Typically, the physical thickness of the electron trap layer 102 is more than or equal to 10 nm and less than or equal to 100 nm and the equivalent oxide thickness of the electron trap layer 102 is more than or equal to 10 nm and less than or equal to 25 nm. In the structures as illustrated in FIGS. 1B, 1C, 2B, and 2C, the thickness of the first insulating layer 102a is more than or equal to 10 nm and less than or equal to 20 nm, and the equivalent oxide thickness of the second insulating layer 102b is more than or equal to 10 nm and less than or equal to 25 nm.

Figure 2C:
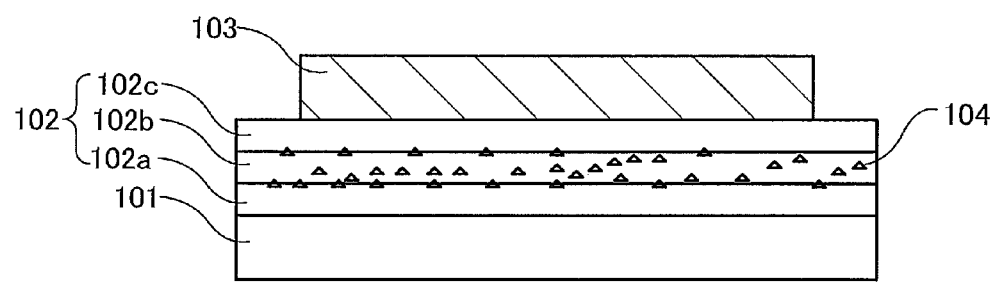

To hold electrons trapped by the conductive minute regions 104 inside the second insulating layer 102b or at the interface with another insulating layer, it is effective that the electron trap layer 102 is formed of three insulating layers as illustrated in FIG. 1C or FIG. 2C, that the electron affinity of the third insulating layer 102c is smaller than that of the second insulating layer 102b, and that the bandgap of the third insulating layer 102c is larger than that of the second insulating layer 102b.

In this case, if the physical thickness of the third insulating layer 102c is large enough, electrons trapped by the electron trap states 106 or the conductive minute regions 104 can be held even when the second insulating layer 102b has a small thickness. As a material of the third insulating layer 102c, the same material as or a material similar to that of the first insulating layer 102a can be used. Alternatively, a material whose constituent elements are the same as those of the second insulating layer 102b but density of electron trap states is low enough or number of conductive minute regions is small enough may be used. The number of conductive minute regions depends on the formation method. The thickness of the third insulating layer 102c is more than or equal to 1 nm and less than or equal to 20 nm.

In the above structure, each of the first to third insulating layers 102a to 102c may be composed of a plurality of insulating layers. A plurality of insulating layers containing the same constituting elements and formed by different formation methods may be used.

When the first and second insulating layers 102a and 102b are formed using insulating layers composed of the same constituting elements (e.g., hafnium oxide), the first insulating layer 102a may be formed by a CVD method or an ALD method and the second insulating layer 102b may be formed by a sputtering method.

In general, an insulating layer formed by a sputtering method includes a higher density of electron trap states and a larger number of conductive minute regions than an insulating layer formed by a CVD method or an ALD method, and thus has stronger electron trapping characteristics. From this reason, the second insulating layer 102b may be formed by a sputtering method and the third insulating layer 102c may be formed by a CVD method or an ALD method when the second and third insulating layers 102b and 102c contain the same constituent elements.

When the second insulating layer 102b is formed using a plurality of insulating layers containing the same constituent elements, one insulating layer may be formed by a sputtering method and another insulating layer may be formed by a CVD method or an ALD method.

Another method is to set the operating temperature or the storage temperature of the semiconductor device at a temperature that is lower enough than the process temperature. The probability that electrons go over a 3 eV-barrier when the temperature is 120° C. is less than a one hundred-thousandth that when the temperature is 300° C. In this way, although electrons easily go over a barrier to be trapped by the electron trap states 106 during the process at 300° C., the electrons are difficult to go over the barrier during storage at 120° C. and are kept trapped by the electron trap states 106 for a long time.

It is also effective that the effective mass of a hole is extremely large or holes are substantially localized in the semiconductor layer 101. In this case, the injection of holes from the semiconductor layer 101 to the electron trap layer 102 does not occur and consequently a phenomenon in which electrons trapped by the electron trap states 106 or the conductive minute regions 104 bond to holes and disappear does not occur.

A material exhibiting Poole-Frenkel conduction may be used for the second insulating layer 102b. The Poole-Frenkel conduction is, as described above, electron hopping conduction between defect states and the like in a material. A material including a high density of defect states or including deep defect states has low electric conductivity and consequently can hold electrons trapped by the electron trap states 106 or the conductive minute regions 104 for a long time.

Circuit design or material selection may be made so that no voltage at which electrons trapped in the electron trap layer 102 are released is applied. For example, in a material whose effective mass of holes is extremely large or holes are substantially localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator. In this case, the electric field between the gate electrode 103 and the semiconductor layer 101 is extremely small and consequently the Fowler-Nordheim tunnel effect or electron conduction according to the Poole-Frenkel conduction is significantly decreased.

To hold electrons trapped by electron trap states inside the second insulating layer 102b or at the interface with another insulating layer, it is effective that the electron trap layer 102 is formed of three insulating layers as illustrated in FIG. 1C by different formation methods (or different formation conditions) and that the density of electron trap states in the second insulating layer 102b is higher than that of the other layers.

In this case, if the physical thickness of the third insulating layer 102c is large enough, electrons trapped by the electron trap states 106 can be held even when the second insulating layer 102b has a small thickness. As a material of the third insulating layer 102c, the same material as or a material similar to that of the first insulating layer 102a can be used. Alternatively, a material whose constituent elements are the same as those of the second insulating layer 102b but density of electron trap states is low enough may be used. The density of electron trap states depends on the formation method.

Figure 3C:
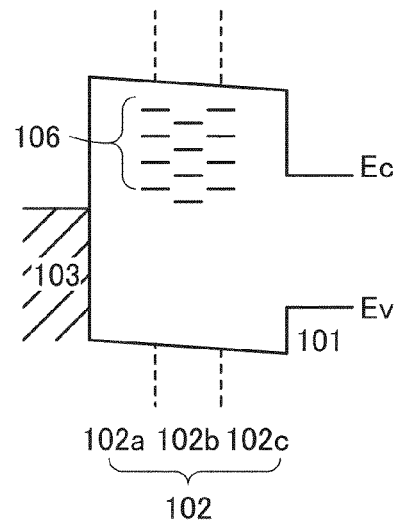

FIG. 3C illustrates a band diagram example of the semiconductor device illustrated in FIG. 1C, from point C to point D. Note that if the formation method (or formation conditions) is different, materials including the same constituent elements may have different number of oxygen vacancies or the like and thus may have different Fermi levels. However, in the example described below, it is assumed that such materials have the same Fermi level.

The second insulating layer 102b is formed by a formation method (or under formation conditions) that makes the density of electron trap states 106 higher. Accordingly, the density of electron trap states at the interface between the first insulating layer 102a and the second insulating layer 102b and at the interface between the second insulating layer 102b and the third insulating layer 102c is high.

Figure 3D:
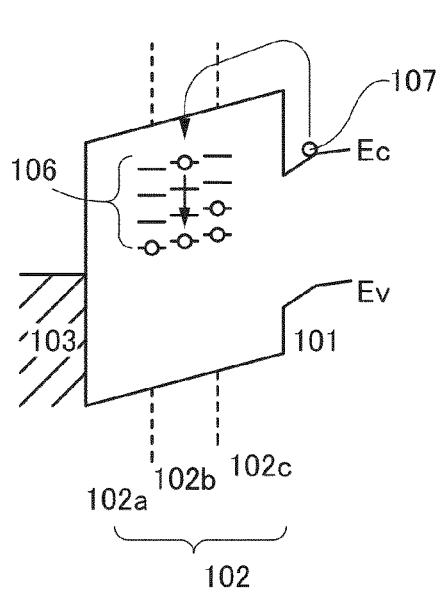

By setting the potential of the gate electrode 103 and the temperature at the above-described conditions, electrons from the semiconductor layer 101 are trapped by the electron trap states 106 as described with FIG. 3D, so that the electron trap layer 102 is negatively charged.

Figure 4C:
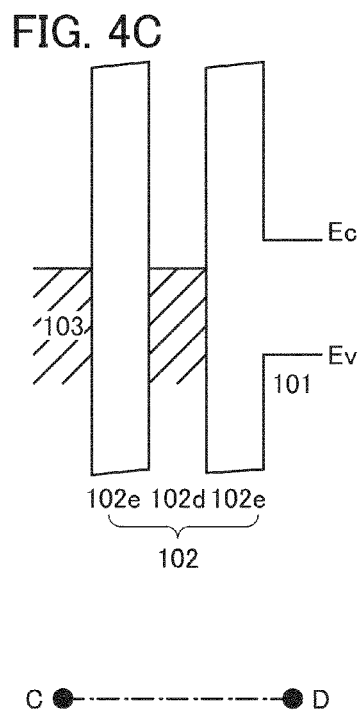

Note that when the electrically insulated conductive layer 102d is surrounded by the insulator 102e as illustrated in FIG. 1D, electrons are trapped in the conductive layer 102d according to the above principle. In FIG. 4C, the potential of the gate electrode 103 is equal to that of the source or drain electrode.

Figure 4D:
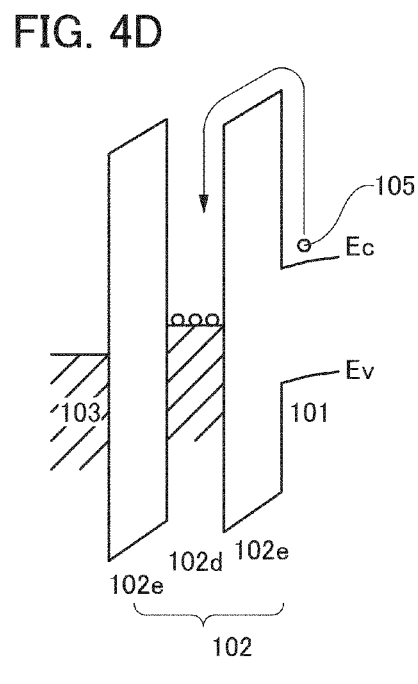

FIG. 4D shows the state where the potential of the gate electrode 103 is higher than the potential of the source or drain electrode. Electrons that exist in the semiconductor layer 101 move toward the gate electrode 103 having a higher potential. Some of the electrons moving from the semiconductor layer 101 toward the gate electrode 103 are trapped in the conductive layer 102d. In other word, in the semiconductor device illustrated in FIG. 1D, the conductive layer 102d functions as the electron trap states 106 in the semiconductor device in FIG. 1B.

Note that when the work function of the conductive layer 102d is large, an energy barrier to the insulator 102e is high and consequently the trapped electrons can be prevented from moving out from the conductive layer 102d.

In the above structure, each of the first to third insulating layers 102a to 102c may be composed of a plurality of insulating layers. A plurality of insulating layers containing the same constituting elements and formed by different formation methods may be used.

For example, when the first and second insulating layers 102a and 102b are formed using insulating layers composed of the same constituting elements (e.g., hafnium oxide), the first insulating layer 102a may be formed by a CVD method or an ALD method and the second insulating layer 102b may be formed by a sputtering method.

In general, an insulating layer formed by a sputtering method includes more defects and stronger electron trapping characteristics than an insulating layer formed by a CVD method or an ALD method. From this reason, the second insulating layer 102b may be formed by a sputtering method and the third insulating layer 102c may be formed by a CVD method or an ALD method when the second and third insulating layers 102b and 102c are formed to include the same constituent elements.

When the second insulating layer 102b is formed using a plurality of insulating layers containing the same constituent elements, one insulating layer may be formed by a sputtering method and another insulating layer may be formed by a CVD method or an ALD method.

In the case where the conductive minute regions 104 exist in the second insulating layer 102b, the second insulating layer 102b is formed using a material (or a formation method or formation conditions) that makes the number of conductive minute regions 104 larger. Accordingly, many conductive minute regions 104 are formed at the interface between the first insulating layer 102a and the second insulating layer 102b and at the interface between the second insulating layer 102b and the third insulating layer 102c.

By setting the potential of the gate electrode 103 and the temperature at the above-described conditions, electrons from the semiconductor layer 101 are trapped by the conductive minute regions 104 as described with FIG. 5B, so that the electron trap layer 102 is negatively charged.

Figure 6A:
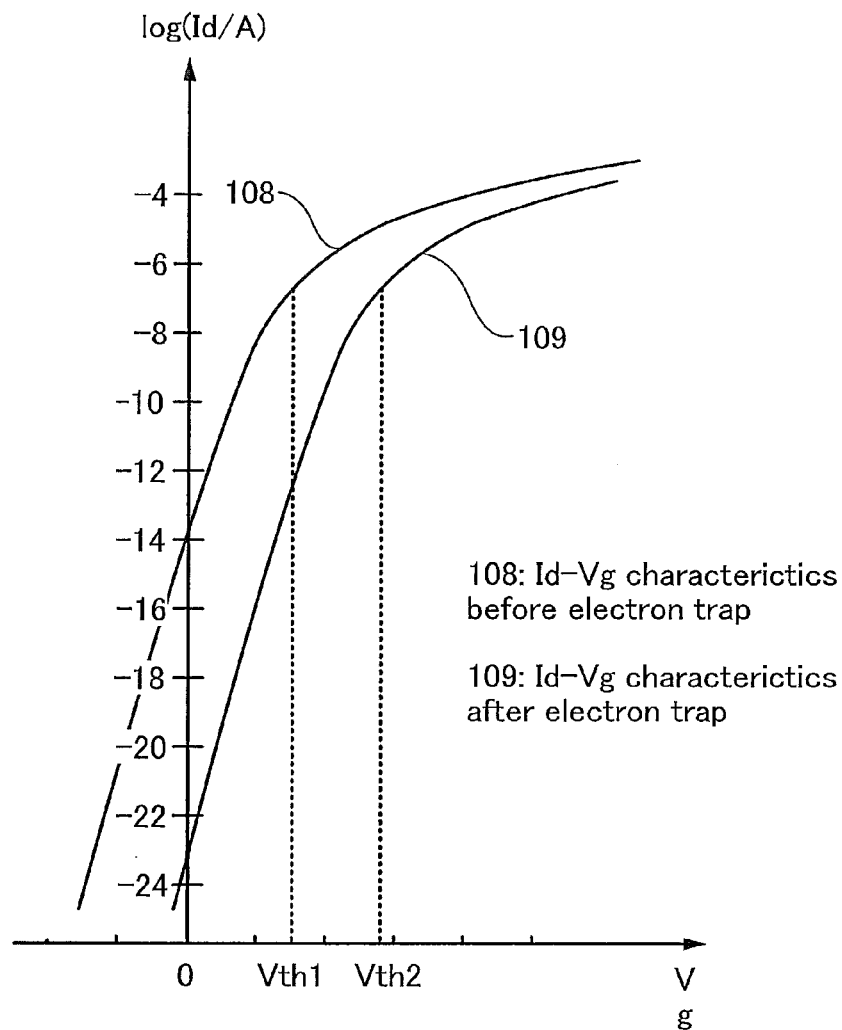
FIG. 6A schematically shows characteristics of a semiconductor device of an embodiment and FIG. 6B illustrates an example of a circuit in which the semiconductor device is used.

As shown in FIG. 6A, the threshold of a semiconductor device is increased by the trap of electrons in the electron trap layer 102. In particular, when the semiconductor layer 101 is formed using a wide band gap material, a source-drain current (cut-off current. Icut) when the potential of the gate electrode 103 is equal to the potential of the source or drain electrode can be significantly decreased.

For example, the Icut density (a current value per micrometer of a channel width) of an In—Ga—Zn-based oxide whose band gap is 3.2 eV is 1 zA/µm ($1 \times 10^{-21}$ A/µm) or less, typically 1 yA/µm ($1 \times 10^{-24}$ A/µm) or less.

FIG. 6A schematically shows dependence of current per micrometer of channel width (Id) between source and drain electrodes on the potential of the gate electrode (Vg) at room temperature, before and after electron trap in the electron trap layer 102. The potential of the source electrode is 0 V and the potential of the drain electrode is +1 V. Although current smaller than 1 fA cannot be measured directly, it can be estimated from a value measured by another method, the subthreshold value, and the like. Note that Example is referred to for the measurement method.

As indicated by a curve 108, the threshold voltage of the semiconductor device is Vth1 at first. After electron trapping, the threshold voltage increases (shifts in the positive direction) to become Vth2. As a result, the current density when Vg=0 becomes 1 aA/μm ($1\times10^{-18}$ A/μm) or less, for example, greater than or equal to 1 zA/μm and less than or equal to 1 yA/μm.

Figure 6B:
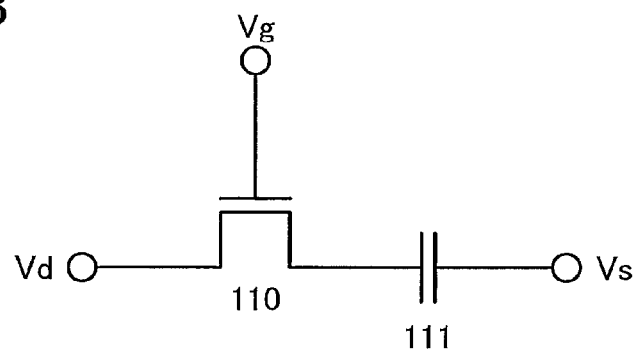

FIG. 6B illustrates a circuit in which charge stored in a capacitor 111 is controlled by a transistor 110. Leakage current between electrodes of the capacitor 111 is ignored here. The capacitance of the capacitor 111 is 1 fF, the potential of the capacitor 111 on the transistor 110 side is +1 V, and the potential of Vd is 0 V.

The curve 108 in FIG. 6A denotes the Id-Vg characteristics of the transistor 110. When the channel width is 0.1 μm, the Icut is approximately 1 fA and the resistivity of the transistor 110 at this time is approximately $1\times10^{15}\Omega$. Accordingly, the time constant of a circuit composed of the transistor 110 and the capacitor 111 is approximately one second. This means that most of the charge stored in the capacitor 111 is lost in approximately one second.

The curve 109 in FIG. 6A denotes the Id-Vg characteristics of the transistor 110. When the channel width is 0.1 μm, the Icut is approximately 1 yA and the resistivity of the transistor 110 at this time is approximately $1\times10^{24}\Omega$. Accordingly, the time constant of the circuit composed of the transistor 110 and the capacitor 111 is approximately $1\times10^{9}$ seconds (=approximately 31 years). This means that one-third of the charge stored in the capacitor 111 is left after 10 years.

From this, charge can be held for 10 years in a simple circuit composed of a transistor and a capacitor without applying such a large voltage. This can be applied to various kinds of memory devices, such as memory cells illustrated in FIGS. 7A and 7B.

Figure 7A:
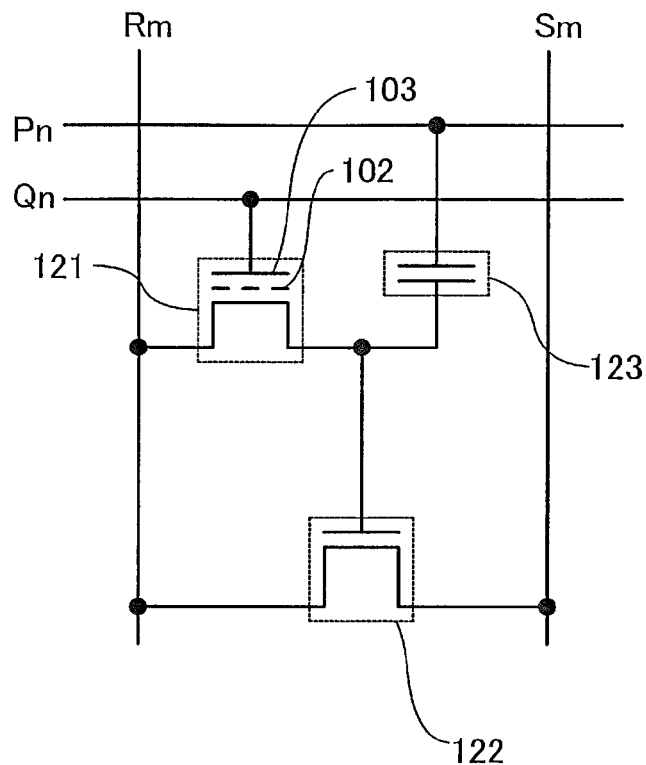
FIGS. 7A and 7B illustrate examples of a memory cell of an embodiment.

The memory cell illustrated in FIG. 7A includes a transistor 121, a transistor 122, and a capacitor 123. The transistor 121 includes the electron trap layer 102 as illustrated in FIG. 1A, FIG. 1B, or FIG. 2A. After the circuit is formed, the above-described process for increasing the threshold voltage is performed to lower Icut. Note that in the drawing, the transistor with the changed threshold voltage due to electrons in the electron trap layer is represented by a symbol that is different from the symbol for a normal transistor.

Memory cells in FIG. 7A are formed in a matrix. For example, to the memory cell in the n-th row and m-th column, a read word line Pn, a write word line Qn, a bit line Rm, and a source line Sm are connected.

The threshold voltage correction can be performed as follows. First, potentials of all read word lines, all source lines, and all bit lines are set at 0 V. Then, a wafer or chip over which the memory cells are formed is set at an appropriate temperature and the potentials of all the write word lines are set at an appropriate value (e.g., +3 V), and these conditions are held for an appropriate period. In this way, the threshold voltage becomes an appropriate value.

Figure 7B:
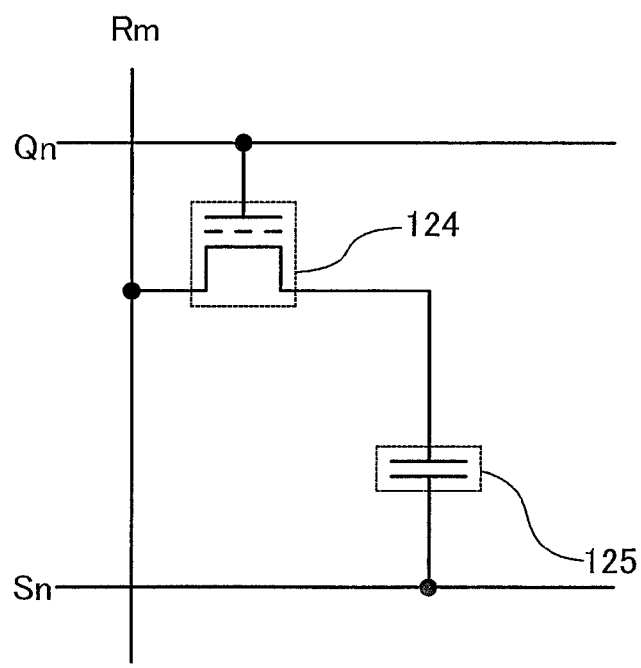

Note that the memory cell may have a structure including a transistor 124 and a capacitor 125 as illustrated in FIG. 7B. For example, to the memory cell in the n-th row and m-th column, a word line Qn, a bit line Rm, and a source line Sm are connected. The method for adjusting the threshold voltage can be similar to that in the case of FIG. 7A. The transistor 121 and the transistor 124 may be provided with a second gate electrode that is connected to a threshold voltage adjustment wiring. All the threshold voltage adjustment wirings may be arranged to be connected to each other to have the same potential.

Figure 8A:
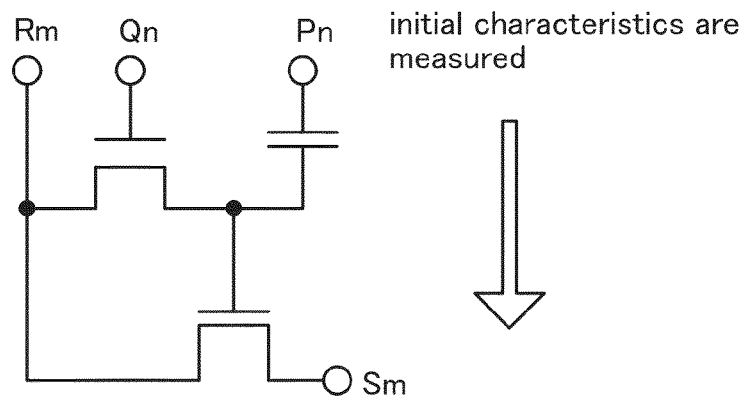
FIGS. 8A to 8C illustrate a manufacturing process of a semiconductor device.
Figure 8B:
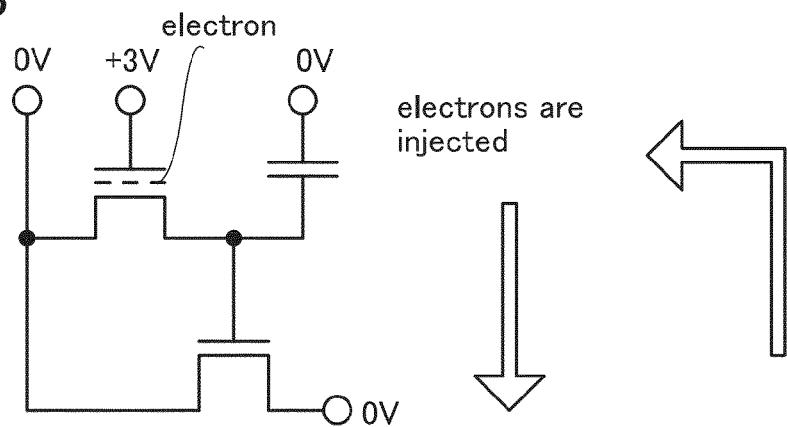
Figure 8C:
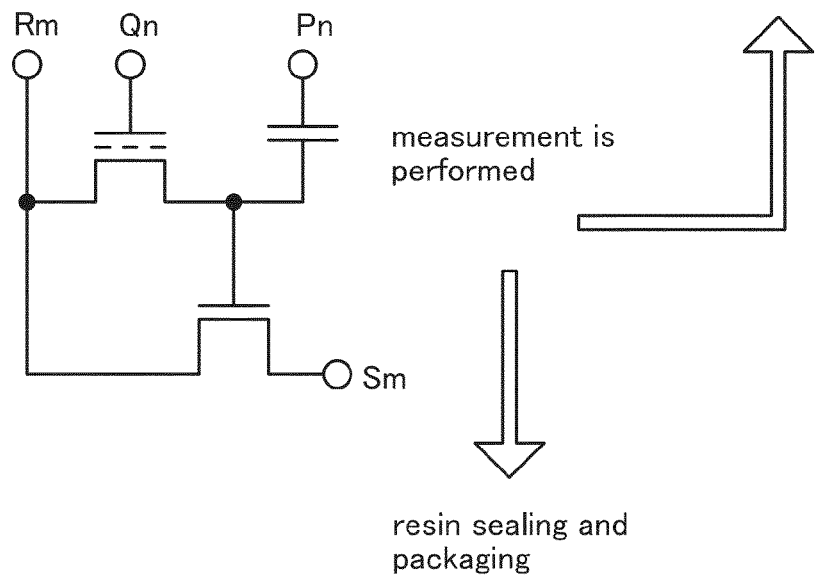

For example, steps illustrated in FIGS. 8A to 8C can be performed. After memory cells are formed, first, initial characteristics are measured to select a conforming item (see FIG. 8A). Here, items without malfunctions that cannot be recovered due to a break in a wire or the like are regarded as conforming items. At this stage, the threshold voltage has not been corrected to an appropriate value and thus charge in the capacitor cannot be held for a long time; however, this is not the criteria of selection.

Then, electrons are injected as illustrated in FIG. 8B. An appropriate number of electrons are trapped in the electron trap layer. This operation is performed in the above-described manner. At this stage, the difference between the potential of the gate electrode 103 and the potential of the one with the lower potential of the source electrode and the drain electrode (gate voltage) is more than or equal to 1 V and less than 4V and, in addition, less than or equal to the gate voltage after shipment of this memory cell.

Then, measurement is performed again as illustrated in FIG. 8C. One of the criteria for conforming items is the threshold voltage increased as planned. At this stage, chips with a threshold voltage abnormality are regarded as non-conforming items, and these chips may again be subjected to electron injection. Conforming items are shipped after dicing, resin sealing, and packaging.

The increase in the threshold voltage depends on the density of electrons trapped by the electron trap layer 102. For example, in the semiconductor device illustrated in FIG. 1B, in the case where electrons are trapped only at the interface between the first insulating layer 102a and the second insulating layer 102b, the threshold voltage is increased by Q/C, where Q is the surface density of trapped electrons and C is the dielectric constant of the first insulating layer.

As described above, the potential of the gate electrode 103 determines the value at which the number of trapped electrons converges. Accordingly, the increase in the threshold voltage can be adjusted by the potential of the gate electrode 103.

As an example, a case in which the potential of the gate electrode 103 is set higher than the potentials of the source electrode and the drain electrode by 1.5 V and the temperature is set at 150° C. to 250° C., typically 200° C.±20° C. is considered. Assuming that the threshold voltage of the semiconductor device before electrons are trapped in the electron trap layer 102 (first threshold voltage, Vth1) is 1.1 V, a channel is formed in the semiconductor layer 101 at first and electrons are trapped in the electron trap layer 102. Then, the number of trapped electrons in the electron trap layer 102 increases, and the channel disappears. At this stage, trap of electrons in the electron trap layer 102 stops.

In this case, because the channel disappears when the potential of the gate electrode 103 is higher than the potentials of the source electrode and the drain electrode by 1.5 V, the threshold voltage becomes 1.5 V. It can also be said that the threshold voltage is increased by 0.4 V by electrons trapped in the electron trap layer 102. The threshold voltage that has been changed by electrons trapped in the electron trap layer 102 is referred to as a second threshold voltage (Vth2).

By utilizing these characteristics, the threshold voltages of a plurality of semiconductor devices which are initially largely different from each other can converge at values within an appropriate range. For example, if three semiconductor devices with the first threshold voltages of 1.2 V, 1.1 V, and 0.9 V are subjected to the process under above-described conditions, trap of electrons does not make the threshold voltage to become significantly higher than 1.5 V in each semiconductor device; the second threshold voltage of each semiconductor device can become approximately 1.5 V. In this case, the number of trapped electrons in the electron trap layer 102 (e.g., the surface density of electrons) varies among the three semiconductor devices.

Any of a variety of materials can be used for the gate electrode 103. For example, a conductive layer of Al, Ti, Cr, Co, Ni, Cu, Y, Zr, Mo, Ru, Ag, Ta, W, or the like can be used. The gate electrode may have a stacked-layer structure of any of the above materials. Alternatively, a conductive layer containing nitrogen may be used as the gate electrode 103. For example, a titanium nitride layer over which a tungsten layer is stacked, a tungsten nitride layer over which a tungsten layer is stacked, a tantalum nitride layer over which a tungsten layer is stacked, or the like can be used as the gate electrode 103.

Note that the work function of the gate electrode 103 that faces the semiconductor layer 101 is one factor determining the threshold voltage of the semiconductor device; in general, as the work function of a material is smaller, the threshold voltage becomes lower. However, as described above, the threshold voltage can be adjusted by adjusting the number of trapped electrons in the electron trap layer 102; accordingly, the range of choices for the material of the gate electrode 103 can be widened.

Any of a variety of materials can be used for the semiconductor layer 101. For example, other than silicon, germanium, and silicon germanium, any of a variety of oxide semiconductors described later can be used.

Any of a variety of materials can be used for the electron trap layer 102. An insulating layer containing one or more kinds selected from hafnium oxide, aluminum oxide, tantalum oxide, aluminum silicate, and the like can be used.

In the case where the electron trap layer 102 has a stacked structure, the first insulating layer 102a can be an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide, for example.

The second insulating layer 102b can be an insulating layer including one or more kinds selected from hafnium oxide, aluminum oxide, tantalum oxide, aluminum silicate, and the like, for example.

The third insulating layer 102c can be an insulating layer including one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide, for example.

Any of a variety of materials can be used for the conductive layer 102d. For example, a conductive film of Al, Ti, Cr, Co, Ni, Cu, Y, Zr, Mo, Ru, Ag, Ta, W, Pt, Pd, or the like can be used. The conductive layer 102d may be a stack of any of the above materials. Alternatively, a conductive layer containing nitrogen may be used as the conductive layer 102d.

In particular, as a material having a large work function, a metal of the platinum group such as platinum or palladium: a nitride such as indium nitride, zinc nitride, In—Zn-based oxynitride, In—Ga-based oxynitride, or In—Ga—Zn-based oxynitride; or the like may be used.

Any of a variety of materials can be used for the insulator 102e. For example, silicon oxide, silicon nitride, silicon oxynitride, silicon nitride oxide, aluminum oxide, or tantalum oxide can be used.

Thus, the semiconductor device in which a necessary number of electrons are trapped in the electron trap layer 102 is the same as a normal MOS semiconductor device except that the threshold voltage has a specific value. That is, the electron trap layer 102 serves as a gate insulating layer.

Note that the timing of the process for trapping electrons in the electron trap layer 102 is not limited to that described above and may be any of the following timings before leaving the factory, for example: after formation of wiring metal connected to the source electrode or the drain electrode of the semiconductor device, after backplane process (wafer process), and after wafer dicing, and after packaging. In either case, it is preferable that the semiconductor device be not exposed to temperatures of 125° C. or higher for 1 hour or more after the process for trapping electrons.

This embodiment can be implemented in combination with any of the other embodiments disclosed in this specification as appropriate.

(Embodiment 2)

In this embodiment, a semiconductor device which is one embodiment of the present invention is described with reference to drawings. Although a top-gate transistor (transistor including a semiconductor layer between a substrate and a gate electrode) is mainly described below, one embodiment of the present invention may be a bottom-gate transistor (transistor including a gate electrode between a substrate and a semiconductor layer). Further, one embodiment of the present invention may be a transistor including a first gate electrode and a second gate electrode, where the first gate electrode is between a substrate and a semiconductor layer and the semiconductor layer is between the first gate electrode and the second gate electrode.

Figure 9A:
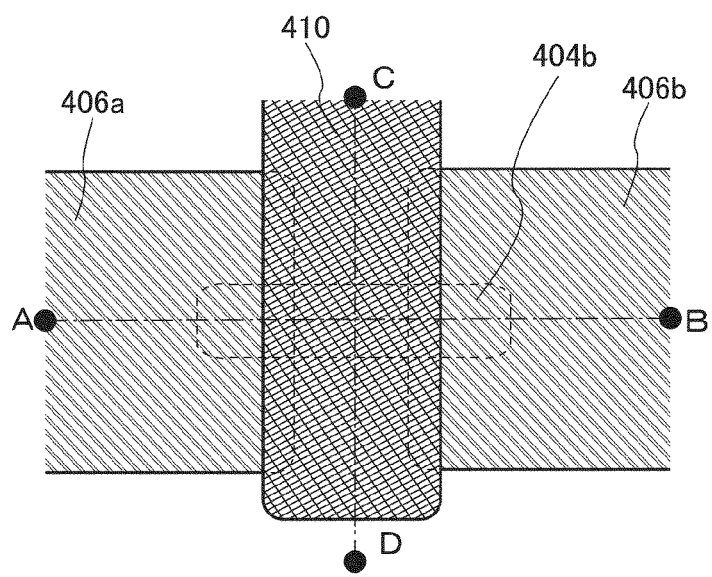
FIGS. 9A to 9C are a top view and cross-sectional views of a transistor.
Figure 9B:
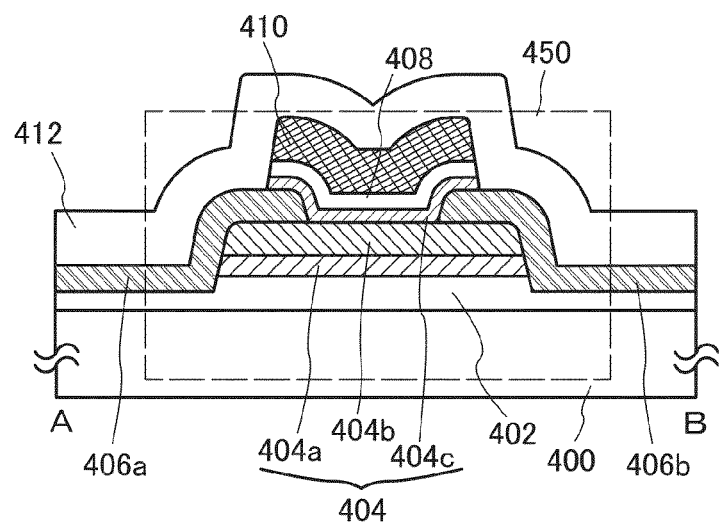
Figure 9C:
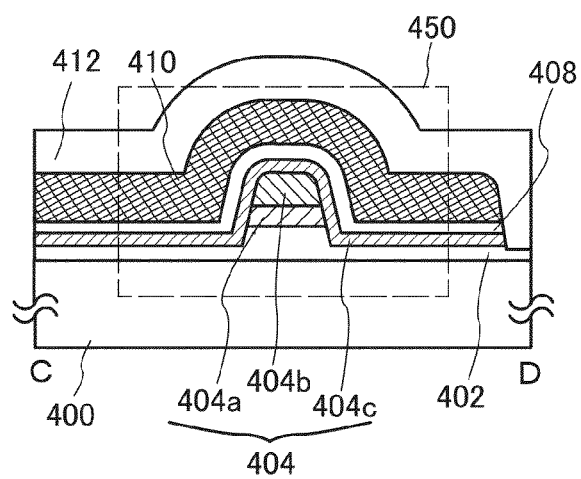

FIGS. 9A to 9C are a top view and cross-sectional views illustrating a transistor of one embodiment of the present invention. FIG. 9A is the top view, FIG. 9B illustrates a cross section taken along the dashed-dotted line A-B in FIG. 9A, and FIG. 9C illustrates a cross section taken along the dashed-dotted line C-D in FIG. 9A. Note that for drawing simplicity, some components are not illustrated in the top view of FIG. 9A. In some cases, the direction of the dashed-dotted line A-B is referred to as a channel length direction, and the direction of the dashed-dotted line C-D is referred to as a channel width direction.

A transistor 450 illustrated in FIGS. 9A to 9C includes a substrate 400; a base insulating layer 402 having a depression portion and a projection portion over the substrate 400; an oxide semiconductor layer 404a and an oxide semiconductor layer 404b over the projection portion of the base insulating layer 402; a source electrode 406a and a drain electrode 406b over the oxide semiconductor layer 404a and the oxide semiconductor layer 404b; an oxide semiconductor layer 404c in contact with the depression portion of the base insulating layer 402, a side surface of the projection portion (depression portion) of the base insulating layer 402, a side surface of the oxide semiconductor layer 404a, a side surface and a top surface of the oxide semiconductor layer 404b, the source electrode 406a, and the drain electrode 406b; a gate insulating layer 408 over the oxide semiconductor layer 404c; a gate electrode 410 provided over and in contact with the gate insulating layer 408 and facing the top surface and the side surface of the oxide semiconductor layer 404b, and an oxide insulating layer 412 over the source electrode 406a, the drain electrode 406b, and the gate electrode 410.

Figure 10A:
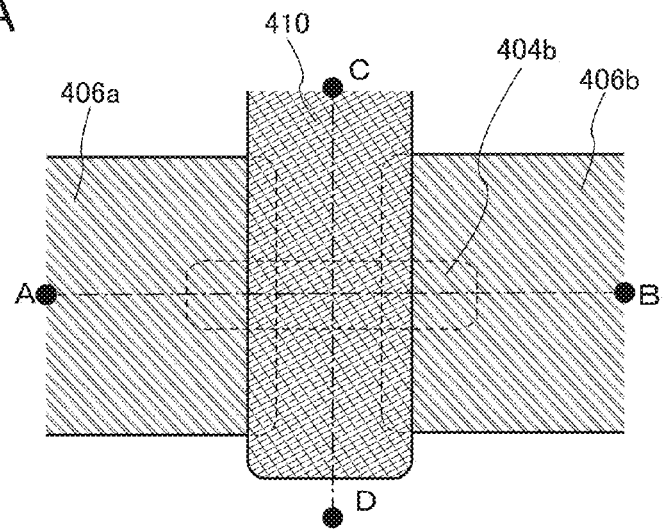
FIGS. 10A to 10C are a top view and cross-sectional views of a transistor.
Figure 10B:
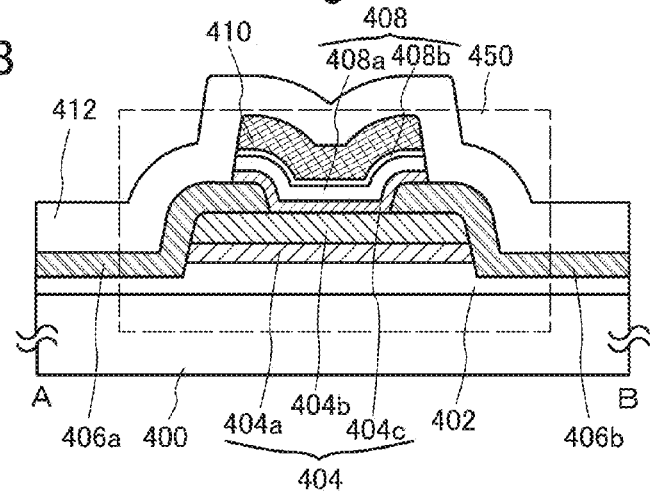
Figure 10C:
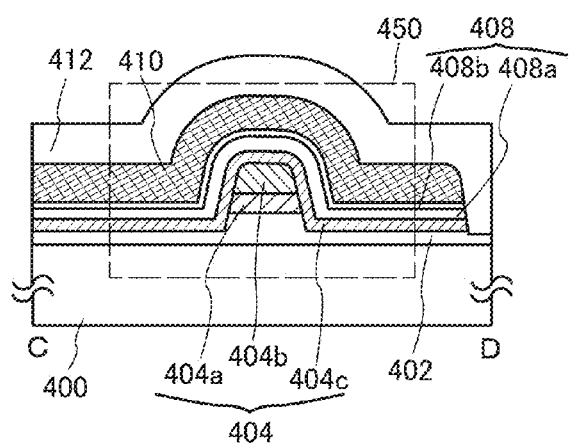

The gate insulating layer 408 functions as the electron trap layer described in Embodiment 1 with reference to FIGS. 1A to 1D. Here, the gate insulating layer 408 has a stacked structure including an insulating layer formed by a CVD method (the first insulating layer 102a in Embodiment 1), an insulating layer formed thereover by a sputtering method (the second insulating layer 102b in Embodiment 1), and an insulating layer formed thereover by a CVD method (the third insulating layer 102c in Embodiment 1). However, an insulating layer formed by a single formation method (or under the same formation conditions) or two insulating layers stacked by two different formation methods (or under two formation conditions) may be used. For example, one embodiment of the present invention may be a transistor illustrated in FIGS. 10A to 10C.

In general, if stacked insulating layers have the same constituent elements, it is difficult to recognize the interface between the insulating layers.

The oxide semiconductor layer 404a, the oxide semiconductor layer 404b, and the oxide semiconductor layer 404c are collectively referred to as a multilayer semiconductor layer 404.

In the case where a material used as the gate insulating layer 408 has a high relative dielectric constant, the gate insulating layer 408 can be formed thick. For example, in the case of using hafnium oxide with a relative dielectric constant of 16, the gate insulating layer 408 can be formed approximately four times as thick as the gate insulating layer 408 using silicon oxide with a relative dielectric constant of 3.9. The increase in the thickness of the gate insulating layer 408 is preferable in terms of preventing the leakage of trapped electrons. Note that the thickness of the gate insulating layer 408 is more than or equal to 1 nm and less than or equal to 100 nm, typically more than or equal to 5 nm and less than or equal to 20 nm.

Note that the channel length refers to the distance between a source (a source region, source electrode) and a drain (drain region, drain electrode) in a region where a semiconductor layer overlaps with a gate electrode in the top view. That is, the channel length in FIG. 9A is the distance between the source electrode 406a and the drain electrode 406b in the region where the oxide semiconductor layer 404b overlaps with the gate electrode 410. The channel width refers to the width of a source or a drain in a region where a semiconductor layer overlaps with a gate electrode. That is, the channel width in FIG. 9A is the width of the source electrode 406a or the drain electrode 406b in the region where the semiconductor layer 404b overlaps with the gate electrode 410.

When the gate insulating layer 408 functions as an electron trap layer, electrons can be trapped in electron trap states existing inside the layer as described in Embodiment 1. The number of electrons trapped in the electron trap states can be adjusted by the potential of the gate electrode 410.

The potential of the gate electrode 410 determines the value at which the number of trapped electrons converges. Accordingly, the increase in the threshold voltage can be adjusted by adjusting the potential of the gate electrode 410.

The gate electrode 410 electrically covers the oxide semiconductor layer 404b, increasing the on-state current. This transistor structure is referred to as a surrounded channel (s-channel) structure. In the s-channel structure, a current flows through an entire region of the oxide semiconductor layer 404b (bulk). Since a current flows through the oxide semiconductor layer 404b, an adverse effect of interface scattering is unlikely to occur, leading to a high on-state current. Note that as the oxide semiconductor layer 404b is thicker, the on-state current can be increased.

In formation of a transistor with a short channel length and a short channel width, when an electrode, a semiconductor layer, or the like is processed at the same time when a resist mask is recessed, the electrode, the semiconductor layer, or the like has a rounded upper end portion (curved surface) in some cases. With this structure, the coverage with the gate insulating layer 408, the gate electrode 410, and the oxide insulating layer 412, which are to be formed over the oxide semiconductor layer 404b, can be improved. In addition, electric field concentration that might occur at end portions of the source electrode 406a and the drain electrode 406b can be reduced, which can suppress deterioration of the transistor.

By miniaturization of the transistor, a high degree of integration and a high density can be achieved. For example, the channel length of the transistor is less than or equal to 100 nm, preferably less than or equal to 40 nm, further preferably less than or equal to 30 nm, and still further preferably less than or equal to 20 nm, and the channel width of the transistor is less than or equal to 100 nm, preferably less than or equal to 40 nm, further preferably less than or equal to 30 nm, and still further preferably less than or equal to 20 nm. Even with such a small channel width, a transistor of one embodiment of the present invention can increase the on-state current by having the s-channel structure.

The substrate 400 is not limited to a simple supporting substrate, and may be a substrate where another device such as a transistor is formed. In that case, at least one of the gate electrode 410, the source electrode 406a, and the drain electrode 406b of the transistor 450 may be electrically connected to the above device.

The base insulating layer 402 can have a function of supplying oxygen to the multilayer semiconductor layer 404 as well as a function of preventing diffusion of impurities from the substrate 400. In the case where the substrate 400 is provided with another device as described above, the base insulating layer 402 also has a function as an interlayer insulating layer. In that case, since the base insulating layer 402 has an uneven surface, the base insulating layer 402 is preferably subjected to planarization treatment such as chemical mechanical polishing (CMP) treatment so as to have a flat surface.

The multilayer semiconductor layer 404 in the channel formation region of the transistor 450 has a structure in which the oxide semiconductor layer 404a, the oxide semiconductor film 404b, and the oxide semiconductor layer 404c are stacked in this order from the substrate 400 side. The oxide semiconductor layer 404b is surrounded by the oxide semiconductor layer 404a and the oxide semiconductor layer 404c. As in FIG. 9C, the gate electrode 410 electrically covers the oxide semiconductor layer 404b.

Here, for the oxide semiconductor layer 404b, for example, an oxide semiconductor whose electron affinity (an energy difference between a vacuum level and the conduction band minimum) is higher than those of the oxide semiconductor layer 404a and the oxide semiconductor layer 404c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 404a and the oxide semiconductor layer 404c each contain one or more kinds of metal elements forming the oxide semiconductor layer 404b. For example, the oxide semiconductor layer 404a and the oxide semiconductor layer 404c are preferably formed using an oxide semiconductor whose conduction band minimum is closer to a vacuum level than that of the oxide semiconductor layer 404b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 410, a channel is formed in the oxide semiconductor layer 404b where the conduction band minimum is the lowest in the multilayer semiconductor layer 404. In other words, the oxide semiconductor layer 404c is formed between the oxide semiconductor layer 404b and the gate insulating layer 408, whereby a structure in which the channel of the transistor is provided in a region that is not in contact with the gate insulating layer 408 is obtained.

Further, since the oxide semiconductor layer 404a contains one or more metal elements contained in the oxide semiconductor layer 404b, an interface state is unlikely to be formed at the interface between the oxide semiconductor layer 404b and the oxide semiconductor layer 404a, compared with the interface between the oxide semiconductor layer 404b and the base insulating layer 402 on the assumption that the oxide semiconductor layer 404b is in contact with the base insulating layer 402. The interface state sometimes forms a channel, leading to a change in the threshold voltage of the transistor. Thus, with the oxide semiconductor layer 404a, a variation in the electrical characteristics of the transistor, such as threshold voltage, can be reduced. Further, the reliability of the transistor can be improved.

Furthermore, since the oxide semiconductor layer 404c contains one or more metal elements contained in the oxide semiconductor layer 404b, scattering of carriers is unlikely to occur at the interface between the oxide semiconductor layer 404b and the oxide semiconductor layer 404c, compared with the interface between the oxide semiconductor layer 404b and the gate insulating layer 408 on the assumption that the oxide semiconductor layer 404b is in contact with the gate insulating layer 408. Thus, with the oxide semiconductor layer 404c, the field-effect mobility of the transistor can be increased.

For the oxide semiconductor layer 404a and the oxide semiconductor layer 404c, for example, a material containing Al, Ti, Ga, Ge, Y, Zr, Sn, La, Ce, or Hf with a higher atomic ratio than that used for the oxide semiconductor layer 404b can be used. Specifically, an atomic ratio of any of the above metal elements in the oxide semiconductor layer 404a and the oxide semiconductor layer 404c is 1.5 times or more, preferably 2 times or more, further preferably 3 times or more as much as that in the oxide semiconductor layer 404b. Any of the above metal elements is strongly bonded to oxygen and thus has a function of suppressing generation of an oxygen vacancy in the oxide semiconductor layer 404a and the oxide semiconductor layer 404c. That is, an oxygen vacancy is less likely to be generated in the oxide semiconductor layer 404a and the oxide semiconductor layer 404c than in the oxide semiconductor layer 404b.

Note that when each of the oxide semiconductor layer 404a, the oxide semiconductor layer 404b, and the oxide semiconductor layer 404c is an In-M-Zn oxide containing at least indium, zinc, and M (M is a metal such as Al, Ti, Ga, Ge, Y, Zr, Sn, La, Ce, or Hf), and when the oxide semiconductor layer 404a has an atomic ratio of In to M and Zn which is $x_1:y_1:z_1$, the oxide semiconductor layer 404b has an atomic ratio of In to M and Zn which is $x_2:y_2:z_2$, and the oxide semiconductor layer 404c has an atomic ratio of In to M and Zn which is $x_3:y_3:z_3$, $y_1/x_1$ and $y_3/x_3$ is each preferably larger than $y_2/x_2$. $Y_1/x_1$ and $y_3/x_3$ is each 1.5 times or more, preferably 2 times or more, further preferably 3 times or more as large as $y_2/x_2$. At this time, when $y_2$ is greater than or equal to $x_2$ in the oxide semiconductor layer 404b, the transistor can have stable electrical characteristics. However, when $y_2$ is 3 times or more as large as $x_2$, the field-effect mobility of the transistor is reduced; accordingly, $y_2$ is preferably less than 3 times $x_2$.

In the case where Zn and O are not taken into consideration, the proportion of In and the proportion of M in the oxide semiconductor layer 404a and the oxide semiconductor layer 404c are preferably less than 50 atomic % and greater than or equal to 50 atomic %, respectively, and further preferably less than 25 atomic % and greater than or equal to 75 atomic %, respectively. In the case where Zn and O are not taken into consideration, the proportion of In and the proportion of M in the oxide semiconductor layer 404b are preferably greater than or equal to 25 atomic % and less than 75 atomic %, respectively, further preferably greater than or equal to 34 atomic % and less than 66 atomic %, respectively.

The thicknesses of the oxide semiconductor layer 404a and the oxide semiconductor layer 404c are each greater than or equal to 3 nm and less than or equal to 100 nm, preferably greater than or equal to 3 nm and less than or equal to 50 nm. The thickness of the oxide semiconductor layer 404b is greater than or equal to 3 nm and less than or equal to 200 nm, preferably greater than or equal to 3 nm and less than or equal to 100 nm, further preferably greater than or equal to 3 nm and less than or equal to 50 nm. In addition, the oxide semiconductor layer 404b is preferably thicker than the oxide semiconductor layer 404a and the oxide semiconductor layer 404c.

For the oxide semiconductor layer 404a, the oxide semiconductor layer 404b, and the oxide semiconductor layer 404c, an oxide semiconductor containing indium, zinc, and gallium can be used, for example. Note that the oxide semiconductor layer 404b preferably contains indium because carrier mobility can be increased.

Note that stable electrical characteristics can be effectively imparted to a transistor using an oxide semiconductor layer, by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level might become a trap, so that the electrical characteristics of the transistor might deteriorate. Accordingly, in the oxide semiconductor layer 404a, the oxide semiconductor layer 404b, and the oxide semiconductor layer 404c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is preferably lower than $1\times10^{19}$ atoms/cm$^3$, further preferably lower than $5\times10^{18}$ atoms/cm$^3$, still further preferably lower than $1\times10^{18}$ atoms/cm$^3$. Further, the concentration of hydrogen at a certain depth of the oxide semiconductor layer or in a region of the oxide semiconductor layer is preferably lower than or equal to $2\times10^{20}$ atoms/cm$^3$, further preferably lower than or equal to $5\times10^{19}$ atoms/cm$^3$, still further preferably lower than or equal to $1\times10^{19}$ atoms/cm$^3$, yet still further preferably lower than or equal to $5\times10^{18}$ atoms/cm$^3$. Further, the concentration of nitrogen at a certain depth of the oxide semiconductor layer or in a region of the oxide semiconductor layer is preferably lower than $5\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{19}$ atoms/cm$^3$. Further, the concentration of carbon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which the above-described highly purified oxide semiconductor layer is used for a channel formation region has an extremely low off-state current. In the case where the voltage between a source and a drain is set at about 0.1 V, 5 V, or 10 V, for example, the off-state current standardized on the channel width of the transistor can be as low as several yoctoamperes per micrometer to several zeptoamperes per micrometer.

Next, the band structure of the multilayer semiconductor layer 404 is described. For analyzing the band structure, a stacked film corresponding to the multilayer semiconductor layer 404 is formed. In the stacked film, In—Ga—Zn oxide with an energy gap of 3.5 eV is used for layers corresponding to the oxide semiconductor layer 404a and the oxide semiconductor layer 404c, and In—Ga—Zn oxide with an energy gap of 3.15 eV is used for a layer corresponding to the oxide semiconductor layer 404b.

The thickness of each of the oxide semiconductor layer 404a, the oxide semiconductor layer 404b, and the oxide semiconductor layer 404c was 10 nm. The energy gap was measured with the use of a spectroscopic ellipsometer (UT-300 manufactured by HORIBA Jobin Yvon). Further, the energy difference between the vacuum level and the valence band maximum was measured using an ultraviolet photoelectron spectroscopy (UPS) device (VersaProbe, ULVAC-PHI, Inc.).

Figure 11A:
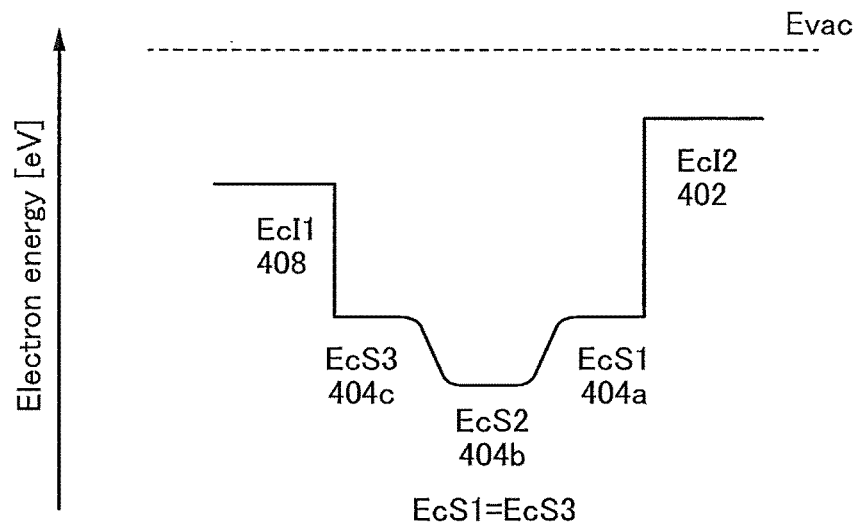
FIGS. 11A and 11B are schematic band diagrams of stacked semiconductor layers.

FIG. 11A is part of a schematic band structure showing an energy difference (electron affinity) between the vacuum level and the conduction band minimum of each layer, which is calculated by subtracting the energy gap from the energy difference between the vacuum level and the valence band maximum. FIG. 11A is a band diagram showing the case where silicon oxide layers are provided in contact with the oxide semiconductor layer 404a and the oxide semiconductor layer 404c. Here, Evac represents energy of the vacuum level, EcI1 represents the conduction band minimum of the gate insulating layer 408 (e.g., hafnium oxide), EcS1 represents the conduction band minimum of the oxide semiconductor layer 404a, EcS2 represents the conduction band minimum of the oxide semiconductor layer 404b, EcS3 represents the conduction band minimum of the oxide semiconductor layer 404c, and EcI2 represents the conduction band minimum of the base insulating layer 402 (e.g., silicon oxide).

As shown in FIG. 11A, the conduction band minimum continuously varies among the oxide semiconductor layer 404a, the oxide semiconductor layer 404b, and the oxide semiconductor layer 404c. This can be understood also from the fact that the constituent elements are common among the oxide semiconductor layer 404a, the oxide semiconductor layer 404b, and the oxide semiconductor layer 404c and oxygen is easily diffused among the oxide semiconductor layers 404a to 404c. Accordingly, the oxide semiconductor layer 404a, the oxide semiconductor layer 404b, and the oxide semiconductor layer 404c have a continuous physical property although they have different compositions in a stack.

The multilayer semiconductor layer 404 in which layers containing the same main components are stacked is formed to have not only a simple stacked-layer structure of the layers but also a continuous energy band (here, in particular, a well structure having a U shape in which the conduction band minimum continuously varies among the layers (U-shape well)). In other words, the stacked-layer structure is formed such that there exist no impurities that form a defect level such as a trap center or a recombination center at each interface. If impurities exist between the stacked layers in the multilayer semiconductor layer, the continuity of the energy band is lost and carriers at the interface disappear by a trap or recombination.

Note that FIG. 11A shows the case where EcS1 and EcS3 are equal to each other; however, EcS1 and EcS3 may be different from each other. For example, part of the band structure in the case where EcS1 is higher than EcS3 is shown in FIG. 11B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the oxide semiconductor layer 404a and the oxide semiconductor layer 404c and an In—Ga—Zn oxide whose atomic ratio of In to Ga and Zn is 1:1:1 or 3:1:2 can be used for the oxide semiconductor layer 404b. Further, when EcS1 is higher than EcS3, an In—Ga—Zn oxide whose atomic ratio of In to Ga and Zn is 1:6:4 or 1:9:6 can be used for the oxide semiconductor layer 404a, an In—Ga—Zn oxide whose atomic ratio of In to Ga and Zn is 1:1:1 or 3:1:2 can be used for the oxide semiconductor layer 404b, and an In—Ga—Zn oxide whose atomic ratio of In to Ga and Zn is 1:3:2, 1:3:3, or 1:3:4 can be used for the oxide semiconductor layer 404c, for example.

Figure 11B:
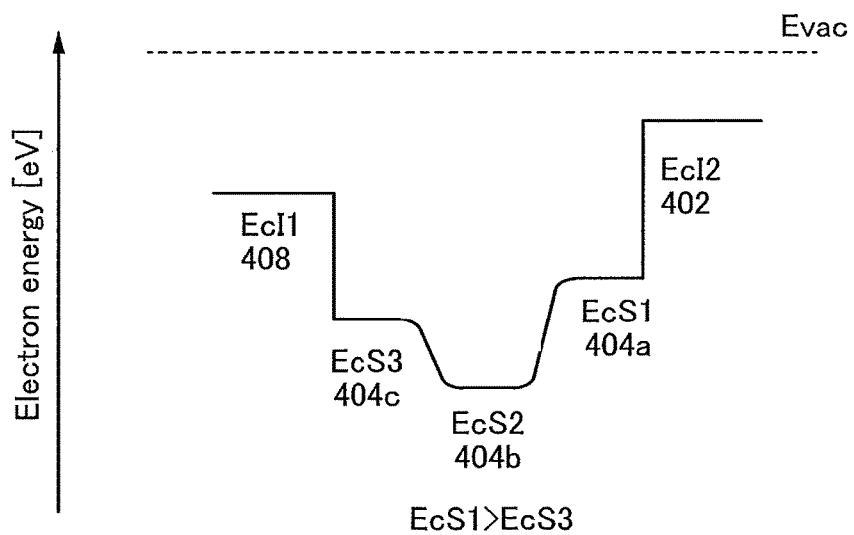

According to FIGS. 11A and 11B, the oxide semiconductor layer 404b of the multilayer semiconductor layer 404 serves as a well, so that a channel is formed in the oxide semiconductor layer 404b in a transistor including the multilayer semiconductor layer 404. Note that since the conduction band minimum continuously varies, the multilayer semiconductor layer 404 can also be referred to as a U-shaped well. Further, a channel formed to have such a structure can also be referred to as a buried channel.

Note that trap levels due to impurities or defects might be formed in the vicinity of the interface between the oxide semiconductor layer 404a and an insulating layer having a largely different electron affinity from the oxide semiconductor layer 404a and between the oxide semiconductor layer 404c and an insulating layer having a largely different electron affinity from the oxide semiconductor layer 404c. The oxide semiconductor layer 404b can be distanced away from the trap levels owing to existence of the oxide semiconductor layer 404a and the oxide semiconductor layer 404c. However, when the energy differences between EcS2 and EcS1 and between EcS2 and EcS3 are small, an electron in the oxide semiconductor layer 404b might reach the trap levels by passing over the energy differences. When the electron is trapped in the trap levels, negative fixed charges are generated at the interface with the insulating layers, whereby the threshold voltage of the transistor shifts in the positive direction.

Thus, to reduce a variation in the threshold voltage of the transistor, energy differences between EcS2 and each of EcS1 and EcS3 are necessary. Each of the energy differences is preferably greater than or equal to 0.1 eV, further preferably greater than or equal to 0.15 eV.

The oxide semiconductor layer 404a, the oxide semiconductor layer 404b, and the oxide semiconductor layer 404c preferably include crystal parts. In particular, when a crystal in which c-axes are aligned is used, the transistor can have stable electrical characteristics.

In the case where an In—Ga—Zn oxide is used for the multilayer semiconductor layer 404, it is preferable that the oxide semiconductor layer 404c contain less In than the oxide semiconductor layer 404b so that diffusion of In to the gate insulating layer is prevented.

For the source electrode 406a and the drain electrode 406b, a conductive material that can be bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material that can be bonded to oxygen includes, in its category, a material to which oxygen is easily diffused.

When the conductive material that can be bonded to oxygen is in contact with a multilayer semiconductor layer, a phenomenon occurs in which oxygen in the multilayer semiconductor layer is diffused to the conductive material that can be bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer semiconductor layer and is in contact with the source electrode or the drain electrode. The oxygen vacancies bond to hydrogen that is slightly contained in the layer, whereby the region is changed to an n-type region. Thus, the n-type region can serve as a source or a drain of the transistor.

In the case of forming a transistor with an extremely short channel length, an n-type region which is formed by the generation of oxygen vacancies might extend in the channel length direction of the transistor, causing a short circuit. In that case, the electrical characteristics of the transistor change; for example, the threshold voltage shifts to cause a state in which on and off states of the transistor cannot be controlled with the gate voltage in practical use (conduction state). Accordingly, when a transistor with an extremely short channel length is formed, it is not always preferable that a conductive material that can be bonded to oxygen be used for a source electrode and a drain electrode.

In such a case, a conductive material which is less likely to be bonded to oxygen than the above material is preferably used for the source electrode 406a and the drain electrode 406b. As the conductive material which is not easily bonded to oxygen, for example, a material containing tantalum nitride, titanium nitride, or ruthenium or the like can be used. Note that in the case where the conductive material is in contact with the oxide semiconductor layer 404b, the source electrode 406a and the drain electrode 406b may each have a structure in which the conductive material which is not easily bonded to oxygen and the above-described conductive material that can be bonded to oxygen are stacked.

The base insulating layer 402 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The gate insulating layer 408 can be formed using an insulating layer containing one or more of hafnium oxide, aluminum oxide, aluminum silicate, and the like. Note that the thickness of the gate insulating layer is more than or equal to 1 nm and less than or equal to 100 nm, preferably more than or equal to 10 nm and less than or equal to 20 nm.

For the gate electrode 410, a conductive layer formed using Al, Ti, Cr, Co, Ni, Cu, Y, Zr, Mo, Ru, Ag, Ta, W, or the like can be used. The gate electrode may be a stack including any of the above materials. Alternatively, a conductive layer containing nitrogen may be used for the gate electrode 410. For example, the gate electrode 410 can be a stack in which a tungsten layer is formed over a titanium nitride layer, a stack in which a tungsten layer is formed over a tungsten nitride layer, or a stack in which a tungsten layer is formed over a tantalum nitride layer.

The oxide insulating layer 412 may be formed over the gate insulating layer 408 and the gate electrode 410. The oxide insulating layer 412 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The oxide insulating layer 412 may be a stack including any of the above materials.

Here, the oxide insulating layer 412 preferably contains excess oxygen. An oxide insulating layer containing excess oxygen refers to an oxide insulating layer from which oxygen can be released by heat treatment or the like. The oxide insulating layer containing excess oxygen is preferably a layer in which the amount of released oxygen when converted into oxygen atoms is $1.0 \times 10^{19}$ atoms/cm$^3$ or more in thermal desorption spectroscopy analysis. Note that the substrate temperature in the thermal desorption spectroscopy analysis is preferably higher than or equal to 100° C. and lower than or equal to 700° C., or higher than or equal to 100° C. and lower than or equal to 500° C. Oxygen released from the oxide insulating layer can be diffused to the channel formation region in the multilayer semiconductor layer 404 through the gate insulating layer 408, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. A decrease in channel width causes a reduction in on-state current.

In contrast, in the transistor of one embodiment of the present invention, as described above, the oxide semiconductor layer 404c is formed to cover a channel formation region of the oxide semiconductor layer 404b, so that the channel formation region is not in contact with the gate insulating layer. Accordingly, scattering of carriers at the interface between the channel formation region and the gate insulating layer can be reduced and the on-state current of the transistor can be increased.

When the oxide semiconductor layer is formed to be intrinsic or substantially intrinsic, the field-effect mobility might be reduced because of a decrease in the number of carriers contained in the oxide semiconductor layer. However, in the transistor of one embodiment of the present invention, a gate electric field is applied to the oxide semiconductor layer in the side surface direction in addition to the perpendicular direction. That is, the gate electric field is applied to the whole region of the oxide semiconductor layer, whereby current flows in the bulk of the oxide semiconductor layer. Consequently, a change in the electrical characteristics can be suppressed owing to the highly purified intrinsic oxide semiconductor layer and the field-effect mobility of the transistor can be increased.

In the transistor of one embodiment of the present invention, the oxide semiconductor layer 404b is formed over the oxide semiconductor layer 404a, so that an interface state is less likely to be formed. In addition, impurities do not enter the oxide semiconductor layer 404b from above and below because the oxide semiconductor layer 404b is an intermediate layer in a three-layer structure. With the structure in which the oxide semiconductor layer 404b is surrounded by the oxide semiconductor layer 404a and the oxide semiconductor layer 404c, on-state current of the transistor is increased as described above, and in addition, threshold voltage can be stabilized and an S value can be reduced. Thus, Icut can be reduced and power consumption can be reduced. Further, the threshold voltage of the transistor becomes stable; thus, long-term reliability of the semiconductor device can be improved.

Figure 12A:
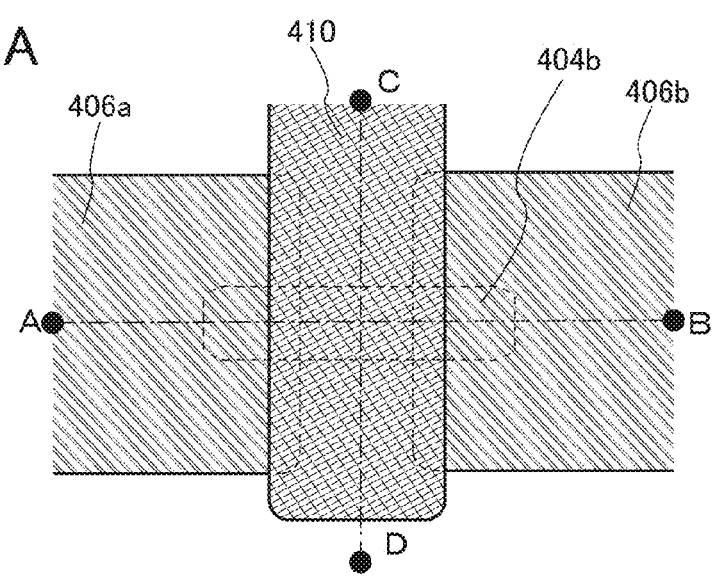
FIGS. 12A to 12C are a top view and cross-sectional views of a transistor.
Figure 12B:
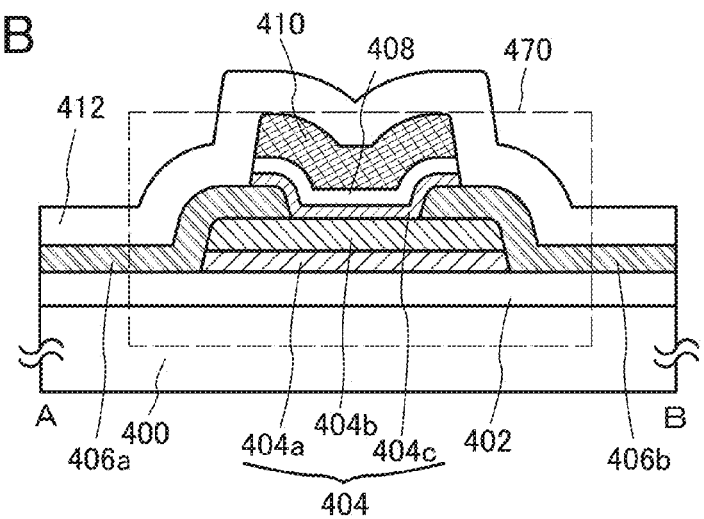
Figure 12C:
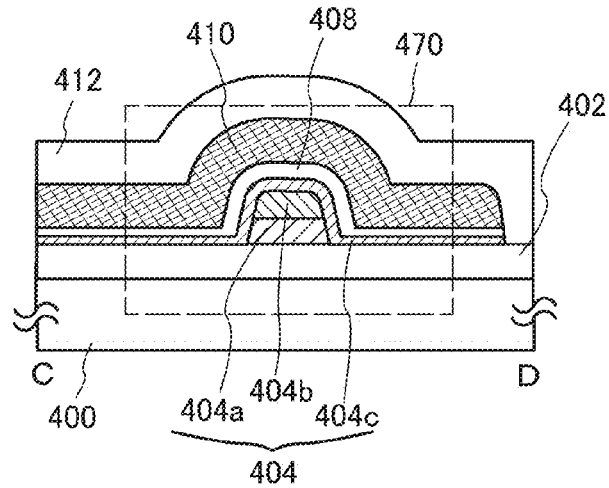

A transistor 470 illustrated in FIGS. 12A to 12C can be used. FIGS. 12A to 12C are a top view and cross-sectional views which illustrate the transistor 470. FIG. 12A is the top view. FIG. 12B illustrates a cross section taken along the dashed-dotted line A-B in FIG. 12A. FIG. 12C illustrates a cross section taken along the dashed-dotted line C-D in FIG. 12A. Note that for simplification of the drawing, some components are not illustrated in the top view in FIG. 12A.

In the transistor 470, the base insulating layer 402 is not etched when the source electrode 406a and the drain electrode 406b are formed.

To prevent the base insulating layer 402 from being etched by overetching, the etching rate of the base insulating layer 402 is preferably set sufficiently lower than the etching rate of a conductive layer to be processed into the source electrode 406a and the drain electrode 406b.

In this embodiment, although the oxide semiconductor layer 404b is sandwiched between the oxide semiconductor layer 404a and the oxide semiconductor layer 404c, without limited to this structure, one embodiment of the present invention may have a structure in which only the oxide semiconductor layer 404b is provided without the oxide semiconductor layer 404a and the oxide semiconductor layer 404c and is electrically covered with the gate electrode.

Although electrons are trapped in electron trap states existing inside the electron trap layer here, the electron trap states can be replaced by conductive minute regions that are described in Embodiment 1.

This embodiment can be implemented in combination with any of the other embodiments disclosed in this specification as appropriate.

(Embodiment 3)

In this embodiment, a method for forming the transistor 450, which is described in Embodiment 2 with reference to FIGS. 9A to 9C, is described with reference to FIGS. 13A to 13C and FIGS. 14A to 14C.

Figure 13A:
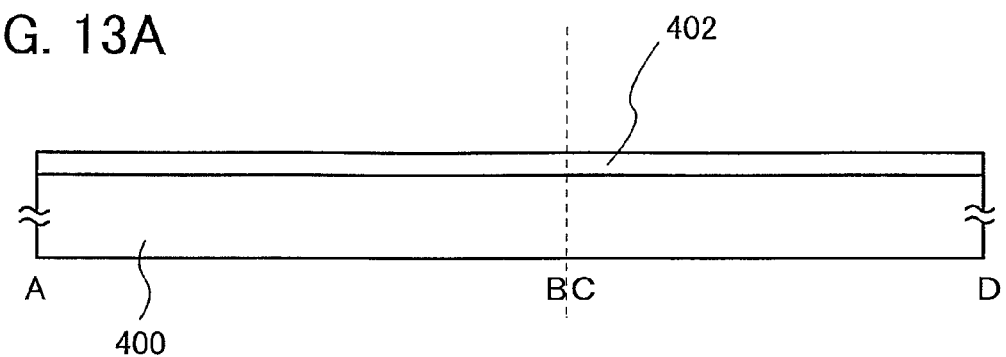
FIGS. 13A to 13C illustrate a method for manufacturing a transistor.

First, the base insulating layer 402 is formed over the substrate 400 (see FIG. 13A).

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Any of these substrates further provided with a semiconductor element thereover may be used.

The base insulating layer 402 can be formed using an oxide insulating layer of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating layer of silicon nitride, silicon nitride oxide, aluminum nitride, aluminum nitride oxide, or the like; or a layer including a mixture of the above-described materials, by a plasma CVD method or a sputtering method. Alternatively, a stacked-layer structure including any of the above materials may be used, and at least an upper layer of the base insulating layer 402 that is in contact with the multilayer semiconductor layer 404 is preferably formed using a material containing excess oxygen that might serve as a supply source of oxygen to the multilayer semiconductor layer 404.

Oxygen may be added to the base insulating layer 402 by an ion implantation method, an ion doping method, a plasma immersion ion implantation method, or the like. Addition of oxygen enables the base insulating layer 402 to supply oxygen much easily to the multilayer semiconductor layer 404.

In the case where a surface of the substrate 400 is made of an insulator and there is no influence of impurity diffusion to the multilayer semiconductor layer 404 to be formed later, a structure without the base insulating layer 402 may be employed.

Figure 13B:
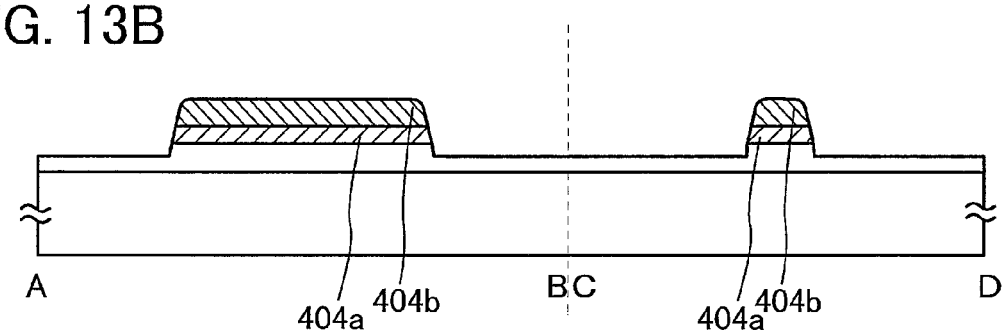

Next, the oxide semiconductor layers 404a and 404b are formed over the base insulating layer 402 by sputtering, CVD, MBE, ALD, or PLD (see FIG. 13B). At this time, as illustrated, the base insulating layer 402 can be slightly over-etched. By over-etching of the base insulating layer 402, the gate electrode 410 to be formed later can cover the oxide semiconductor layer 404c easily.

For processing the oxide semiconductor layer 404a and the oxide semiconductor layer 404b into island shapes, a layer to be a hard mask (e.g., a tungsten layer) and a resist mask are provided over the oxide semiconductor layer 404b, and the layer to be a hard mask is etched to form a hard mask. The resist mask is removed and then the oxide semiconductor layer 404a and the oxide semiconductor layer 404b are etched using the hard mask as a mask. Then, the hard mask is removed. At this step, the hard mask is gradually reduced as the etching progresses; as a result, the edges of the hard mask is rounded to have a curved surface. Accordingly, the upper end portion of the oxide semiconductor layer 404b is rounded to have a curved surface. This structure improves the coverage with the oxide semiconductor layer 404c, the gate insulating layer 408, the gate electrode 410, and the oxide insulating layer 412, which are to be formed over the oxide semiconductor layer 404b, and can prevent shape defects such as disconnection. In addition, electric field concentration which might occur at end portions of the source electrode 406a and the drain electrode 406b can be reduced, which can reduce deterioration of the transistor.

In order to form a continuous junction in stacked layers including the oxide semiconductor layers 404a and 404b, or stacked layers also including the oxide semiconductor layer 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to about $5\times10^{-7}$ Pa to $1\times10^{-4}$ Pa) by an adsorption vacuum pump such as a cryopump and that the chamber be able to heat a substrate to 100° C. or higher, preferably 500° C. or higher so that water and the like acting as impurities for the oxide semiconductor can be removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also increasing the purity of a sputtering gas is necessary to obtain a high-purity intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor layer can be prevented as much as possible.

The materials described in Embodiment 2 can be used for the oxide semiconductor layer 404a, the oxide semiconductor layer 404b, and the oxide semiconductor layer 404c that is to be formed in a later step. For example, an In—Ga—Zn oxide whose atomic ratio of In to Ga and Zn is 1:3:4 or 1:3:2 can be used for the oxide semiconductor layer 404a, an In—Ga—Zn oxide whose atomic ratio of In to Ga and Zn is 1:1:1 can be used for the oxide semiconductor layer 404b, and an In—Ga—Zn oxide whose atomic ratio of In to Ga and Zn is 1:3:4 or 1:3:2 can be used for the oxide semiconductor layer 404c.

An oxide semiconductor that can be used for each of the oxide semiconductor layers 404a, 404b, and 404c preferably contains at least indium (In) or zinc (Zn). Both In and Zn are preferably contained. Furthermore, in order to reduce variations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like are used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a layer containing the In—Ga—Zn oxide is also referred to as an IGZO layer.

A material represented by $InMO_3(ZnO)_m$ (m>0 is satisfied, and m is not an integer) may be used. Note that M represents one or more metal elements selected from Ga, Fe, Mn, or Co. A material represented by $In_2SnO_5(ZnO)_n$ (n>0, n is an integer) may be used.

Note that as described in Embodiment 2 in detail, materials are selected so that the oxide semiconductor layers 404a and 404c each have an electron affinity lower than that of the oxide semiconductor layer 404b.

Note that the oxide semiconductor layer is preferably formed by a sputtering method. As a sputtering method, an RF sputtering method, a DC sputtering method, an AC sputtering method, or the like can be used. In particular, a DC sputtering method is preferably used because dust generated in the film formation can be reduced and the film thickness can be uniform.

When In—Ga—Zn oxide is used for the oxide semiconductor layers 404a, 404b, and 404c, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used so that the oxide semiconductor layers 404a and 404c each have an electron affinity lower than that of the oxide semiconductor layer 404b.

Note that the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2 (b-B)^2+(c-C)^2 \leq r^2$, and r may be 0.05, for example. The same applies to other oxides.

The indium content in the oxide semiconductor layer 404b is preferably higher than those in the oxide semiconductor layers 404a and 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the oxide semiconductor layer 404b, a transistor having high mobility can be achieved.

Here, a structure of an oxide semiconductor layer will be described.

In this specification, a term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor layer is classified roughly into a non-single-crystal oxide semiconductor layer and a single crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First of all, a CAAC-OS layer is described.

The CAAC-OS layer is an oxide semiconductor layer including a plurality of crystal parts. Most of the crystal parts each fit inside a cube whose one side is less than 100 nm. Thus, the CAAC-OS layer may include a crystal part that fits inside a cube whose one side is less than 10 nm, less than 5 nm, or less than 3 nm.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is unlikely to occur.

In the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

In the TEM image of the CAAC-OS layer observed in a direction substantially perpendicular to the sample surface (plan TEM image), metal atoms are arranged in a triangular or hexagonal configuration in the crystal parts. However, there is no regularity in arrangement of metal atoms between different crystal parts.

From the cross-sectional TEM image and the plan TEM image, orientation characteristics are found in the crystal parts in the CAAC-OS layer.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

When the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Analysis (φ scan) is performed under conditions where the sample is rotated around a normal vector of the sample surface as an axis (φ axis) with 2θ fixed at around 56°. When the sample is a single-crystal oxide semiconductor layer of InGaZnO$_4$, six peaks appear. The six peaks are derived from crystal planes equivalent to the (110) plane. In contrast, when the sample is the CAAC-OS layer, a peak is not clearly observed.

The above results mean that in the CAAC-OS layer having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is oriented in a direction parallel to a normal vector of a formation surface or a normal vector of a top surface. Thus, for example, when the shape of the CAAC-OS layer is changed by etching or the like, the c-axis might not be necessarily parallel to a normal vector of a formation surface or a normal vector of a top surface of the CAAC-OS layer.

Furthermore, the degree of crystallinity in the CAAC-OS layer is not necessarily uniform. For example, if crystal growth leading to the CAAC-OS layer occurs from the vicinity of the top surface of the layer, the degree of the crystallinity in the vicinity of the top surface may be higher than that in the vicinity of the formation surface. Moreover, when an impurity is added to the CAAC-OS layer, the crystallinity in a region to which the impurity is added is changed, and the degree of crystallinity in the CAAC-OS layer varies depending on regions.

Note that when the CAAC-OS layer with an InGaZnO$_4$ crystal is analyzed by an out-of-plane method, a peak of 2θ may be observed at around 36°, in addition to the peak of 2θ at around 31°. The peak of 2θ at around 36° indicates that a crystal having no c-axis alignment is included in part of the CAAC-OS layer. It is preferable that a peak of 2θ appears at around 31° and a peak of 2θ do not appear at around 36°.

The CAAC-OS layer is an oxide semiconductor layer having low impurity concentration. The impurity is an element other than the main components of the oxide semiconductor layer, such as hydrogen, carbon, silicon, or a transition metal element. In particular, an element that has higher bonding strength to oxygen than a metal element included in the oxide semiconductor layer, such as silicon, disturbs the atomic arrangement of the oxide semiconductor layer by depriving the oxide semiconductor layer of oxygen and causes a decrease in crystallinity. A heavy metal such as iron or nickel, argon, carbon dioxide, or the like has a large atomic radius (molecular radius), and thus disturbs the atomic arrangement of the oxide semiconductor layer and causes a decrease in crystallinity if contained in the oxide semiconductor layer. Note that the impurity contained in the oxide semiconductor layer might serve as a carrier trap or a carrier generation source.

The CAAC-OS layer is an oxide semiconductor layer having a low density of defect states. Oxygen vacancies in the oxide semiconductor layer may serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor layer has few carrier generation sources, and thus can have a low carrier density. Thus, a transistor including the oxide semiconductor layer rarely has negative threshold voltage (is rarely normally on). The highly purified intrinsic or substantially highly purified intrinsic oxide semiconductor layer has few carrier traps. Accordingly, the transistor including the oxide semiconductor layer has little variation in electrical characteristics and high reliability. Electric charge trapped by the carrier traps in the oxide semiconductor layer takes a long time to be released, and thus may behave like fixed electric charge. Accordingly, the transistor which includes the oxide semiconductor layer having high impurity concentration and a high density of defect states can have unstable electrical characteristics.

In a transistor using the CAAC-OS layer, change in electrical characteristics due to irradiation with visible light or ultraviolet light is small.

Next, a microcrystalline oxide semiconductor layer will be described.

In a TEM image, crystal parts cannot be found clearly in the microcrystalline oxide semiconductor layer in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In a TEM image of the nc-OS layer, for example, a crystal grain boundary cannot clearly found in some cases.

In the nc-OS layer, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS layer. Thus, the orientation of the whole layer is not observed. Accordingly, the nc-OS layer sometimes cannot be distinguished from an amorphous oxide semiconductor layer depending on an analysis method. For example, when the nc-OS layer is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS layer obtained by using an electron beam having a probe diameter (e.g., greater than or equal to 50 nm) larger than the diameter of a crystal part. Meanwhile, spots are shown in a nanobeam electron diffraction pattern of the nc-OS layer obtained by using an electron beam having a probe diameter (e.g., greater than or equal to 1 nm and smaller than or equal to 30 nm) close to, or smaller than or equal to a diameter of a crystal part. In a nanobeam electron diffraction pattern of the nc-OS layer, regions with high luminance in a circular (ring) pattern may be shown, and a plurality of spots may be shown in the ring-like region.

The nc-OS layer is an oxide semiconductor layer that has high regularity as compared with an amorphous oxide semiconductor layer. For this reason, the nc-OS layer has a lower density of defect states than an amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may be a stacked layer including two or more layers of an amorphous oxide semiconductor layer, a microcrystalline oxide semiconductor layer, and a CAAC-OS layer, for example.

For example, the CAAC-OS layer can be deposited by a sputtering method using a polycrystalline oxide semiconductor sputtering target. When ions collide with the sputtering target, a crystal region included in the sputtering target is sometimes separated from the target along an a-b plane; in other words, a sputtered particle having a plane parallel to an a-b plane (flat-plate-like sputtered particle or pellet-like sputtered particle) flakes off from the sputtering target. The flat-plate-like sputtered particle or pellet-like sputtered particle is electrically charged and thus reaches the substrate while maintaining its crystal state, without being aggregation in plasma, forming a CAAC-OS layer.

First heat treatment may be performed after the oxide semiconductor layer 404b is formed. The first heat treatment may be performed at a temperature higher than or equal to 250° C. and lower than or equal to 650° C., typically higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 404b can be improved, and in addition, impurities such as hydrogen and water can be removed from the base insulating layer 402 and the oxide semiconductor layer 404a. Note that the first heat treatment may be performed before etching for formation of the oxide semiconductor layer 404b.

A first conductive layer to be the source electrode 406a and the drain electrode 406b is formed over the oxide semiconductor layers 404a and 404b. For the first conductive layer, Al, Cr, Cu, Ta, Ti, Mo, W, or an alloy material containing any of these as a main component can be used. For example, a 100-nm-thick titanium layer is formed by a sputtering method or the like. Alternatively, a tungsten layer may be formed by a CVD method.

Figure 13C:
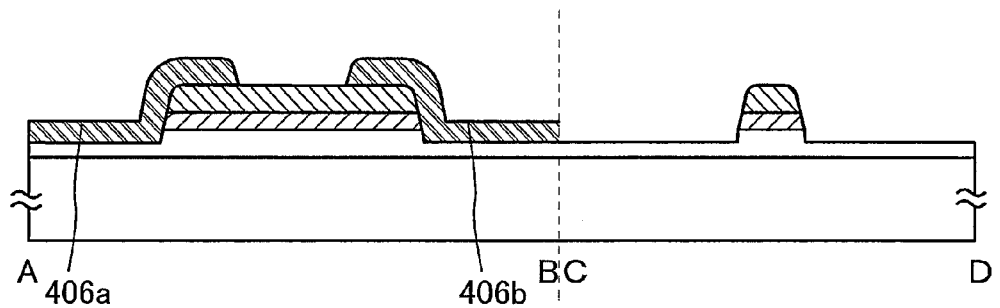

Then, the first conductive layer is etched so as to be divided over the oxide semiconductor layer 404b, so that the source electrode 406a and the drain electrode 406b are formed (see FIG. 13C).

Next, the oxide semiconductor layer 403c is formed over the oxide semiconductor layer 404b, the source electrode 406a, and the drain electrode 406b.

Note that second heat treatment may be performed after the oxide semiconductor layer 403c is formed. The second heat treatment can be performed under conditions similar to those of the first heat treatment. The second heat treatment can remove impurities such as hydrogen and water from the oxide semiconductor layer 403c. In addition, impurities such as hydrogen and water can be further removed from the oxide semiconductor layer 404a and 404b.

Figure 14A:
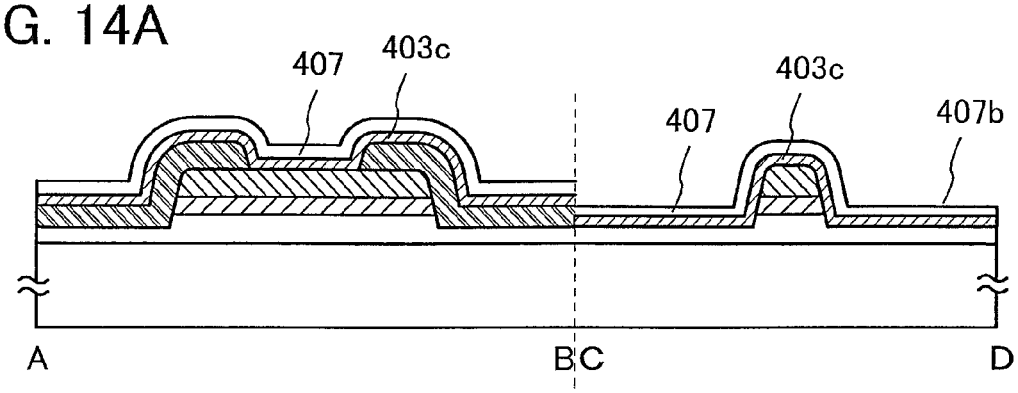
FIGS. 14A to 14C illustrate a method for manufacturing a transistor.

Next, an insulating layer 407 to be the gate insulating layer 408 is formed over the oxide semiconductor layer 403c (see FIG. 14A). The insulating layer 407 can be formed by sputtering, CVD, MBE, ALD, PLD, or the like.

Figure 14B:
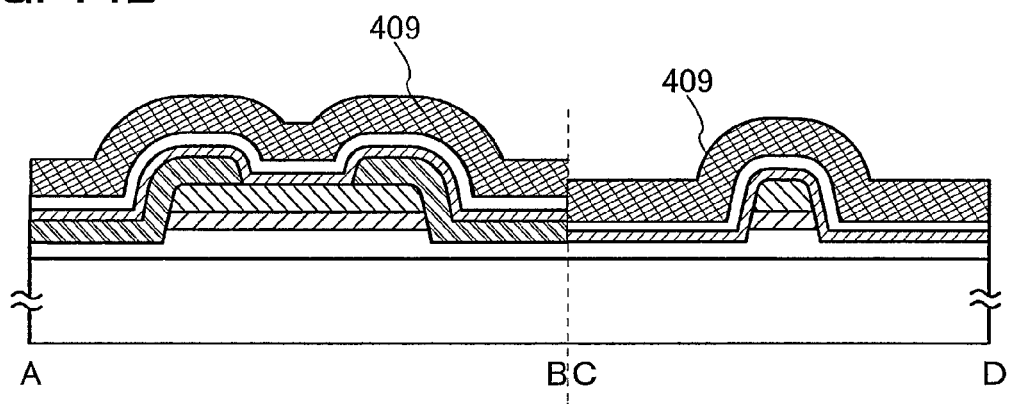

Then, a second conductive layer 409 to be the gate electrode 410 is formed over the insulating layer 407 (see FIG. 14B). For the second conductive layer 409, Al, Ti, Cr, Co, Ni, Cu, Y, Zr, Mo, Ru, Ag, Ta, W, or an alloy material containing any of these as its main component can be used.

The second conductive layer 409 can be formed by a sputtering method, a CVD method, or the like. A stack including a conductive layer containing any of the above materials and a conductive layer containing nitrogen, or a conductive layer containing nitrogen may be used for the second conductive layer 409.

Figure 14C:
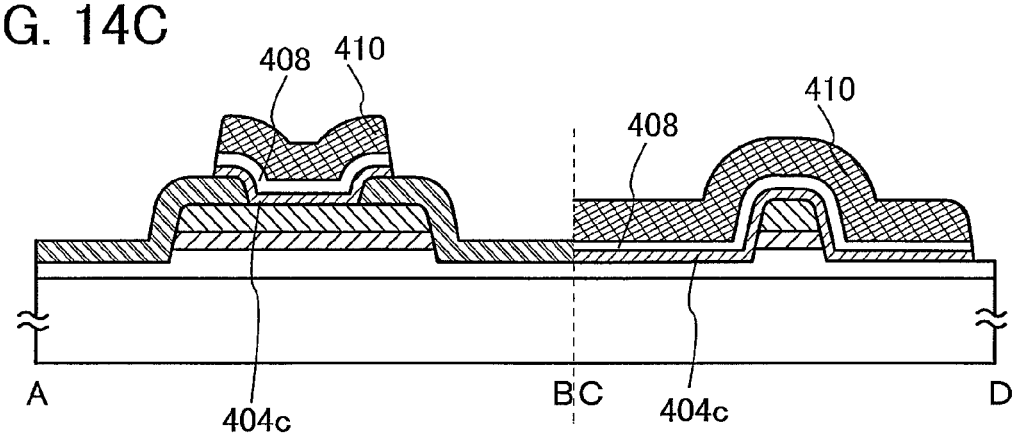

Next, the second conductive layer 409 is selectively etched using a resist mask to form the gate electrode 410 (see FIG. 14C). Note that as shown in FIG. 9C, the oxide semiconductor layer 404b is surrounded by the gate electrode 410.

Then, the insulating layer 407 is selectively etched using the resist mask or the gate electrode 410 as a mask to form the gate insulating layer 408.

Then, the oxide semiconductor layer 403c is etched using the resist mask or the gate electrode 410 as a mask to form the oxide semiconductor layer 404c.

The upper edge of the oxide semiconductor layer 404c is aligned with the bottom edge of the gate insulating layer 408. The upper edge of the gate insulating layer 408 is aligned with the bottom edge of the gate electrode 410. Although the gate insulating layer 408 and the oxide semiconductor layer 404c are formed using the gate electrode 410 as a mask, the gate insulating layer 408 and the oxide semiconductor layer 404c may be formed before the second conductive layer 409 is formed.

Next, the oxide insulating layer 412 is formed over the source electrode 406a, the drain electrode 406b, and the gate electrode 410 (see FIGS. 9B and 9C). A material and a method for the oxide insulating layer 412 can be similar to those for the base insulating layer 402. The oxide insulating layer 412 may be an aluminum oxide, a magnesium oxide, a silicon oxide, a silicon oxynitride, a silicon nitride oxide, a silicon nitride, a gallium oxide, a germanium oxide, an yttrium oxide, a zirconium oxide, a lanthanum oxide, a neodymium oxide, a hafnium oxide, a tantalum oxide, or an oxide containing nitrogen. The oxide insulating layer 412 can be formed by sputtering, CVD. MBE, ALD, or PLD. The oxide insulating layer 412 preferably contains excessive oxygen so as to be able to supply oxygen to the multilayer semiconductor layer 404.

Next, third heat treatment may be performed. The third heat treatment can be performed under conditions similar to those of the first heat treatment. By the third heat treatment, excess oxygen is easily released from the base insulating layer 402, the gate insulating layer 408, and the oxide insulating layer 412, so that oxygen vacancies in the multilayer layer 404 can be reduced.

Next, fourth heat treatment is performed. In the fourth heat treatment, the potential of the gate electrode 410 is kept higher than that of the source or drain electrode at a high temperature higher than or equal to 125° C. and lower than or equal to 450° C., preferably higher than or equal to 150° C. and lower than or equal to 300° C. for one second or longer, typically 1 minute or longer. As a result, a necessary number of electrons moves from the multilayer semiconductor layer 404 toward the gate electrode 410 and some of them are trapped by the electron trap states existing inside the gate insulating layer 408 or at the interface of the gate insulating layer 408. By adjusting the number of trapped electrons, the increase of threshold can be adjusted Through the above process, the transistor 450 illustrated in FIGS. 9A to 9C can be fabricated.

Although electrons are trapped in electron trap states existing inside the electron trap layer here, the electron trap states can be replaced by conductive minute regions that are described in Embodiment 1.

This embodiment can be implemented in combination with any of the other embodiments disclosed in this specification as appropriate.

(Embodiment 4)

In this embodiment, a planar transistor will be described.

Figure 15A:
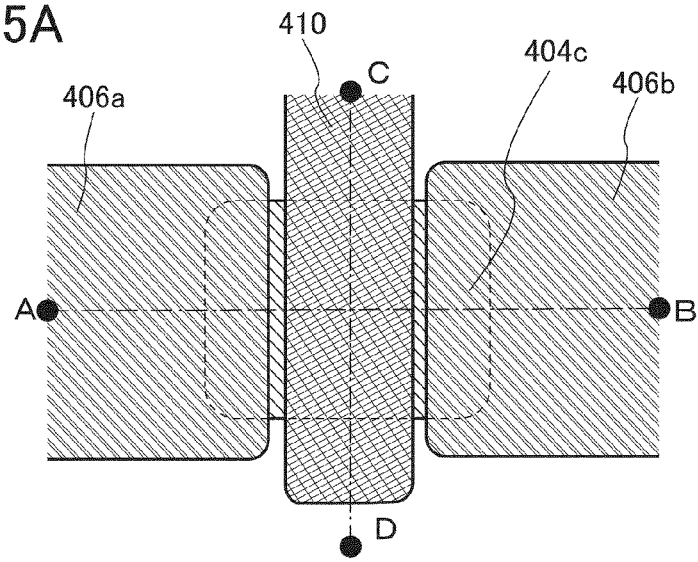
FIGS. 15A to 15C are a top view and cross-sectional views of a transistor
Figure 15B:
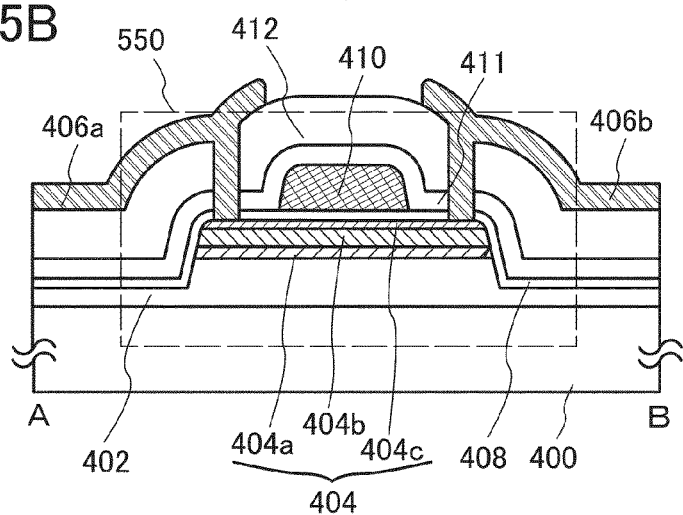
Figure 15C:
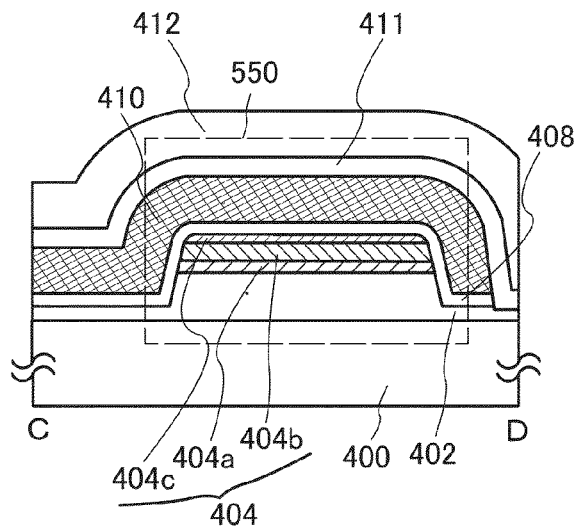

FIGS. 15A to 15C are a top view and cross-sectional views illustrating a transistor of one embodiment of the present invention. FIG. 15A is the top view, FIG. 15B illustrates a cross section taken along the dashed-dotted line A-B in FIG. 15A, and FIG. 15C illustrates a cross section taken along the dashed-dotted line C-D in FIG. 15A. Note that for drawing simplicity, some components are not illustrated in the top view of FIG. 15A. In some cases, the direction of the dashed-dotted line A-B is referred to as a channel length direction, and the direction of the dashed-dotted line C-D is referred to as a channel width direction.

A transistor 550 illustrated in FIGS. 15A to 15C includes a base insulating layer 402 over a substrate 400, an oxide semiconductor layer 404a, an oxide semiconductor layer 404b, and an oxide semiconductor layer 404c over the base insulating layer 402, a gate insulating layer 408 over the oxide semiconductor layer 404c, a gate electrode 410 over the gate insulating layer 408, an insulating layer 411 and an oxide insulating layer 412 over the gate insulating layer 408 and the gate electrode 410, and a source electrode 406a and a drain electrode 406b that are electrically connected to the oxide semiconductor layer 404c through openings provided in the insulating layer 411 and the oxide insulating layer 412. The gate insulating layer 408 functions as the electron trap layer described in Embodiment 1. The insulating layer 411 can be formed using a material similar to that of the base insulating layer 402. The oxide semiconductor layer 404a, the oxide semiconductor layer 404b, and the oxide semiconductor layer 404c are collectively referred to as a multilayer semiconductor layer 404.

Note that the channel length refers to the distance between a source (a source region, source electrode) and a drain (drain region, drain electrode) in a region where a semiconductor layer overlaps with a gate electrode in the top view. That is, the channel length in FIG. 15A is the distance between the source electrode 406a and the drain electrode 406b in the region where the oxide semiconductor layer 404b overlaps with the gate electrode 410. The channel width refers to the width of a source or a drain in a region where a semiconductor layer overlaps with a gate electrode. That is, the channel length in FIG. 15A is the width of the source electrode 406a or the drain electrode 406b in the region where the semiconductor layer 404b overlaps with the gate electrode 410.

In this embodiment, although the oxide semiconductor layer 404b is sandwiched between the oxide semiconductor layer 404a and the oxide semiconductor layer 404c, without limited to this structure, one embodiment of the present invention may have a structure in which only the oxide semiconductor layer 404b is provided without the oxide semiconductor layer 404a and the oxide semiconductor layer 404c. Alternatively, one embodiment of the present invention may have a structure in which any one or two of the oxide semiconductor layer 404a, the oxide semiconductor layer 404b, and the oxide semiconductor layer 404c is/are provided.

This embodiment can be implemented in combination with any of the other embodiments disclosed in this specification as appropriate.

(Embodiment 5)

In this embodiment, deposition models of a CAAC-OS and an nc-OS are described.

Figure 25A:
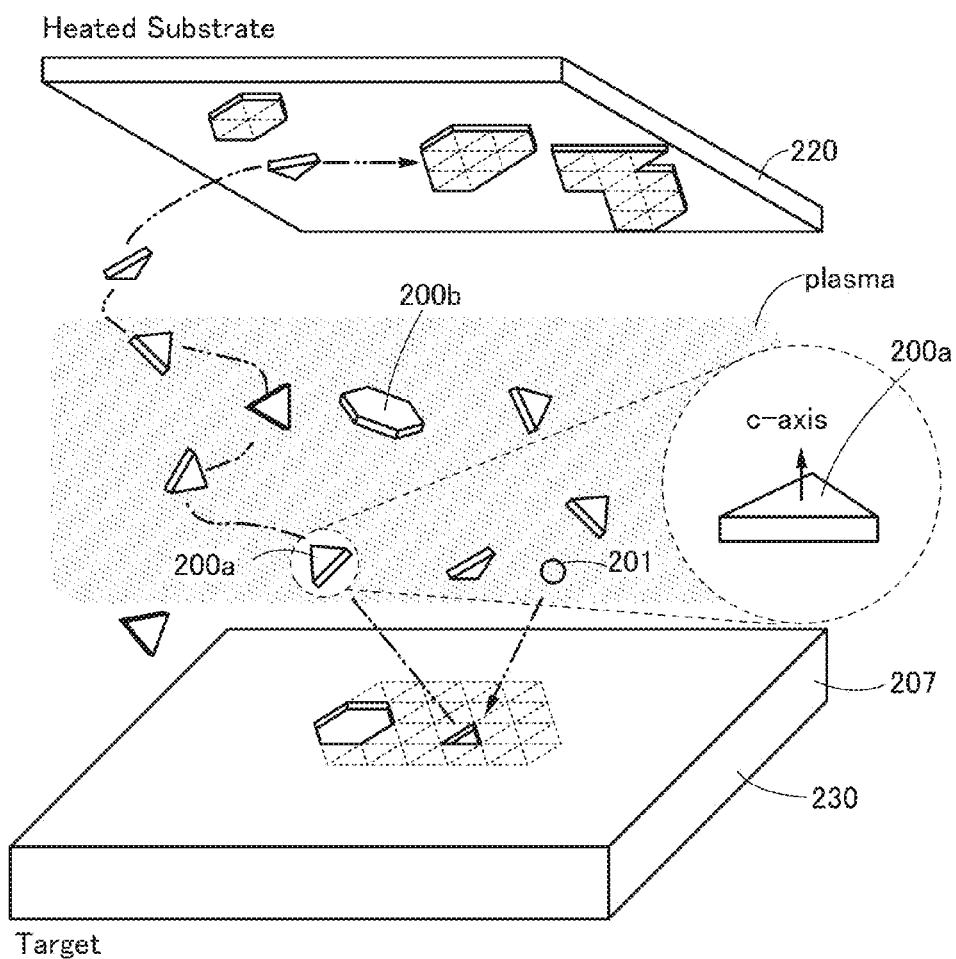
FIG. 25A schematically illustrates a CAAC-OS deposition model and FIGS. 25B and 25C are cross-sectional views of pellets and a CAAC-OS.

FIG. 25A is a schematic view of the inside of a deposition chamber where a CAAC-OS is deposited by a sputtering method.

A target 230 is attached to a backing plate. Under the target 230 and the backing plate, a plurality of magnets are provided. The plurality of magnets cause a magnetic field over the target 230. A sputtering method in which the deposition rate is increased by utilizing the magnetic field caused by the magnets is called a magnetron sputtering method.

The target 230 has a polycrystalline structure in which a cleavage plane exists in at least one crystal grain. Note that the details of the cleavage plane are described later.

A substrate 220 is placed to face the target 230, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to be higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 230, and plasma is observed. Note that the magnetic field over the target 230 forms a high-density plasma region. In the high-density plasma region, the deposition gas is ionized, so that an ion 201 is generated. Examples of the ion 201 include an oxygen cation ($O^+$) and an argon cation ($Ar^+$).

The ion 201 is accelerated toward the target 230 side by an electric field, and collides with the target 230 eventually. At this time, a pellet 200a and a pellet 200b which are flat-plate-like (pellet-like) sputtered particles are separated and sputtered from the cleavage plane. Note that structures of the pellet 200a and the pellet 200b may be distorted by an impact of collision of the ion 201.

The pellet 200a is a flat-plate-like (pellet-like) sputtered particle having a triangle plane, e.g., regular triangle plane. The pellet 200b is a flat-plate-like (pellet-like) sputtered particle having a hexagon plane, e.g., regular hexagon plane. Note that a flat-plate-like (pellet-like) sputtered particle such as the pellet 200a and the pellet 200b is collectively called a pellet 200. The shape of a flat plane of the pellet 200 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 200 is determined depending on the kind of deposition gas and the like. The thicknesses of the pellets 200 are preferably uniform; the reasons thereof are described later. In addition, it is preferable for the sputtered particle to have a pellet shape with a small thickness than a dice shape with a large thickness.

Figure 27:
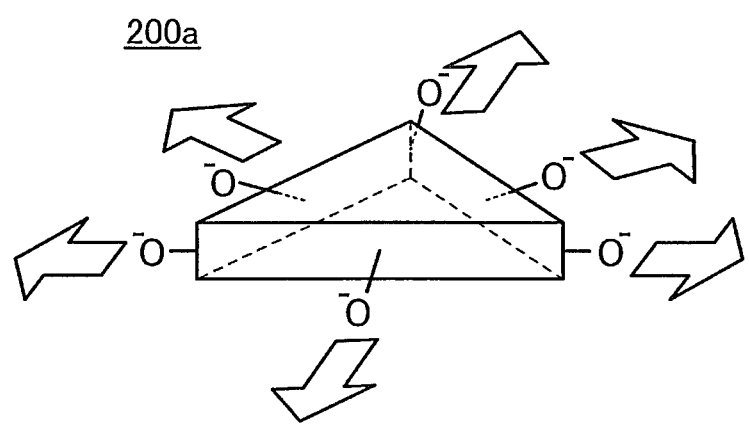
FIG. 27 illustrates a pellet.

The pellet 200 receives charge when passing through the plasma, so that side surfaces thereof are negatively or positively charged in some cases. The pellet 200 includes an oxygen atom on its side surface, and the oxygen atom may be negatively charged. For example, a case in which the pellet 200a includes, on its side surfaces, oxygen atoms that are negatively charged is illustrated in FIG. 27. As in this view, when the side surfaces are charged in the same polarity, charges repel each other, and accordingly, the pellet 200a can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged.

Figure 28:
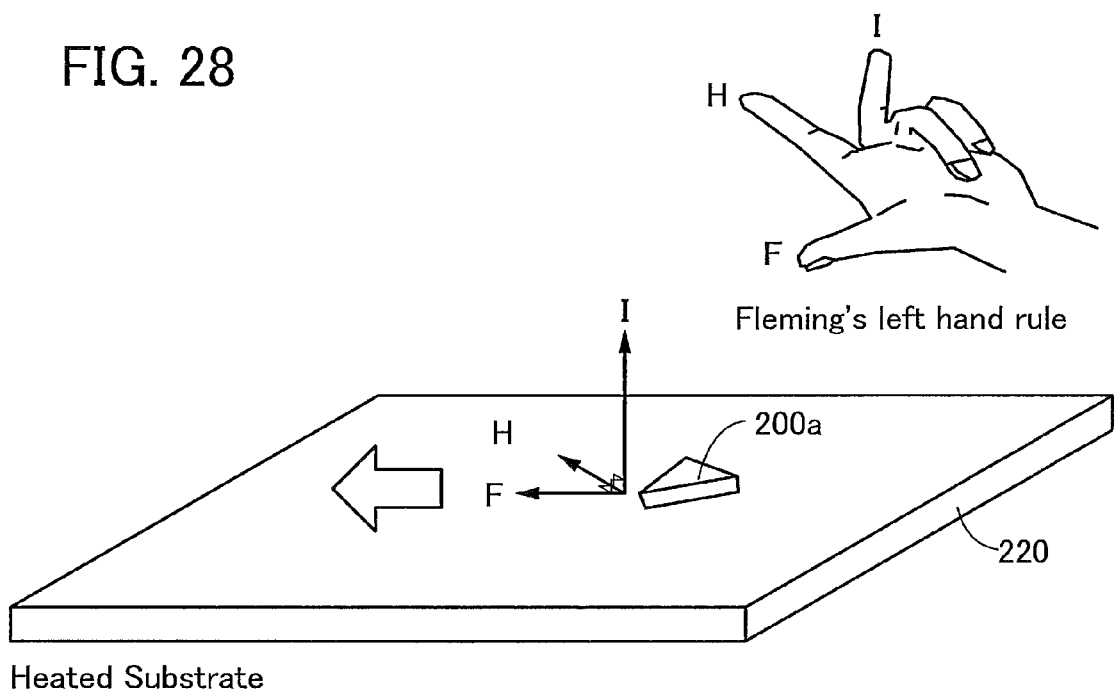
FIG. 28 illustrates force applied to a pellet on a formation surface.

As illustrated in FIG. 25A, the pellet 200 flies like a kite in plasma and flutters up to the substrate 220. Since the pellets 200 are charged, when the pellet 200 gets close to a region where another pellet 200 has already been deposited, repulsion is generated. Here, above the substrate 220, a magnetic field is generated in a direction parallel to a top surface of the substrate 220. A potential difference is given between the substrate 220 and the target 230, and accordingly, current flows from the substrate 220 toward the target 230. Thus, the pellet 200 is given a force (Lorentz force) on a surface of the substrate 220 by an effect of the magnetic field and the current (see FIG. 28). This is explainable with Fleming's left-hand rule. In order to increase a force applied to the pellet 200, it is preferable to provide, on the top surface, a region where the magnetic field in a direction parallel to the top surface of the substrate 220 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 220 is 1.5 times or higher, preferably twice or higher, further preferably 3 times or higher, still further preferably 5 times or higher as high as the magnetic field in a direction perpendicular to the top surface of the substrate 220.

Figure 29A:
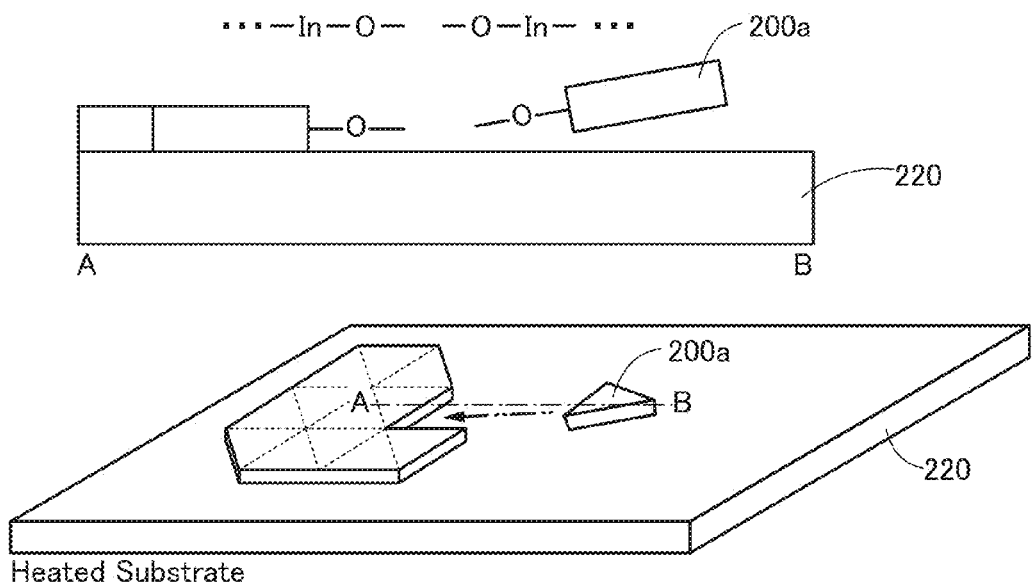
FIGS. 29A and 29B illustrate movement of a pellet on a formation surface.
Figure 29B:
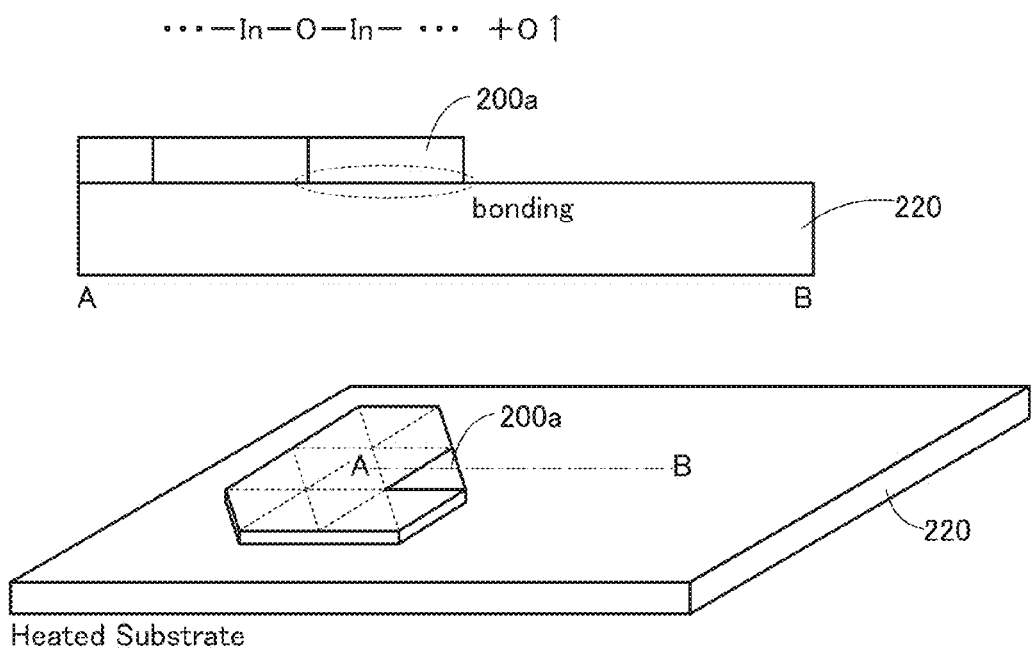

Further, the substrate 220 is heated, and the resistance such as friction between the pellet 200 and the substrate 220 is low. As a result, as illustrated in FIG. 29A, the pellet 200 glides above the surface of the substrate 220. The glide of the pellet 200 is caused in a state where the flat plane faces the substrate 220. Then, as illustrated in FIG. 29B, when the pellet 200 reaches the side surface of another pellet 200 that has been already deposited, the side surfaces of the pellets 200 are bonded. At this time, the oxygen atom on the side surface of the pellet 200 is released. With the released oxygen atom, oxygen vacancies in a CAAC-OS is filled in some cases; thus, the CAAC-OS has a low density of defect states.

Further, the pellet 200 is heated on the substrate 220, whereby atoms are rearranged, and the structure distortion caused by the collision of the ion 201 can be reduced. The pellet 200 whose structure distortion is reduced is substantially single crystal. Even when the pellets 200 are heated after being bonded, expansion and contraction of the pellet 200 itself hardly occur, which is caused by turning the pellet 200 to be substantially single crystal. Thus, formation of defects such as a grain boundary due to expansion of a space between the pellets 200 can be prevented, and accordingly, generation of crevasses can be prevented. Further, the space is filled with elastic metal atoms and the like, whereby the elastic metal atoms have a function, like a highway, of jointing side surfaces of the pellets 200 which are not aligned with each other.

It is considered that as shown in such a model, the pellets 200 are deposited on the substrate 220. Thus, a CAAC-OS film can be deposited even when a surface over which a film is formed (film formation surface) does not have a crystal structure, which is different from film deposition by epitaxial growth. For example, even when a surface (film formation surface) of the substrate 220 has an amorphous structure, a CAAC-OS film can be formed.

Figure 25B:
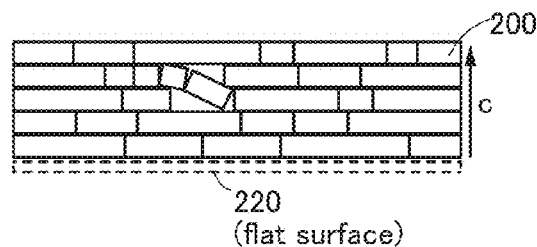

Further, it is found that in formation of the CAAC-OS, the pellets 200 are arranged in accordance with a surface shape of the substrate 220 that is the film formation surface even when the film formation surface has unevenness besides a flat surface. For example, in the case where the surface of the substrate 220 is flat at the atomic level, the pellets 200 are arranged so that flat planes parallel to the a-b plane face downwards; thus, a layer with a uniform thickness, flatness, and high crystallinity is formed. By stacking n layers (n is a natural number), the CAAC-OS film can be obtained (see FIG. 25B).

Figure 25C:
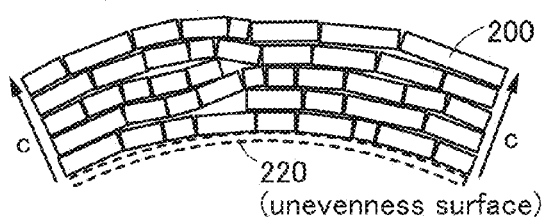

In the case where the surface of the substrate 220 has unevenness, a CAAC-OS film in which n layers (n is a natural number) in each of which the pellets 200 are arranged along the convex surface are stacked is formed. Since the substrate 220 has unevenness, a gap is easily generated between the pellets 200 in the CAAC-OS in some cases. Note that owing to intermolecular force, the pellets 200 are arranged so that a gap between the pellets is as small as possible even on the unevenness surface. Therefore, even when the film formation surface has unevenness, a CAAC-OS film with high crystallinity can be formed (see FIG. 25C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that when the sputtered particles has a dice shape with a large thickness, planes facing the substrate 220 vary, which may lead to formation of a film whose thickness or crystal alignment is not uniformed.

According to the deposition model described above, a CAAC-OS with high crystallinity can be formed even on a film formation surface with an amorphous structure.

Further, formation of a CAAC-OS can be described with a deposition model including a zinc oxide particle besides the pellet 200.

The zinc oxide particle reaches the substrate 220 before the pellet 200 does because the zinc oxide particle is smaller than the pellet 200 in mass. On the surface of the substrate 220, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 220. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

Figure 26:
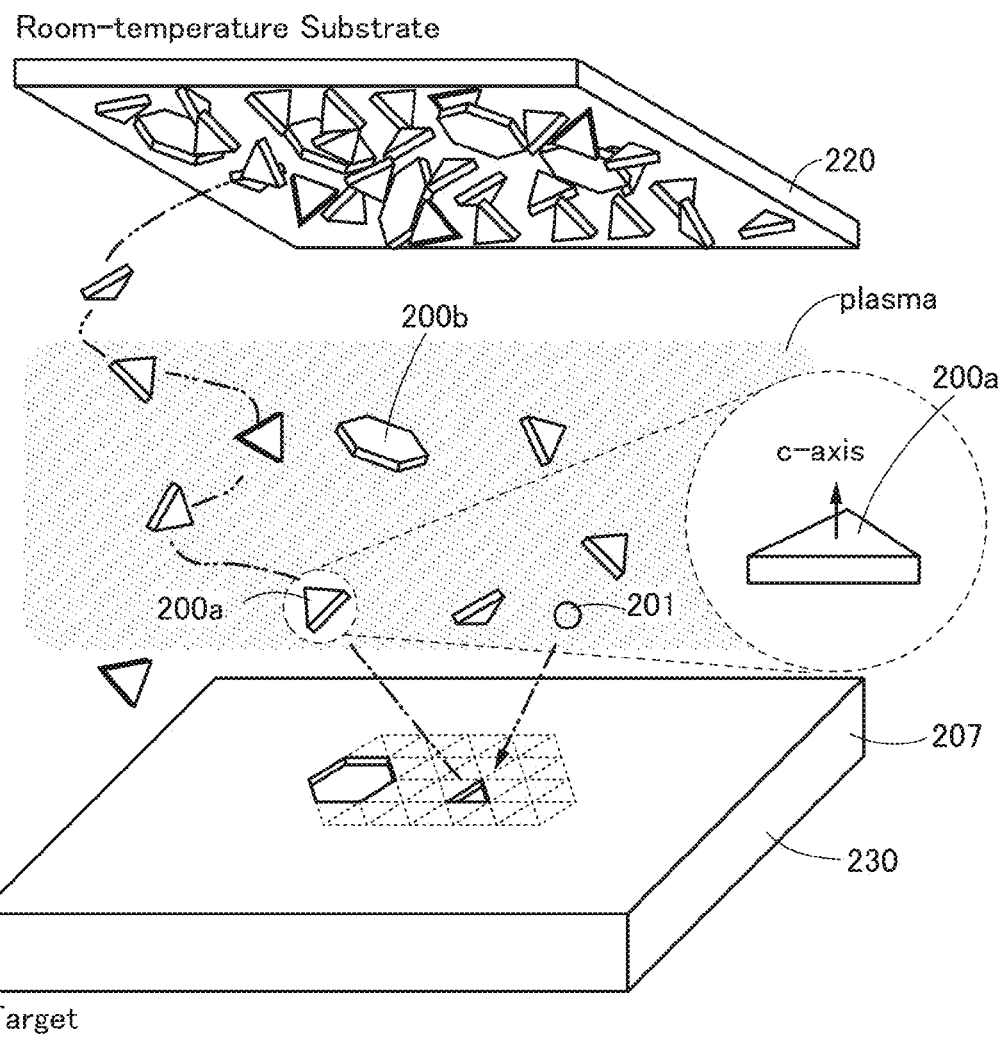
FIG. 26 schematically illustrates an nc-OS deposition model, where pellets are illustrated.

An nc-OS can be understood with a deposition model illustrated in FIG. 26. Note that a difference between FIG. 26 and FIG. 25A lies only in whether the substrate 220 is heated or not.

Thus, the substrate 220 is not heated, and a resistance such as friction between the pellet 200 and the substrate 220 is high. As a result, the pellets 200 cannot glide on the surface of the substrate 220 and are stacked randomly, thereby forming an nc-OS.

A cleavage plane that has been mentioned in the deposition model of the CA AC-OS is described below.

Figure 30A:
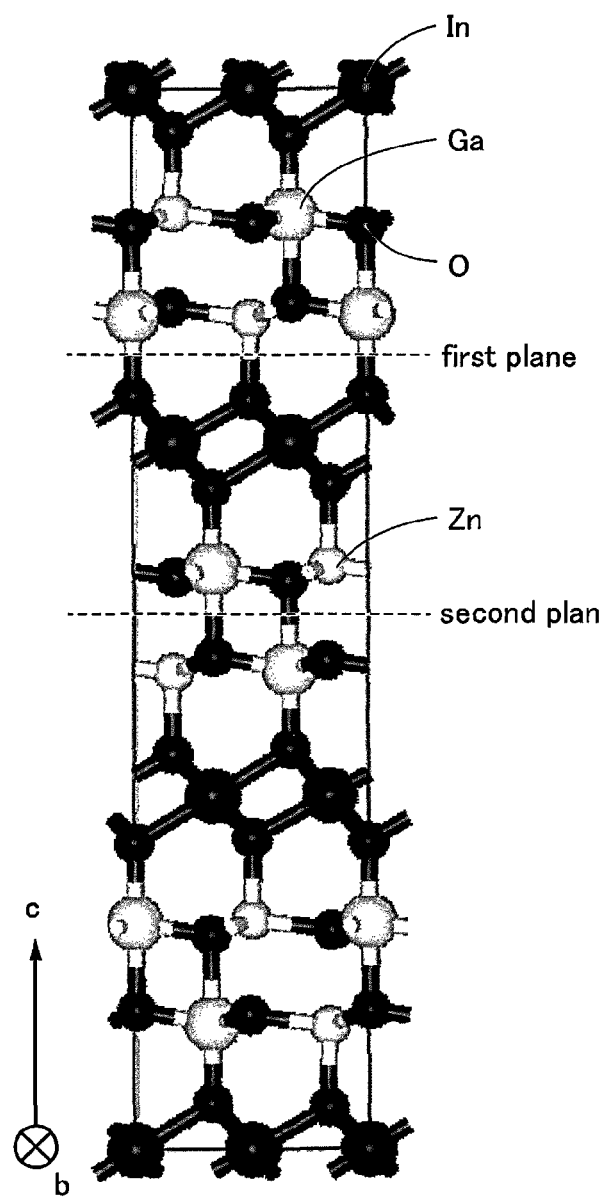
FIGS. 30A and 30B show an $InGaZnO_4$ crystal.
Figure 30B:
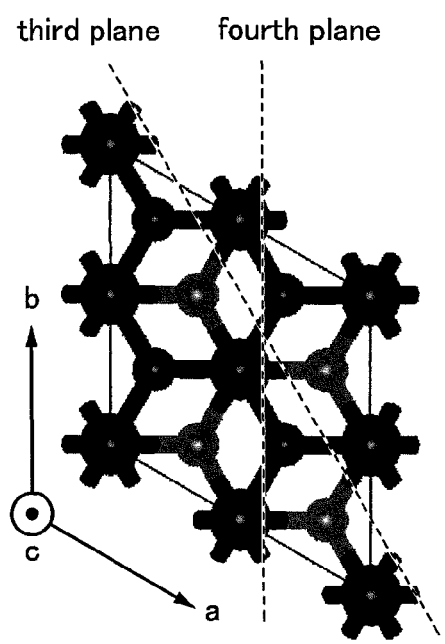

First, a cleavage plane of a target is described with reference to FIGS. 30A and 30B. FIGS. 30A and 30B show a structure of an InGaZnO$_4$ crystal. Note that FIG. 30A shows a structure of the case where the InGaZnO$_4$ crystal is observed from a direction parallel to the b-axis when the c-axis is in an upward direction. Further. FIG. 30B shows a structure of the case where the InGaZnO$_4$ crystal is observed from a direction parallel to the c-axis.

Energy needed for cleavage at each of crystal planes of the InGaZnO$_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the InGaZnO$_4$ crystal shown in FIGS. 30A and 30B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 30A). The second plane is a crystal plane between a Ga—Zn—O layer and a Ga—Zn—O layer and is parallel to the (001) plane (or the a-b plane) (see FIG. 30A). The third plane is a crystal plane parallel to the (110) plane (see FIG. 30B). The fourth plane is a crystal plane parallel to the (100) plane (or the b-c plane) (see FIG. 30B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane is 2.60 J/m$^2$, that of the second plane is 0.68 J/m$^2$, that of the third plane is 2.18 J/m$^2$, and that of the fourth plane is 2.12 J/m$^2$ (see Table 1).

TABLE 1

| | Cleavage energy [J/m$^2$] |
|---|---|
| First plane | 2.60 |
| Second plane | 0.68 |
| Third plane | 2.18 |
| Fourth plane | 2.12 |

From the calculations, in the structure of the InGaZnO$_4$ crystal shown in FIGS. 30A and 30B, the cleavage energy at the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 30A can be separated at two planes equivalent to the second plane. Thus, it is considered that when an ion or the like collides with the target, a wafer unit cleaved at the plane with the lowest cleavage energy (we called this unit "pellet") is separated off as the minimum unit. In that cases, a pellet of InGaZnO$_4$ is composed of three layers of a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and plane that is parallel to the (001) plane (or the a-b plane)), which suggests that most of the flat planes of the pellets have triangle shapes or hexagonal shapes.

Figure 31A:
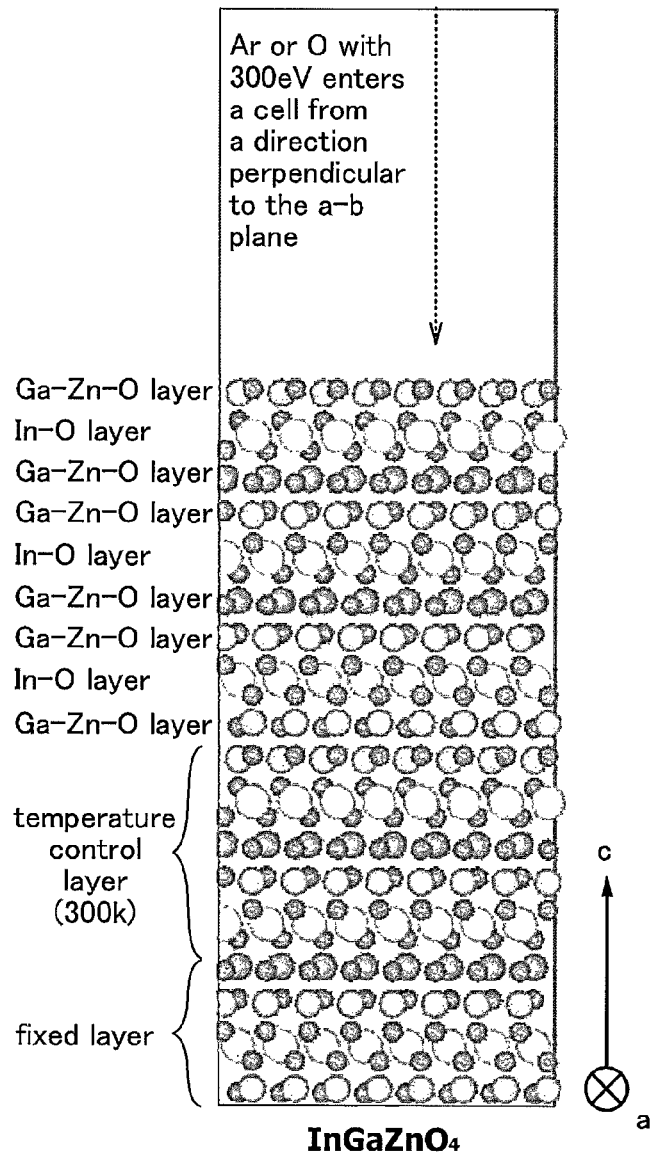
FIGS. 31A and 31B show a structure and the like of $InGaZnO_4$ before collision of an atom.
Figure 31B:
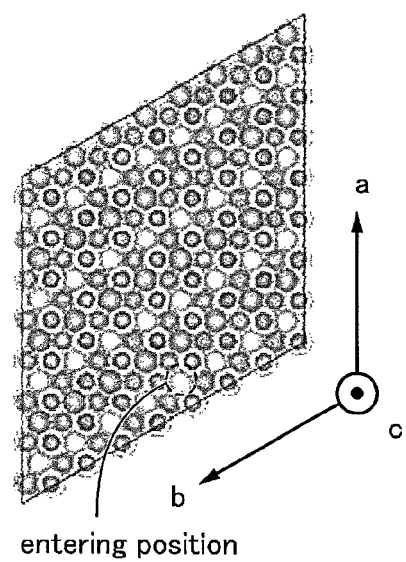

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 31A shows a cross-sectional structure of an InGaZnO$_4$ crystal (2688 atoms) used for the calculation, and FIG. 31B shows a top structure thereof. Note that a fixed layer in FIG. 31A is a layer which prevents the positions of the atoms from moving. A temperature control layer in FIG. 31A is a layer whose temperature is constantly set at a fixed temperature (300 K).

For the classical molecular dynamics calculation, Materials Explorer 5.0 manufactured by Fujitsu Limited, is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

FIG. 32A shows an atomic arrangement when 99.9 picoseconds have passed after argon enters the cell including the InGaZnO$_4$ crystal shown in FIGS. 31A and 31B. FIG. 32B shows an atomic arrangement when 99.9 picoseconds have passed after oxygen enters the cell. Note that in FIGS. 32A and 32B, part of the fixed layer in FIG. 31A is omitted.

According to FIG. 32A, in a period from entry of argon into the cell to when 99.9 picoseconds have passed, a crack is formed from the cleavage plane corresponding to the second plane shown in FIG. 30A. Thus, in the case where argon collides with the InGaZnO$_4$ crystal and the uppermost surface is assumed to be the second plane (the zero-th), a large crack is found to be formed in the second plane (the second).

On the other hand, according to FIG. 32B, in a period from entry of oxygen into the cell to when 99.9 picoseconds have passed, a crack is found to be formed from the cleavage plane corresponding to the second plane shown in FIG. 30A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a way that a defect caused by the damage reacts with oxygen.

Here, difference in size of the pellet depending on atoms which are made to collide is studied.

Figure 33A:
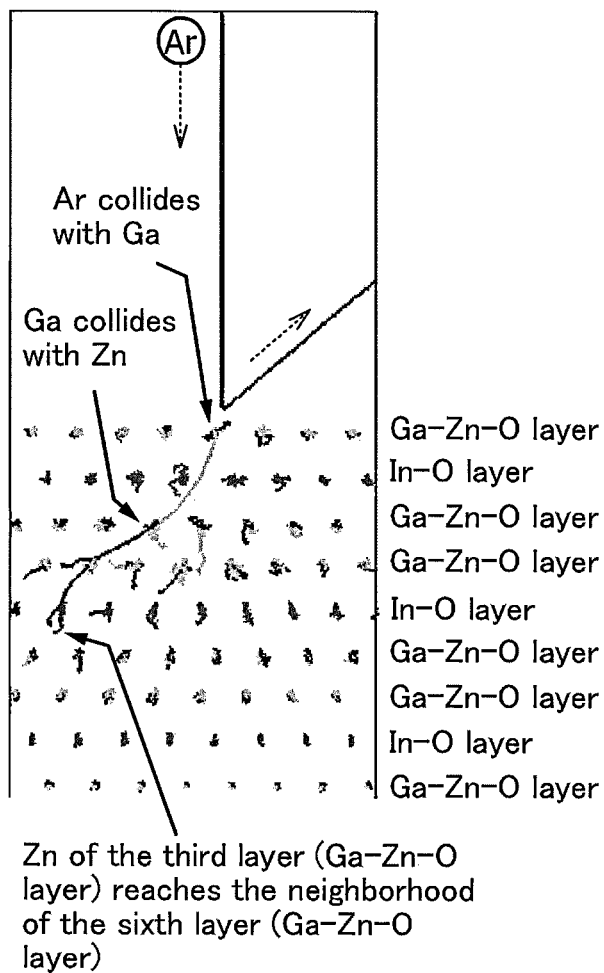
FIGS. 33A and 33B show trajectories of atoms after collision of an atom.

FIG. 33A shows trajectories of the atoms from 0 picosecond to 0.3 picoseconds after argon enters the cell including the InGaZnO$_4$ crystal shown in FIGS. 31A and 3B. Accordingly, FIG. 33A corresponds to a period from FIGS. 31A and 31B to FIG. 32A.

Figure 33B:
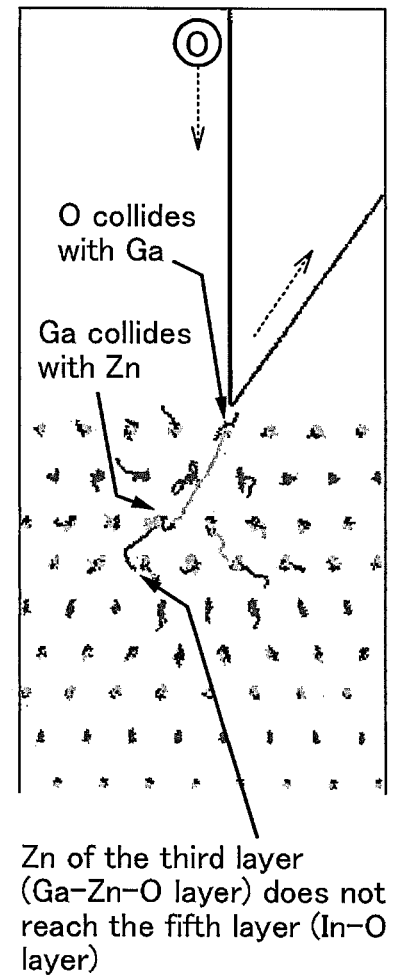

On the other hand, according to FIG. 33B, when oxygen collides with gallium (Ga) of the first layer (Ga—Zn—O layer) counted from the top, the gallium collides with zinc (Zn) of the third layer (Ga—Zn—O layer) counted from the top and then, the zinc does not reach the fifth layer (In—O layer) counted from the top. Note that the oxygen which collides with the gallium is sputtered to the outside. Accordingly in the case where oxygen collides with the target including the InGaZnO$_4$ crystal, a crack is formed in the second plane (the first) in FIG. 31A.

This calculation also indicates that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following formula (1) and the following formula (2). Here, E represents energy of argon or oxygen before collision (300 eV), m$_A$ represents mass of argon or oxygen, v$_A$ represents the speed of argon or oxygen before collision, v'$_A$ represents the speed of argon or oxygen after collision, m$_{Ga}$ represents mass of gallium, v$_{Ga}$ represents the speed of gallium before collision, and v'$_{Ga}$ represents the speed of gallium after collision.

[Formula 1]

$$E = \frac{1}{2}m_A v_A^2 + \frac{1}{2}m_A v_{Ga}^2$$

[Formula 2]

$$m_A v_A + m_{Ga} v_{Ga} = m_A v'_A + m_{Ga} v'_{Ga} \qquad (2)$$

On the assumption that collision of argon or oxygen is elastic collision, the relationship among v$_A$, v'$_A$, v$_{Ga}$, and v'$_{Ga}$ can be represented by the following formula (3).

$$v'_A - v'_{Ga} = -(v_A - v_{Ga}) \qquad \text{[Formula 3]}$$

From the formulae (1), (2), and (3), when v$_{Ga}$ is 0, the speed of gallium v'$_{Ga}$ after collision of argon or oxygen can be represented by the following formula (4).

[Formula 4]

$$v'_{Ga} = \frac{\sqrt{m_A}}{m_A + m_{Ga}} \cdot 2\sqrt{2E}$$

In the formula (4), mass of argon or oxygen is substituted into m$_A$, whereby the speeds of gallium after collision of the atoms are compared. In the case where the argon and the oxygen have the same energy before collision, the speed of gallium in the case where argon collides with the gallium is 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when a target including the InGaZnO$_4$ crystal having a homologous structure is sputtered, separation occurs from the cleavage plane to form a pellet. In contrast, when a region of a target having no cleavage plane is sputtered, a pellet is not formed, in which case a sputtered particle at an atomic level that is finer than the pellet is formed. Since the sputtered particle is smaller than the pellet, it is considered that the sputtered particle is removed through a vacuum pump connected to the sputtering apparatus. Thus, it is quite unlikely that when a target including an InGaZnO$_4$ crystal having a homologous structure is sputtered, particles in various sizes and shapes reach the substrate and deposited. The model illustrated in FIG. 25A where sputtered pellets are deposited to form a CAAC-OS is reasonable.

The CAAC-OS deposited in such a manner has a density substantially equal to that of a single crystal OS. For example, the density of the single crystal OS of InGaZnO$_4$ having a homologous structure is 6.36 g/cm$^3$, and the density of the CAAC-OS having substantially the same atomic ratio is approximately 6.3 g/cm$^3$.

Figure 34A:
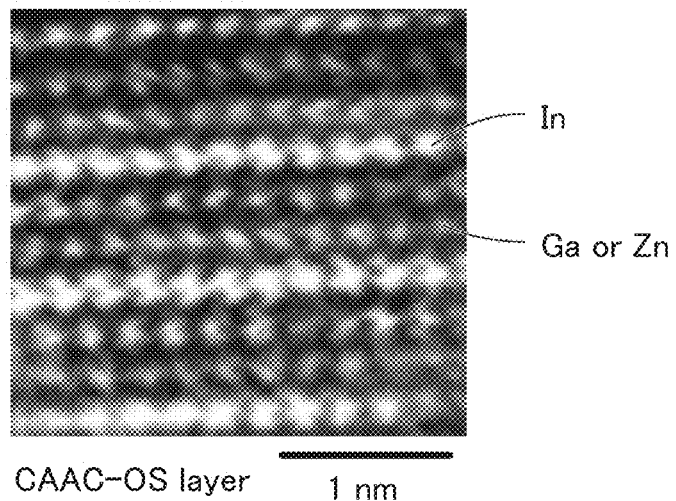
FIGS. 34A and 34B are cross-sectional HAADF-STEM images of a CAAC-OS film and a target, respectively.
Figure 34B:
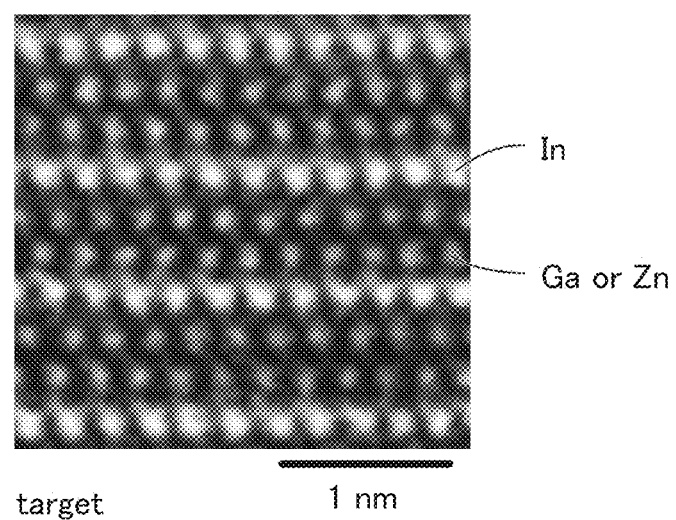

FIGS. 34A and 34B show atomic arrangements of cross sections of an In—Ga—Zn oxide (see FIG. 34A) that is a CAAC-OS deposited by a sputtering method and a target thereof (see FIG. 34B). For observation of atomic arrangement, a high-angle annular dark field scanning transmission electron microscopy (HAADF-STEM) is used. The contrast of the image of each of the atoms in a HAADF-STEM image is proportional to the square of its atomic number. Therefore, Zn (atomic number: 30) and Ga (atomic number: 31), which have close atomic numbers, are difficult to distinguish from each other. A Hitachi scanning transmission electron microscope HD-2700 is used as the HAADF-STEM.

When FIG. 34A and FIG. 34B are compared, it is found that the CAAC-OS and the target each have a homologous structure and arrangements of atoms in the CAAC-OS correspond to those in the target. This shows that CAAC-OS is formed by transferring the crystal structure of the target as illustrated in the deposition model in FIG. 25A.

(Embodiment 6)

In this embodiment, an example of a circuit including the transistor of one embodiment of the present invention is described with reference to the drawings.

Figure 16A:
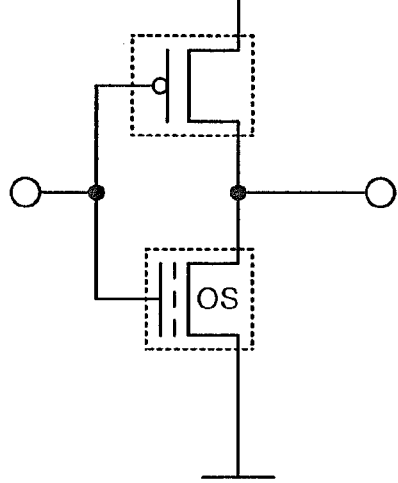
FIGS. 16A and 16B illustrate examples of a circuit diagram of a semiconductor device that uses a transistor of one embodiment of the present invention and FIGS. 16C and 16D illustrate cross-sectional views of semiconductor devices that use a transistor of one embodiment of the present invention.
Figure 16B:
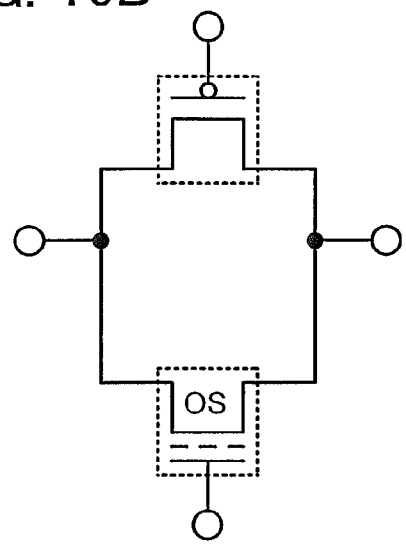
Figure 16C:
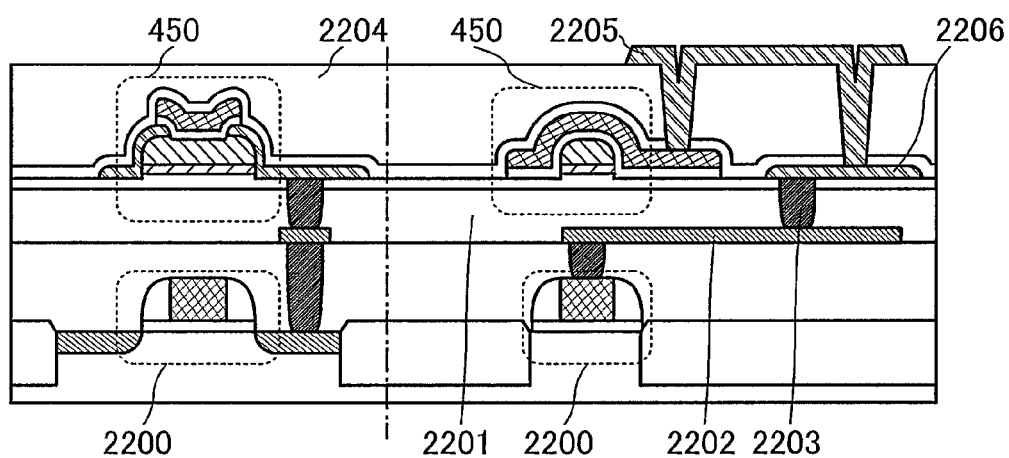
Figure 16D:
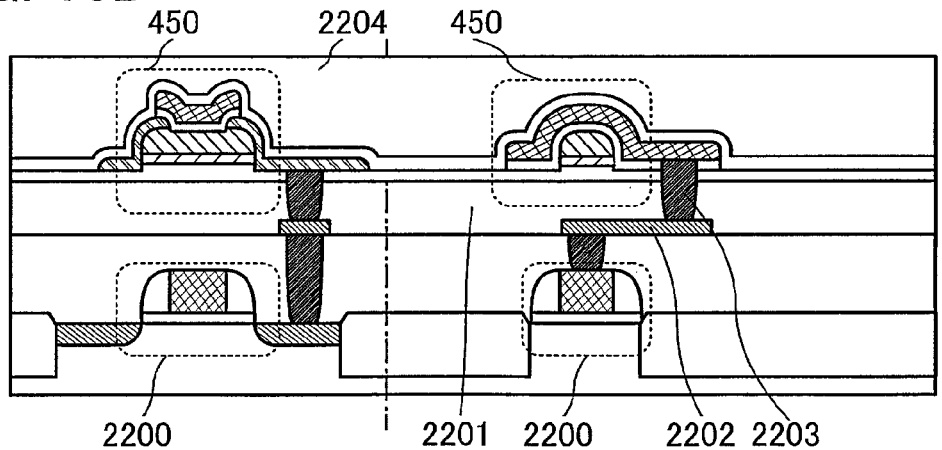

FIGS. 16A and 16B are circuit diagrams of semiconductor devices and FIGS. 16C and 16D are cross-sectional views of semiconductor devices. FIGS. 16C and 16D each illustrate a cross section of the transistor 450 in a channel length direction on the left and a cross section of the transistor 450 in a channel width direction on the right. In the circuit diagram, "OS" is written beside a transistor in order to clearly demonstrate that the transistor includes an oxide semiconductor.

The semiconductor devices illustrated in FIGS. 16C and 16D each include a transistor 2200 containing a first semiconductor material in a lower portion and a transistor containing a second semiconductor material in an upper portion. Here, an example is described in which the transistor 450 described in Embodiment 2 as an example is used as the transistor containing the second semiconductor material.

Here, the first semiconductor material and the second semiconductor material preferably have different energy gaps. For example, the first semiconductor material may be a semiconductor material (e.g., silicon, germanium, silicon germanium, silicon carbide, or gallium arsenic) other than an oxide semiconductor, and the second semiconductor material may be the oxide semiconductor described in Embodiment 2. A transistor including single crystal silicon or the like as a material other than an oxide semiconductor can operate at high speed easily. In contrast, a transistor including an oxide semiconductor has a low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, does not need to be limited to that described here except for the use of the transistor described in Embodiment 2, which is formed using an oxide semiconductor.

FIGS. 16A, 16C, and 16D each illustrate a configuration example of what is called a CMOS circuit, in which a p-channel transistor and an n-channel transistor are connected in series and gates of the transistors are connected.

The transistor using an oxide semiconductor of one embodiment of the present invention has high on-state current, so that high-speed operation of a circuit is possible.

In the structure illustrated in FIG. 16C, the transistor 450 is provided over the transistor 2200 with an insulating layer 2201 positioned therebetween. Wirings 2202 are provided between the transistor 2200 and the transistor 450. Wirings and electrodes over and under insulating layers are electrically connected via plugs 2203 embedded in the insulating layers. An insulating layer 2204 covering the transistor 450, a wiring 2205 over the insulating layer 2204, and a wiring 2206 formed by processing the same conductive layer as the pair of electrodes of the transistor 450 are provided.

By stacking two transistors in the above manner, the area occupied by the circuit can be reduced; accordingly, a plurality of circuits can be arranged with high density.

In FIG. 16C, one of the source and the drain of the transistor 450 is electrically connected to one of a source and a drain of the transistor 2200 via the wiring 2202 and the plug 2203. The gate of the transistor 450 is electrically connected to a gate of the transistor 2200 via the wiring 2205, the wiring 2206, the plug 2203, the wiring 2202, and the like.

In the configuration illustrated in FIG. 16D, an opening portion in which the plug 2203 is embedded is provided in a gate insulating layer of the transistor 450, and the gate of the transistor 450 is in contact with the plug 2203. Such a configuration makes it possible to achieve the integration of the circuit easily and to make the lengths and the number of wirings and plugs to be smaller than those in the configuration illustrated in FIG. 16C; thus, the circuit can operate at higher speed.

Note that when a connection between the electrodes of the transistor 450 and the transistor 2200 is changed from that in the configuration illustrated in FIG. 16C or FIG. 16D, a variety of circuits can be formed. For example, a circuit having a configuration in which a source and a drain of a transistor are connected to those of another transistor as illustrated in FIG. 16B can operate as what is called an analog switch.

A semiconductor device having an image sensor function for reading data of an object can be fabricated with the use of the transistor described in any of the above embodiments.

Figure 17:
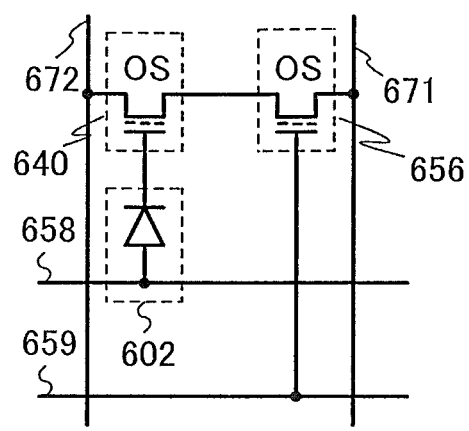
FIG. 17 is a circuit diagram of a semiconductor device of an embodiment.

FIG. 17 illustrates an example of an equivalent circuit of a semiconductor device having an image sensor function.

In a photodiode 602, one electrode is electrically connected to a photodiode reset signal line 658, and the other electrode is electrically connected to a gate of a transistor 640. One of a source and a drain of the transistor 640 is electrically connected to a photosensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photosensor output signal line 671.

As the photodiode 602, for example, a pin photodiode in which a semiconductor layer having p-type conductivity, a high-resistance semiconductor layer (semiconductor layer having i-type conductivity), and a semiconductor layer having n-type conductivity are stacked can be used.

With detection of light that enters the photodiode 602, data of an object can be read. Note that a light source such as a backlight can be used at the time of reading data of an object.

As each of the transistor 640 and the transistor 656, the transistor in which a channel is formed in an oxide semiconductor, which is described in any of the above embodiments, can be used. In FIG. 17, "OS" is written beside the transistor 640 and the transistor 656 so that the transistors 640 and 656 can be identified as transistors including an oxide semiconductor.

It is preferable that each of the transistor 640 and the transistor 656 be one of the transistors described in the above embodiments, in which the oxide semiconductor layer is electrically covered with the gate electrode. In a transistor including the oxide semiconductor layer with a rounded end portions and a curved surface, coverage with a layer formed over the oxide semiconductor layer can be improved. In addition, electric field concentration which might occur at end portions of the source electrode and the drain electrode can be reduced, which can suppress deterioration of the transistor. Therefore, variation in the electrical characteristics of the transistor 640 and the transistor 656 is suppressed, and the transistor 640 and the transistor 656 are electrically stable. The semiconductor device having an image sensor function illustrated in FIG. 17 can have high reliability by including the transistor.

This embodiment can be implemented in combination with any of the other embodiments disclosed in this specification as appropriate.

(Embodiment 7)

In this embodiment, an example of a semiconductor device (memory device) using the transistor of one embodiment of the present invention will be described with reference to drawings. The semiconductor device (memory device) can retain data even when not powered, and has an unlimited number of write cycles.

Figure 18:
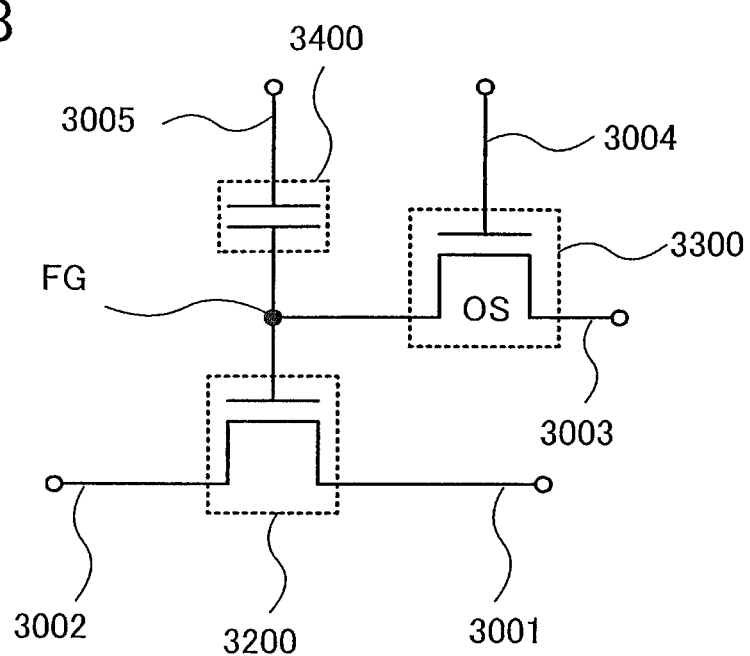
FIG. 18 is a circuit diagram of a semiconductor device of an embodiment.

FIG. 18 is a circuit diagram of the semiconductor device.

The semiconductor device illustrated in FIG. 18 includes a transistor 3200 using a first semiconductor material, a transistor 3300 using a second semiconductor material, and a capacitor 3400. Note that the transistor shown in Embodiment 2 can be used as the transistor 3300.

The transistor 3300 includes a channel formed in a semiconductor layer including an oxide semiconductor. Since the off-state current of the transistor 3300 is low, stored data can be retained for a long period using such a transistor. In other words, it is possible to obtain a semiconductor memory device that does not need refresh operation or has an extremely low frequency of refresh operation, and thus has sufficiently low power consumption.

In FIG. 18, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

In the semiconductor device in FIG. 18, the potential of the gate electrode of the transistor 3200 can be retained, whereby writing, retaining, and reading of data can be performed as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely low, the charge of the gate electrode of the transistor 3200 is held for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in general, in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied in writing and the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Thus, the data retained in the gate electrode can be read by determining the potential of the second wiring 3002.

Note that in the case where memory cells are arrayed, it is necessary that only data of a desired memory cell be able to be read. In the case where data is not read, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device described in this embodiment includes a transistor having a channel formation region using an oxide semiconductor and thus having an extremely low off-state current; accordingly, data can be retained for an extremely long time. In other words, it is possible to obtain a semiconductor device that does not need refresh operation or has an extremely low frequency of refresh operation, and thus has a sufficiently low power consumption. Moreover, stored data can be retained for a long time even when power is not supplied (note that a potential is preferably fixed).

Furthermore, in the semiconductor device of this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film does not occur at all. That is, in the semiconductor device of the disclosed invention, there is no limitation on the number of times of rewritting unlike in a conventional nonvolatile memory. As a result, the reliability of the semiconductor device is drastically improved. Moreover, data is written depending on the state of the transistor (on or off), whereby high-speed operation can be easily achieved.

As described above, a miniaturized and highly integrated semiconductor device having high electrical characteristics can be provided.

(Embodiment 8)

In this embodiment, description is given of a CPU in which the transistor described in any of the above-described embodiments can be used and the memory device described in the above embodiment is included.

Figure 19:
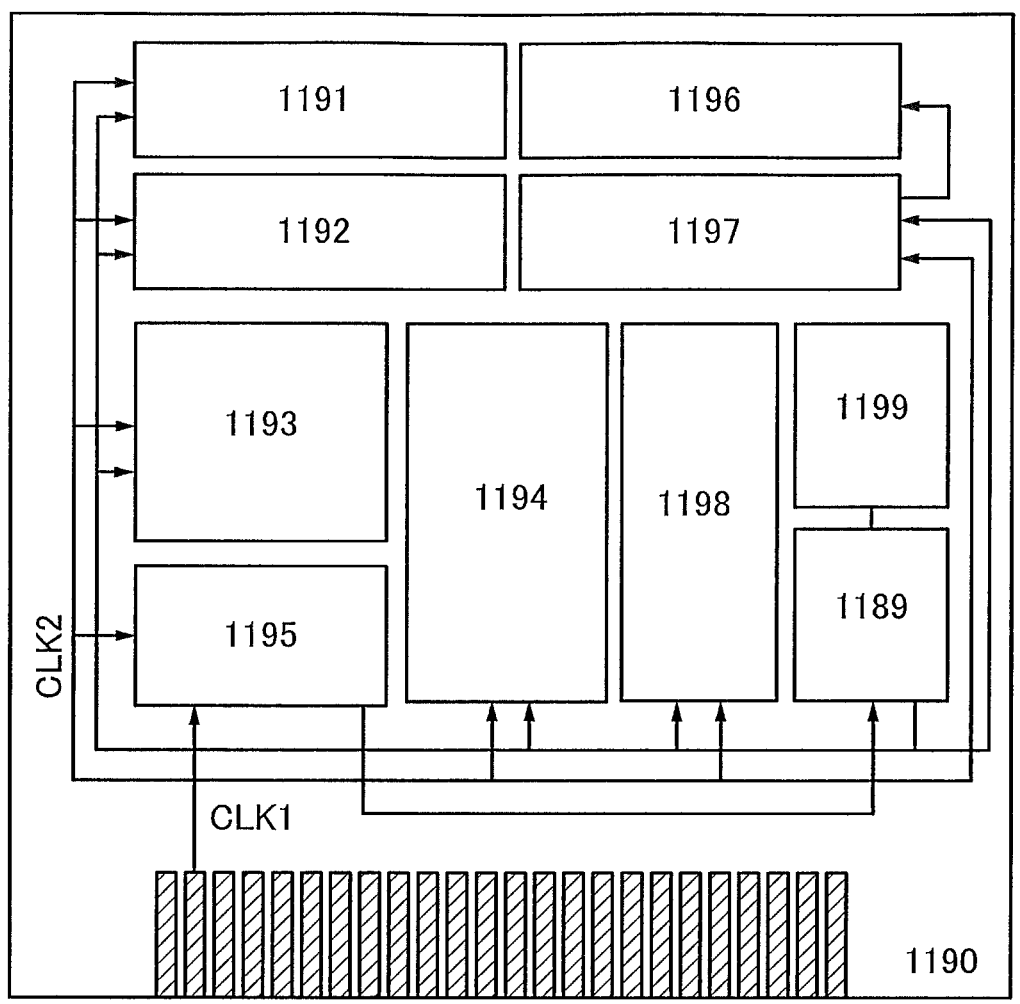
FIG. 19 is a block diagram of a semiconductor device of an embodiment.

FIG. 19 is a block diagram illustrating a configuration example of a CPU at least partly including the transistor described in Embodiment 2.

The CPU illustrated in FIG. 19 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 19 is just an example with a simplified configuration, and an actual CPU may have various configurations depending on the application. For example, the CPU may have the following configuration: a structure including the CPU illustrated in FIG. 19 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 19, a memory cell is provided in the register 1196. As the memory cell of the register 1196, any of the transistors described in the above embodiments can be used. Alternatively, any of the transistors described in the above embodiments may be used in a cache memory.

In the CPU illustrated in FIG. 19, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 20:
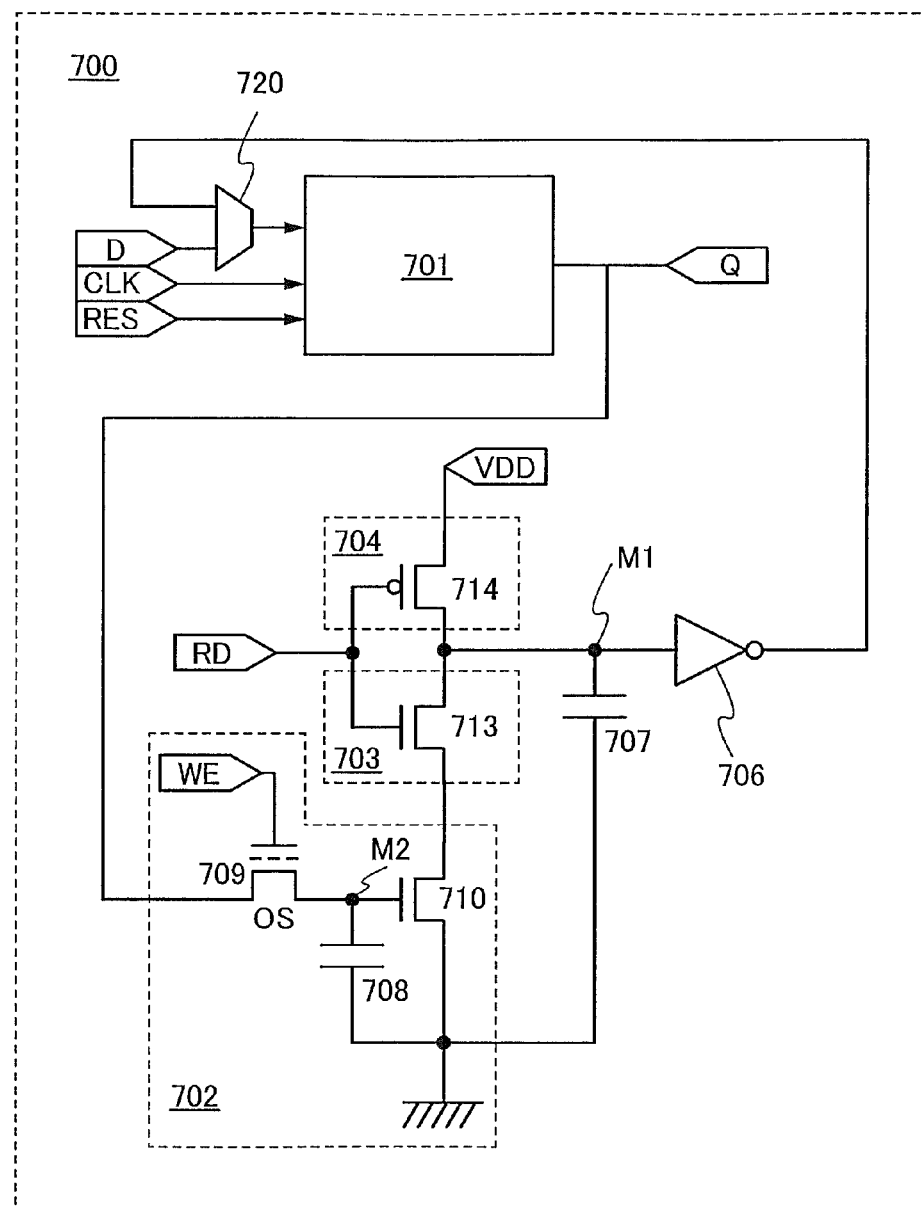
FIG. 20 is a circuit diagram of a memory device of an embodiment.

FIG. 20 is an example of a circuit diagram of a memory element that can be used as the register 1196. A memory element 700 includes a circuit 701 in which stored data is volatile when power supply is stopped, a circuit 702 in which stored data is nonvolatile even when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, any of the transistors described in the above embodiments can be used in the circuit 702. When supply of a power supply voltage to the memory element 700 is stopped, a ground potential (GND) is input to a gate of the transistor 709. For example, the gate of the transistor 709 is grounded through a load such as a resistor. As described in the above embodiments, the transistor 709 has an extremely low Icut because electrons are trapped in the electron trap layer and thereby the threshold voltage is increased; thus, charge stored in the capacitor 708 can be held for a long period.

Shown here is an example in which the switch 703 is a transistor 713 having one conductivity type (e.g., an n-channel transistor) and the switch 704 is a transistor 714 having a conductivity type opposite to the one conductivity type (e.g., a p-channel transistor). A first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the gate of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 701 is input to the other of the source and the drain of the transistor 709. FIG. 20 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 20, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where the circuit 701 includes a node in which a signal obtained by inversion of the logic value of a signal input from the input terminal is retained, the signal output from the second terminal of the switch 703 (the other of the source and the drain of the transistor 713) can be input to the node.

The transistor described in Embodiment 2 can be used as the transistor 709 in FIG. 20.

In FIG. 20, the transistors included in the memory element 700 except for the transistor 709 can each be a transistor in which a channel is formed in a layer formed using a semiconductor other than an oxide semiconductor or in the substrate 1190. For example, a channel of transistor can be formed in a silicon layer or a silicon substrate. Alternatively, all the transistors in the memory element 700 may be a transistor in which a channel is formed in an oxide semiconductor layer. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 20, for example, a flip-flop circuit can be used. As the logic element 706, for example, an inverter or a clocked inverter can be used.

In a period during which the memory element 700 is not supplied with the power supply voltage, the semiconductor device of one embodiment of the present invention can retain data stored in the circuit 701 by the capacitor 708 which is provided in the circuit 702.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when such a transistor including an oxide semiconductor is used for the transistor 709, a signal held in the capacitor 708 is retained for a long time also in a period during which the power supply voltage is not supplied to the memory element 700. The memory element 700 can thus retain the stored content (data) also in a period during which the supply of the power supply voltage is stopped.

The memory element 700 performs pre-charge operation with the switch 703 and the switch 704, shortening the time required for the circuit 701 to retain original data again after the supply of the power supply voltage is restarted.

In the circuit 702, a signal retained by the capacitor 708 is input to the gate of the transistor 710. Therefore, after supply of the power supply voltage to the memory element 700 is restarted, the signal retained by the capacitor 708 can be converted into the one corresponding to the state (the on state or the off state) of the transistor 710 to be read from the circuit 702. Consequently, an original signal can be accurately read even when a potential corresponding to the signal retained by the capacitor 708 varies to some degree.

By applying the above-described memory element 700 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 700 is used in a CPU in this embodiment, the memory element 700 can also be used in an LSI such as a digital signal processor (DSP), a custom LSI, or a programmable logic device (PLD), and a radio frequency identification (RF-ID).

This embodiment can be implemented in combination with any of the other embodiments disclosed in this specification as appropriate.

(Embodiment 9)

The semiconductor device of one embodiment of the present invention can be used for display devices, personal computers, image reproducing devices provided with recording media (typically, devices that reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 21A to 21F illustrate specific examples of these electronic devices.

Figure 21A:
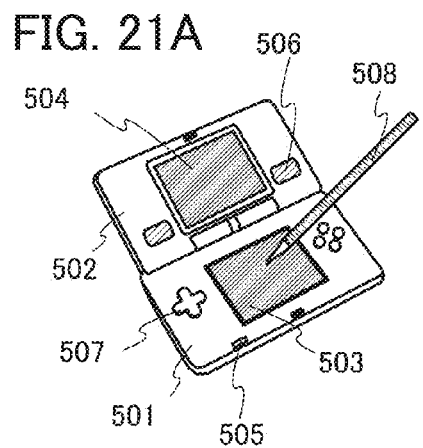
FIGS. 21A to 21F illustrate examples of an electronic device.

FIG. 21A illustrates a portable game machine including a housing 501, a housing 502, a display portion 503, a display portion 504, a microphone 505, a speaker 506, an operation key 507, a stylus 508, and the like. Although the portable game machine in FIG. 21A has the two display portions 503 and 504, the number of display portions included in a portable game machine is not limited to this.

Figure 21B:
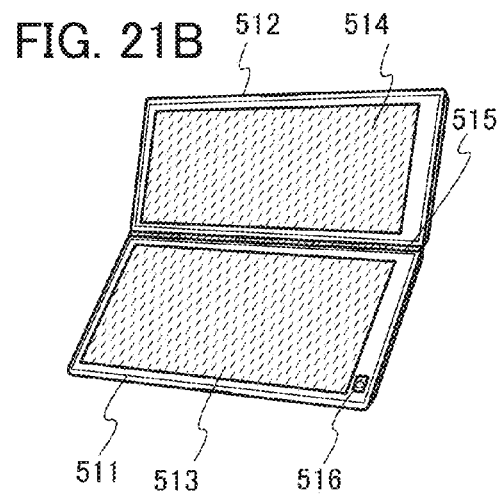

FIG. 21B illustrates a portable data terminal including a first housing 511, a second housing 512, a first display portion 513, a second display portion 514, a joint 515, an operation key 516, and the like. The first display portion 513 is provided in the first housing 511, and the second display portion 514 is provided in the second housing 512. The first housing 511 and the second housing 512 are connected to each other with the joint 515, and the angle between the first housing 511 and the second housing 512 can be changed with the joint 515. An image on the first display portion 513 may be switched depending on the angle between the first housing 511 and the second housing 512 at the joint 515. A display device with a position input function may be used as at least one of the first display portion 513 and the second display portion 514. Note that the position input function can be added by providing a touch panel in a display device. Alternatively, the position input function can be added by provision of a photoelectric conversion element called a photosensor in a pixel area of a display device.

Figure 21C:
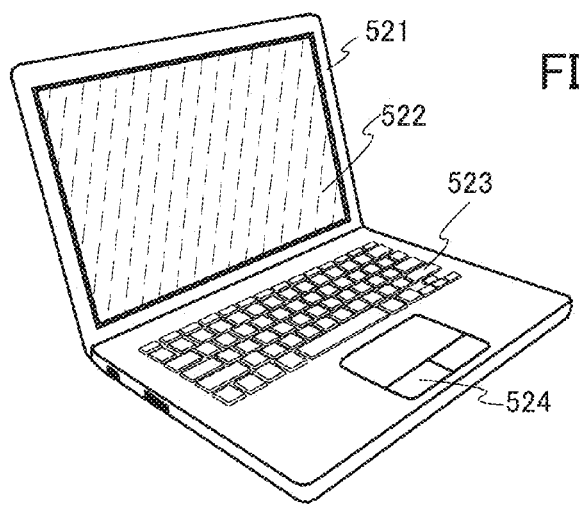

FIG. 21C illustrates a laptop personal computer, which includes a housing 521, a display portion 522, a keyboard 523, a pointing device 524, and the like.

Figure 21D:
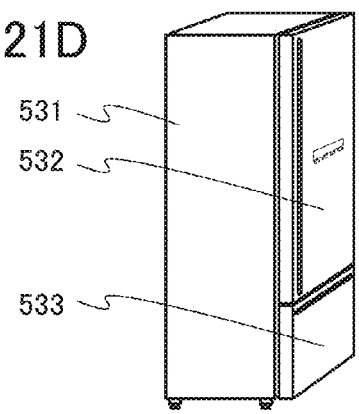

FIG. 21D illustrates the electric refrigerator-freezer including a housing 531, a door for a refrigerator 532, a door for a freezer 533, and the like.

Figure 21E:
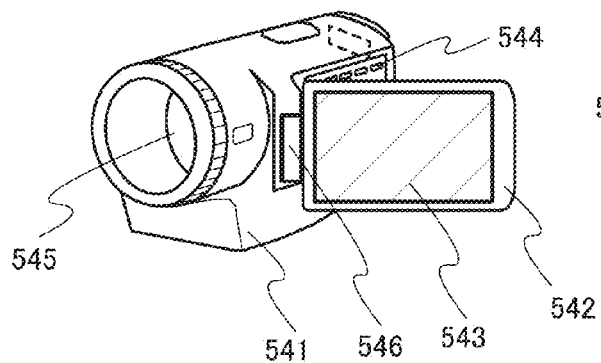

FIG. 21E illustrates a video camera, which includes a first housing 541, a second housing 542, a display portion 543, operation keys 544, a lens 545, a joint 546, and the like. The operation keys 544 and the lens 545 are provided for the first housing 541, and the display portion 543 is provided for the second housing 542. The first housing 541 and the second housing 542 are connected to each other with the joint 546, and the angle between the first housing 541 and the second housing 542 can be changed with the joint 546. Images displayed on the display portion 543 may be switched in accordance with the angle at the joint 546 between the first housing 541 and the second housing 542.

Figure 21F:
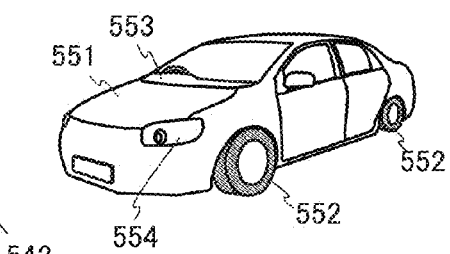

FIG. 21F illustrates a passenger car including a car body 551, wheels 552, a dashboard 553, lights 554, and the like.

This embodiment can be implemented in combination with any of the other embodiments disclosed in this specification as appropriate.

Example

In this example, transistors having the same structure as the transistor 450 illustrated in FIGS. 9A to 9C were formed as samples of this example, and electrical characteristics were evaluated.

First, a method for forming the samples of this example will be described.

First, a silicon oxynitride (SiON) layer serving as a base insulating layer was formed to a thickness of 300 nm over a silicon substrate. The silicon oxynitride layer was formed by a CVD method under the following conditions: mixed atmosphere of argon and oxygen (argon:oxygen=25 sccm:25 sccm); pressure, 0.4 Pa, power supply (power supply output), 5.0 kW; and substrate temperature, 100° C.

A surface of the silicon oxynitride layer was subjected to polishing treatment. Then, a 20-nm-thick first oxide semiconductor layer and a 15-nm-thick second oxide semiconductor layer were stacked. The first oxide semiconductor layer was formed by a sputtering method using an oxide target of In:Ga:Zn=1:3:2 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 200° C. The second oxide semiconductor layer was formed by a sputtering method using an oxide target of In:Ga:Zn=1:1:1 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 300° C. Note that the first oxide semiconductor layer and the second oxide semiconductor layer were successively formed without exposure to the air.

Next, heat treatment was performed. The heat treatment was performed under a nitrogen atmosphere at 450° C. for one hour, and then performed under an oxygen atmosphere at 450° C. for one hour.

Next, the first oxide semiconductor layer and the second oxide semiconductor layer were processed into an island shape by inductively coupled plasma (ICP) etching under the following conditions: mixed atmosphere of boron trichloride and chlorine ($BCl_3:Cl_2=60$ sccm:20 sccm); power supply, 450 W; bias power, 100 W; and pressure, 1.9 Pa.

Next, a tungsten layer to be a source electrode and a drain electrode was formed to a thickness of 100 nm over the first oxide semiconductor layer and the second oxide semiconductor layer. The tungsten layer was formed by a sputtering method using a tungsten target under the following conditions: argon (Ar=80 sccm) atmosphere; pressure, 0.8 Pa; power supply (power supply output), 1.0 kW; distance between the silicon substrate and the target, 60 mm; and substrate temperature, 230° C.

Next, a resist mask was formed over the tungsten film and etching was performed by an ICP etching method. As the etching, first etching, second etching, and third etching were performed. The conditions of the first etching were as follows: mixed atmosphere of carbon tetrafluoride, chlorine, and oxygen ($CF_4:Cl_2:O_2=45$ sccm:45 sccm:55 sccm); power supply, 3000 W; bias power, 110 W; and pressure, 0.67 Pa. The second etching was performed after the first etching under the following conditions: oxygen atmosphere ($O_2=100$ sccm); power supply, 2000 W; bias power, 0 W; and pressure, 3.0 Pa. The third etching was performed after the second etching under the following conditions: mixed atmosphere of carbon tetrafluoride, chlorine, and oxygen ($CF_4:Cl_2:O_2=45$ sccm:45 sccm:55 sccm); power supply, 3000 W; bias power, 110 W; and pressure, 0.67 Pa. Thus, the source electrode and the drain electrode were formed.

Next, a third oxide semiconductor layer was formed to a thickness of 5 nm over the second oxide semiconductor layer, the source electrode, and the drain electrode. The third oxide semiconductor layer was formed by a sputtering method using an oxide target of In:Ga:Zn=1:3:2 (atomic ratio) under the following conditions: mixed atmosphere of argon and oxygen (argon:oxygen=30 sccm:15 sccm); pressure, 0.4 Pa; power supply, 0.5 kW; distance between the target and the substrate, 60 mm; and substrate temperature, 200° C.

Next, a silicon oxynitride layer with a thickness of 15 nm serving as a gate insulating layer was formed by a CVD method under the following conditions: mixed atmosphere of silane and dinitrogen monoxide ($SiH_4:N_2O=1$ sccm:800 sccm); pressure, 200 Pa, power supply, 150 kW; distance between the target and the substrate, 28 mm; and substrate temperature, 350° C. Moreover, a hafnium oxide layer with a thickness of 20 nm serving as a gate insulating layer was stacked over the silicon oxynitride layer by a sputtering method under the following conditions: mixed atmosphere of argon and oxygen ($Ar:O_2=25$ sccm:25 sccm); pressure, 0.6 Pa, power supply, 2.5 kW; distance between the target and the substrate, 60 mm; and substrate temperature, 200° C.

Next, a tantalum nitride layer was formed to a thickness of 30 nm and a tungsten layer was formed to a thickness of 135 nm by a sputtering method. The deposition conditions of the tantalum nitride layer by a sputtering method were as follows: mixed atmosphere of argon and nitrogen (argon:nitrogen=50 sccm:10 sccm); pressure, 0.6 Pa; power supply, 1 kW; distance between the target and the substrate, 60 mm; and substrate temperature, 25° C. The deposition conditions of the tungsten layer by a sputtering method were as follows: an argon (Ar=100 sccm) atmosphere; pressure, 2.0 Pa; power supply, 4 kW; distance between the target and the substrate, 60 mm; and substrate temperature, 230° C.

Next, the stack of the 30-nm-thick tantalum nitride layer and the 135-nm-thick tungsten layer was etched by an ICP etching method. As the etching, first etching and second etching were performed. The conditions of the first etching were as follows: mixed atmosphere of chlorine, carbon tetrafluoride, and oxygen ($Cl_2:CF_4:O_2=45$ sccm:55 sccm:55 sccm); power supply, 3000 W; bias power, 110 W; and pressure, 0.67 Pa. The second etching was performed after the first etching under the following conditions: a chlorine ($Cl_2=100$ sccm) atmosphere; power supply, 2000 W; bias power, 50 W; and pressure, 0.67 Pa. Thus, a gate electrode was formed.

Next, a stack of the gate insulating layers and the third oxide semiconductor layer was etched using the gate electrode as a mask. The etching was performed under the following conditions: a boron trichloride ($BCl_3=80$ sccm) atmosphere; power supply, 450 W; bias power, 100 W; and pressure, 0.1 Pa.

Next, a 20-nm-thick aluminum oxide layer was formed over the gate electrode by a sputtering method, and a 150-nm-thick silicon oxynitride layer was formed thereover by a CVD method.

Through the above steps, the transistors were formed.

Figure 22A:
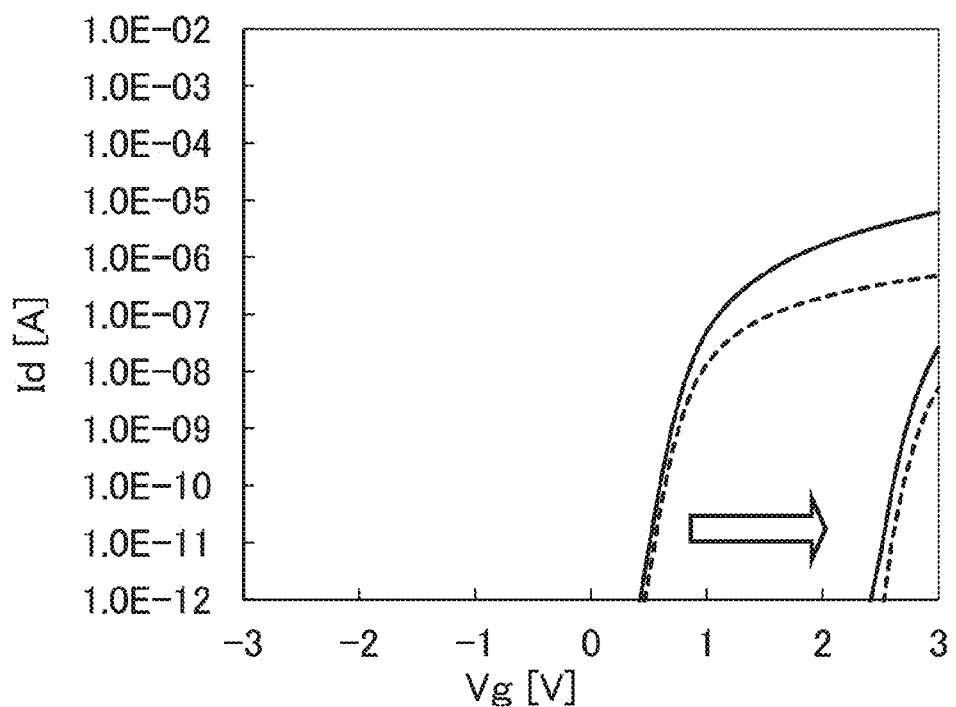
FIGS. 22A and 22B show measurement results of electrical characteristics of transistors manufactured in Example.
Figure 22B:
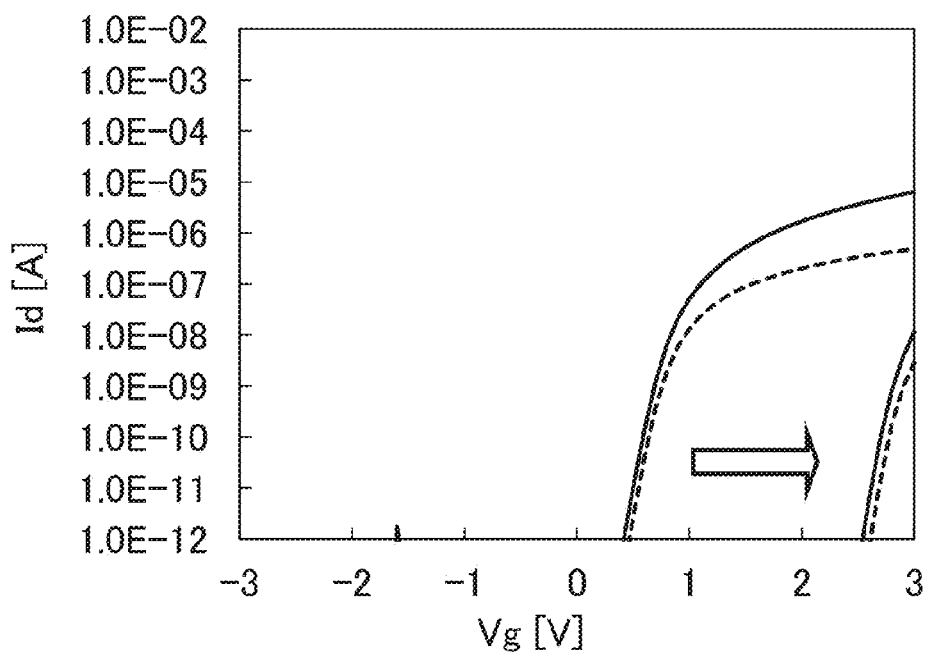

Next, the transistors were subjected to a stress test under the following stress conditions: the source voltage (Vs: [V]) and drain voltage (Vd: [V]) of 0 V, 150° C., 1 hour, and gate voltage of 3.3 V, and the drain current (Id: [A]) was measured before and after the stress test. FIGS. 22A and 22B show the measurement results of the transistors of this example. FIGS. 22A and 22B show the measurement results at drain voltages (Vd: [V]) of 0.1 V and 3.0 V, where the horizontal axis represents a gate voltage (Vg: [V]) and the vertical axis represents a drain current (Id: [A]). Note that "drain voltage (Vd: [V])" refers to a potential difference between a drain and a source when the potential of the source is used as a reference potential, and "gate voltage (Vg: [V])" refers to a potential difference between a gate and a source when the potential of the source is used as a reference potential. Note that the solid line in the graphs indicates the measurement results at a drain voltage Vd of 3.0 V, and the dotted line indicates the measurement results at a drain voltage Vd of 0.1 V. The samples of FIGS. 22A and 22B are samples subjected to the stress test and electrical characteristic measurement under the same conditions.

In the graphs, electrical characteristics before and after the stress test are shown. The electrical characteristics shown on the line segment side of the arrow represent electrical characteristics before the stress test, and the electrical characteristics shown on the triangle vertex side of the arrow represent electrical characteristics after the stress test. As shown in FIGS. 22A and 22B, a variation in threshold voltage ΔVth at a drain voltage (Vd: [V]) of 3.0 V of the transistor formed in this example is 1.76 V in FIG. 22A and 1.78 V in FIG. 22B. A variation in shift value (value of gate voltage at the time when drain current rises) Δshift is 2.01 V in FIG. 22A and 2.11 V in FIG. 22B. There results show that the threshold voltage shifts in the positive direction by the stress test.

Figure 23A:
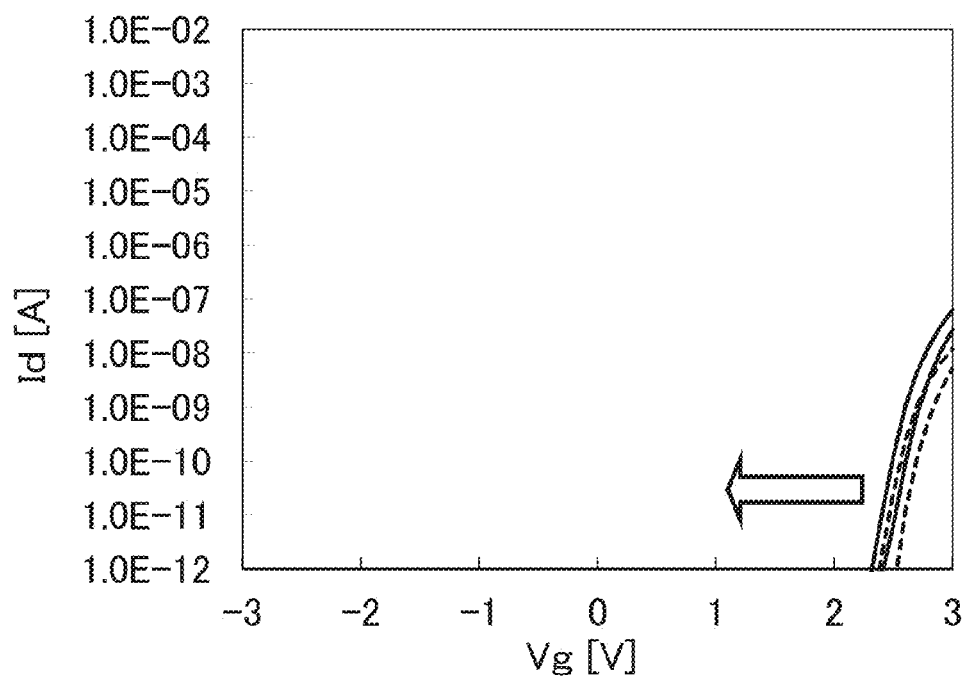
FIGS. 23A and 23B show measurement results of electrical characteristics of transistors manufactured in Example.
Figure 23B:
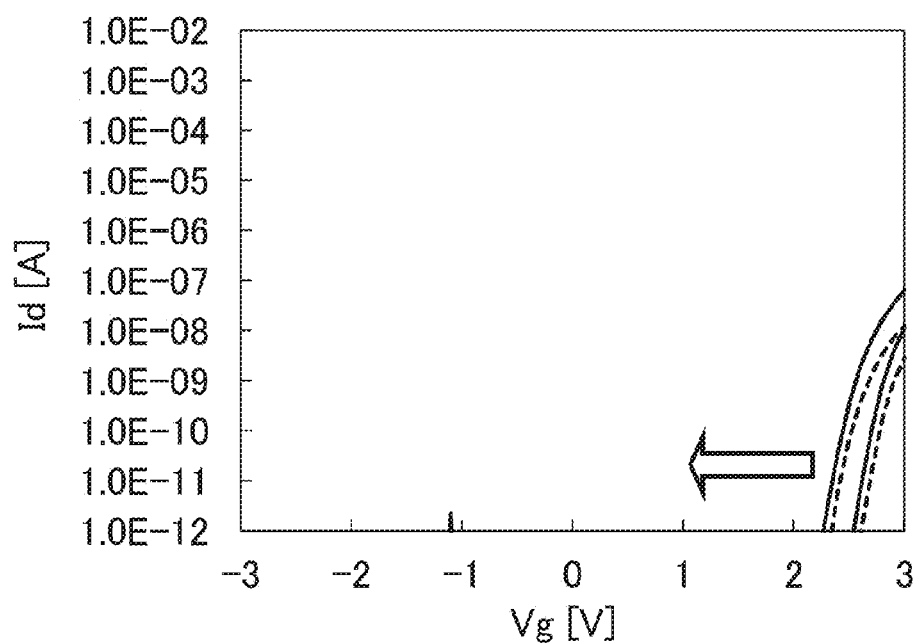

After the stress test, a hold test was performed, and drain current (Id: [A]) was measured. The conditions of the hold test for the transistor after the stress test shown in FIG. 22A were as follows: 150° C., 1 hour, and gate voltage of 0 V. The conditions of the hold test for the transistor after the stress test shown in FIG. 22B were as follows: 150° C., 1 hour, and gate voltage of −3.3 V. FIGS. 23A and 23B show the measurement results of the transistors of this example, at a gate voltage of 0 V and −3.3 V, respectively.

In the graphs, electrical characteristics before and after the hold test are shown. The electrical characteristics shown on the line segment side of the arrow represent electrical characteristics before the hold test, and the electrical characteristics shown on the triangle vertex side of the arrow represent electrical characteristics after the hold test. As shown in FIG. 23A, a variation in threshold voltage ΔVth and a variation in shift value Δshift at a drain voltage (Vd: [V]) of 3.0 V of the transistor formed in this example were 0.07 V and 0.12 V, respectively. As shown in FIG. 23B, a variation in threshold voltage ΔVth and a variation in shift value Δshift at a drain voltage (Vd: [V]) of 3.0 V of the transistor formed in this example were 0.14 V and 0.27 V, respectively. These results show that the threshold voltage and the shift value only slightly shift in the negative direction by the hold test.

Reference Example

In this reference example, a transistor was fabricated and an off-state current was measured to obtain Icut density. The Icut density of the transistor has proved low.

The structure of the transistor of the reference example is the same as the structure of the transistor used in Example except the gate insulating layer and the gate electrode. Only the formation method of the gate insulating layer and the gate electrode is described.

After formation of the third oxide semiconductor layer, a 10-nm-thick silicon oxynitride layer serving as a gate insulating layer was formed by a CVD method under the following conditions: mixed atmosphere of silane and dinitrogen monoxide ($SiH_4:N_2O$=1 sccm:800 sccm): pressure, 200 Pa, power supply, 150 kW; distance between the target and the substrate, 28 mm; and substrate temperature, 350° C.

Then, a 10-nm-thick titanium nitride layer and a 10-nm-thick tungsten layer were formed by a sputtering method. The deposition conditions of the titanium nitride layer by a sputtering method were as follows: a nitrogen (nitrogen=50 sccm) atmosphere; pressure, 0.2 Pa; power supply, 12 kW; distance between the target and the substrate, 400 mm; and substrate temperature, 25° C. The deposition conditions of the tungsten layer by a sputtering method were as follows: an argon (Ar=100 sccm) atmosphere; pressure, 2.0 Pa; power supply, 1 kW; distance between the target and the substrate, 60 mm; and substrate temperature, 230° C.

Next, the stack of the 10-nm-thick titanium nitride layer and the 10-nm-thick tungsten layer was etched by an ICP etching method. As the etching, first etching and second etching were performed. The conditions of the first etching were as follows: mixed atmosphere of chlorine, carbon tetrafluoride, and oxygen ($Cl_2:CF_4:O_2$=45 sccm:55 sccm:55 sccm); power supply, 3000 W; bias power, 110 W; and pressure, 0.67 Pa. The second etching was performed after the first etching under the following conditions: mixed atmosphere of chlorine and boron trichloride ($Cl_2:BCl_3$=50 sccm:150 sccm); power supply, 1000 W; bias power, 50 W; and pressure, 0.67 Pa. Thus, a gate electrode was formed.

Through the above steps, the transistor was formed. The channel length of the transistor was 50 nm and the channel width thereof was 40 nm.

Next, the off-state current of the formed transistor was measured. Because a current smaller than 1 fA cannot be measured directly, 250,000 transistors of reference example were connected in parallel and a substantially one transistor with a channel width of 10 mm (40 nm×250,000) was formed. The Icut density was measured.

Figure 24:
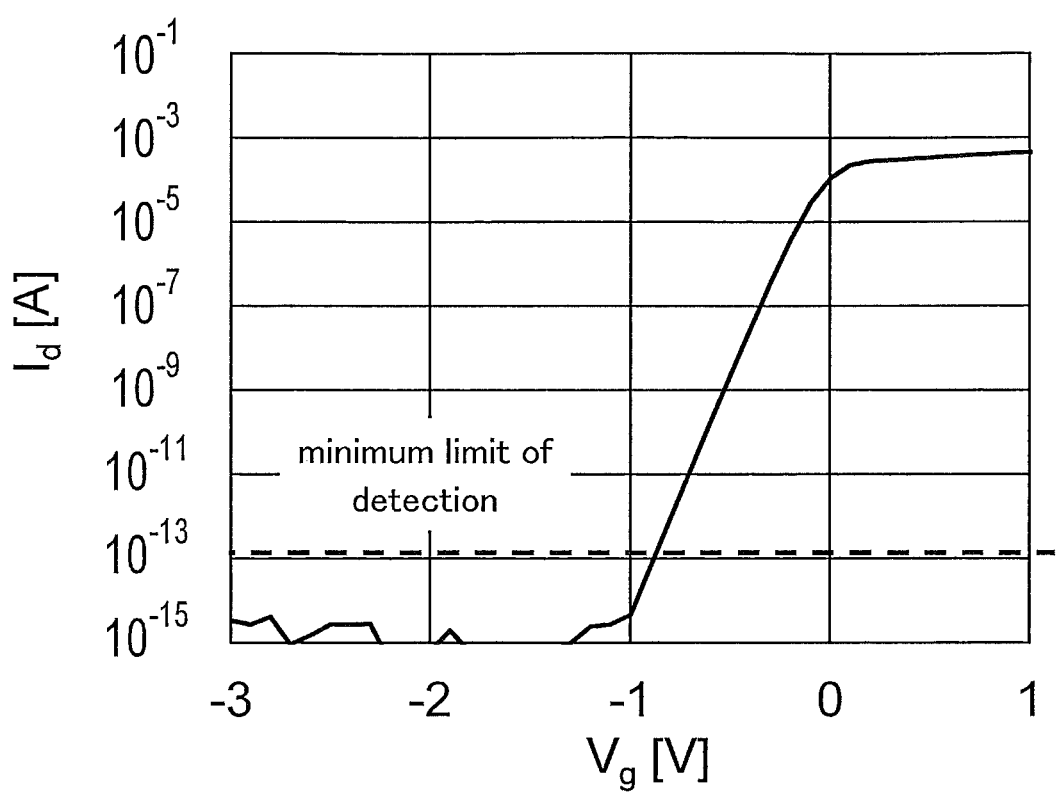
FIG. 24 shows characteristics of a transistor of Reference Example.

FIG. 24 shows Id-Vg characteristics of the transistor with the channel width of 10 mm at a drain potential of 1 V and a source potential of 0 V. The off-state current was smaller than $10^{-13}$ A (that is, the off-state current density was lower than $10^{-17}$ A/μm) as shown in FIG. 24.

This application is based on Japanese Patent Application serial no. 2013-142281 filed with Japan Patent Office on Jul. 8, 2013, Japanese Patent Application serial no. 2013-142309 filed with Japan Patent Office on Jul. 8, 2013, and Japanese Patent Application serial no. 2013-142296 filed with Japan Patent Office on Jul. 8, 2013, the entire contents of which are hereby incorporated by reference.

What is claimed is:

1. A manufacturing method of a semiconductor device comprising:
    forming a first semiconductor;
    forming a first electron trap layer over the first semiconductor;
    forming a second electron trap layer over the first electron trap layer;
    forming a gate electrode over the second electron trap layer;
    forming an electrode electrically connected to the first semiconductor; and
    keeping a potential of the gate electrode higher than a potential of the electrode for 1 second or longer at a temperature higher than or equal to 125 ° C. and lower than or equal to 450 ° C., thereby increasing a threshold voltage of the semiconductor device,
    wherein the second electron trap layer has a higher density of electron trap states than the first electron trap layer.

2. The manufacturing method of the semiconductor device according to claim 1, wherein the first electron trap layer comprises any one of hafnium oxide, aluminum oxide, and aluminum silicate.

3. The manufacturing method of the semiconductor device according to claim 1, wherein the electrode is either a source electrode or a drain electrode.

4. The manufacturing method of the semiconductor device according to claim 1,
    wherein the semiconductor device comprises a second semiconductor and a third semiconductor,
    wherein the first semiconductor is sandwiched between the second semiconductor and the third semiconductor, and
    wherein the second semiconductor is provided between the first semiconductor and the electron trap layer.

5. The manufacturing method of the semiconductor device, according to claim 4, wherein the first semiconductor, the second semiconductor, and the third semiconductor comprise oxide semiconductor.

6. The manufacturing method of the semiconductor device according to claim 1, wherein the potential applied to the gate electrode is lower than a highest potential used in the semiconductor device and higher than 1 V.

7. A manufacturing method of a semiconductor device comprising:
    forming a first semiconductor;
    forming an electron trap layer over the first semiconductor, the electron trap layer comprising a plurality of conductive minute regions;
    forming a gate electrode over the electron trap layer;
    forming an electrode electrically connected to the first semiconductor; and
    keeping a potential of the gate electrode higher than a potential of the electrode for 1 second or longer at a temperature higher than or equal to 125 ° C. and lower than or equal to 450 ° C., thereby increasing a threshold voltage of the semiconductor device,
    wherein a proportion of the plurality of conductive minute regions in the electron trap layer is smaller than a proportion of a region in the electron trap layer which does not contain the plurality of conductive minute regions.

8. The manufacturing method of the semiconductor device according to claim 7, wherein the electron trap layer comprises any one of hafnium oxide, aluminum oxide, and aluminum silicate.

9. The manufacturing method of the semiconductor device according to claim 7, wherein the electrode is either a source electrode or a drain electrode.

10. The manufacturing method of the semiconductor device according to claim 7,
wherein the semiconductor device comprises a second semiconductor and a third semiconductor,
wherein the first semiconductor is sandwiched between the second semiconductor and the third semiconductor, and
wherein the second semiconductor is provided between the first semiconductor and the electron trap layer.

11. The manufacturing method of the semiconductor device, according to claim 10, wherein the first semiconductor, the second semiconductor, and the third semiconductor comprise oxide semiconductor.

12. The manufacturing method of the semiconductor device according to claim 7, wherein the potential applied to the gate electrode is lower than a highest potential used in the semiconductor device and higher than 1 V.

13. A manufacturing method of a semiconductor device comprising:
forming a first semiconductor layer;
forming a second semiconductor layer over the first semiconductor layer;
forming a third semiconductor layer over the second semiconductor layer;
forming an electron trap layer over the third semiconductor layer;
forming a gate electrode over the electron trap layer; and
forming an electrode electrically connected to the third semiconductor layer,
wherein the electron trap layer comprises a first insulating layer and a second insulating layer that include the same constituent elements and are formed by different formation methods or under different formation conditions,
wherein the second insulating layer is provided between the first insulating layer and the gate electrode, and
wherein the second insulating layer has a higher density of electron trap states than the first insulating layer.

14. The manufacturing method of the semiconductor device according to claim 13, wherein a band gap of the first insulating layer is larger than that of the second insulating layer.

15. The manufacturing method of the semiconductor device according to claim 13,
wherein the first insulating layer is formed by a CVD method.

16. The manufacturing method of the semiconductor device according to claim 13, wherein electron trap states are contained at an interface between the first insulating layer and the second insulating layer.

17. The manufacturing method of the semiconductor device according to claim 13, wherein the electron trap layer is negatively charged.

18. The manufacturing method of the semiconductor device according to claim 13, wherein the electron trap layer comprises any one of hafnium oxide, aluminum oxide, and aluminum silicate.

19. The manufacturing method of the semiconductor device according to claim 13, wherein the electrode is either a source electrode or a drain electrode.

20. The manufacturing method of the semiconductor device according to claim 13, wherein the first semiconductor layer, the second semiconductor layer, and the third semiconductor layer comprise oxide semiconductor.

* * * * *